(12) United States Patent
Parce et al.

(10) Patent No.: US 7,892,610 B2
(45) Date of Patent: Feb. 22, 2011

(54) METHOD AND SYSTEM FOR PRINTING ALIGNED NANOWIRES AND OTHER ELECTRICAL DEVICES

(75) Inventors: J. Wallace Parce, Palo Alto, CA (US); James M. Hamilton, Sunnyvale, CA (US); Samuel Martin, Cupertino, CA (US); Erik Freer, Camptell, CA (US)

(73) Assignee: Nanosys, Inc., Palo Alto, CA (US)

( * ) Notice: Subject to any disclaimer, the term of this patent is extended or adjusted under 35 U.S.C. 154(b) by 361 days.

(21) Appl. No.: 12/114,446

(22) Filed: May 2, 2008

(65) Prior Publication Data

US 2008/0280069 A1 Nov. 13, 2008

Related U.S. Application Data

(60) Provisional application No. 60/916,337, filed on May 7, 2007.

(51) Int. Cl.
*B05D 1/04* (2006.01)
(52) U.S. Cl. .................. 427/475; 427/458; 427/466
(58) Field of Classification Search ................ 427/458, 427/466, 475
See application file for complete search history.

(56) References Cited

U.S. PATENT DOCUMENTS

| 5,505,928 A | 4/1996 | Alivisatos et al. |
| 5,690,807 A | 11/1997 | Clark, Jr. et al. |
| 5,751,018 A | 5/1998 | Alivisatos et al. |
| 5,897,945 A | 4/1999 | Lieber et al. |
| 5,990,479 A | 11/1999 | Weiss et al. |
| 5,997,832 A | 12/1999 | Lieber et al. |
| 6,036,774 A | 3/2000 | Lieber et al. |
| 6,048,616 A | 4/2000 | Gallagher et al. |
| 6,136,156 A | 10/2000 | El-Shall et al. |

(Continued)

FOREIGN PATENT DOCUMENTS

WO WO01/03208 A1 1/2001

(Continued)

OTHER PUBLICATIONS

Diehl, M. R., et al., "Self-Assembled, Deterministic Carbon Nanotube Wiring Networks", Angewanted Cheme International Edition, (Jan. 18, 2002), pp. 353-356.

(Continued)

*Primary Examiner*—Frederick J Parker
(74) *Attorney, Agent, or Firm*—Fiala & Weaver P.L.L.C.

(57) ABSTRACT

Methods and systems for applying nanowires and electrical devices to surfaces are described. In a first aspect, at least one nanowire is provided proximate to an electrode pair. An electric field is generated by electrodes of the electrode pair to associate the at least one nanowire with the electrodes. The electrode pair is aligned with a region of the destination surface. The at least one nanowire is deposited from the electrode pair to the region. In another aspect, a plurality of electrical devices is provided proximate to an electrode pair. An electric field is generated by electrodes of the electrode pair to associate an electrical device of the plurality of electrical devices with the electrodes. The electrode pair is aligned with a region of the destination surface. The electrical device is deposited from the electrode pair to the region.

29 Claims, 37 Drawing Sheets

U.S. PATENT DOCUMENTS

| | | | |
|---|---|---|---|
| 6,225,198 | B1 | 5/2001 | Alivisatos et al. |
| 6,306,736 | B1 | 10/2001 | Alivisatos et al. |
| 6,413,489 | B1 | 7/2002 | Ying et al. |
| 6,613,601 | B1 | 9/2003 | Krauss et al. |
| 6,781,166 | B2 | 8/2004 | Lieber et al. |
| 6,846,084 | B2 | 1/2005 | Grier et al. |
| 6,872,645 | B2 | 3/2005 | Duan et al. |
| 6,897,950 | B2 | 5/2005 | Li et al. |
| 6,941,033 | B2 | 9/2005 | Taylor et al. |
| 6,962,823 | B2 | 11/2005 | Empedocles et al. |
| 7,082,683 | B2 | 8/2006 | Han et al. |
| 7,091,120 | B2 | 8/2006 | Buretea et al. |
| 7,105,428 | B2 | 9/2006 | Pan et al. |
| 7,129,554 | B2 * | 10/2006 | Lieber et al. ............... 257/414 |
| 7,455,757 | B2 * | 11/2008 | Oh et al. ...................... 204/490 |
| 7,776,384 | B2 * | 8/2010 | Larouche et al. ............... 427/8 |
| 2002/0130311 | A1 | 9/2002 | Lieber et al. |
| 2004/0026684 | A1 | 2/2004 | Empedocles |
| 2006/0008942 | A1 | 1/2006 | Romano et al. |
| 2006/0110544 | A1 * | 5/2006 | Kim et al. .................... 427/458 |
| 2006/0223225 | A1 | 10/2006 | Arneson et al. |
| 2007/0032052 | A1 | 2/2007 | Lieber et al. |
| 2007/0065822 | A1 | 3/2007 | Hastwell et al. |
| 2008/0224123 | A1 | 9/2008 | Martin et al. |

FOREIGN PATENT DOCUMENTS

| | | |
|---|---|---|
| WO | WO02/17362 A2 | 2/2002 |
| WO | WO02/48701 A2 | 6/2002 |
| WO | WO2009/023305 A2 | 2/2009 |

OTHER PUBLICATIONS

Smith, P. A., et al., "Electric-Field Assisted Assembly and Alignment of Metallic Nanowires", Applied Physics letters, vol. 77, No. 9, (Aug. 28, 2000), pp. 1399-1401.

Jin, S. et al., "Scalable Interconnection and Integration of Nanowire Devices Without Registration", Nano Letters, vol. 4, No. 5, (May 31, 2004), pp. 915-919.

Duan, X. et al., "Indium Phosphide Nanowires as Builiding Blocks for Nanoscale Electronic and Optoelectronic Devices", Nature, vol. 409, (Jan. 4, 2001), pp. 915-916.

Whang, D. et al., "Large-Scale Hierarchical Organization of Nanowire Arrays for Integrated Nanosystems", Nano Letters, vol. 3, No. 9, (Jul. 11, 2003), pp. 1255-1259.

Bjork, et al., "One-dimensional Steeplechase for Electrons Realized", Nano Letters, vol. 2, No. 2, (Jan. 19, 2002), pp. 87-89.

Cao, et al., "Growth and Properties of Semiconductor Core/Shell Nanocrystals with InAs Cores", J. Am. Chem. Soc., vol. 122, No. 40, (Sep. 21, 2000), pp. 9692-9702.

Cui, et al., "Doping and Electrical Transport in Silicon Nanowires", The Journal of Physical Chemistry, vol. 104, No. 22, (Jun. 8, 2000), 4 pages.

Cui, et al., "Diameter-controlled synthesis of single-crystal silicon nanowires", Applied Physics Letters, vol. 78, No. 15, (Apr. 9, 2001), 3 pages.

Dabbousi, et al., "(CdSe)ZnS Core-Shell Quantum Dots: Synthesis and Characterization of a Size Series of Highly Luminescent Nanocrystallites", J. Phys. Chem. B, vol. 101, No. 46, (1997), pp. 9463-9475.

Duan, et al., "General Synthesis of Compound Semiconductor Nanowires", Advanced Materials, vol. 12, No. 4, (2000), pp. 298-302.

Gudiksen, et al., "Diameter-Selective Synthesis of Semiconductor Nanowires", J. Am. Chem. Soc., vol. 122, No. 36, (Aug. 22, 2000), pp. 8801-8802.

Gudiksen, et al., "Synthetic Control of the Diameter and Length of Single Crystal Semiconductor Nanowires", J. Phys. Chem. B, vol. 105, No. 19, (Apr. 18, 2001), pp. 4062-4064.

Gudiksen, et al., "Growth of nanowire superlattice structures for nanoscale photonics and electronics", Nature, vol. 415, (Feb. 7, 2002), pp. 817-820.

Jun, et al., "Controlled Synthesis of Multi-armed CdS Nanorod Architectures Using Monosurfactant System", J. Am Chem. Soc., vol. 123, No. 21, (May 8, 2001), pp. 5150-5151.

Liu, et al., "Sol-Gel Synthesis of Free-Standing Ferroelectric Lead Zirconate Titanate Nanoparticles", J. Am. Chem. Soc., vol. 123, No. 18, (Apr. 17, 2001), pp. 4344-4345.

Manna, et al., "Synthesis of Soluble and Processable Rod-, Arrow-, Teardrop-, and Tetrapod-Shaped CdSe Nanocrystals", J. Am. Chem. Soc., vol. 122, No. 51, (Dec. 1, 2000), pp. 12700-12706.

Manna, et al., "Epitaxial Growth and Photochemical Annealing of Graded CdS/ZnS Shells on Colloidal CdSe Nanorods", J. Am. Chem. Soc., vol. 124, No. 24, (May 24, 2002), pp. 7136-7145.

Morales, et al., "A Laser Ablation Method for the Synthesis of Crystalline Semiconductor Nanowires", Science, vol. 279, (Jan. 9, 1998), pp. 208-211.

Peng, et al., "Epitaxial Growth of Highly Luminescent CdSe/CdS Core/Shell Nanocrystals with Photostability and Electronic Accessibility", J. Am. Chem. Soc., vol. 119, No. 30, (1997), pp. 7019-7029.

Peng, et al., "Shape control of CdSe nanociystals", Nature, vol. 404, (Mar. 2, 2000), pp. 59-61.

Puntes, et al., "Colloidal Nanocrystal Shape and Size Control: The Case of Cobalt", Science, vol. 291, (Mar. 16, 2001), pp. 2115-2117.

Urban, et al., "Synthesis of Single-Crystalline Perovskite Nanorods Composed of Barium Titanate and Strontium Titanate", J. Am. Chem. Soc., vol. 124, No. 7, (Jan. 29, 2002), pp. 1186-1187.

Wu, et al., "Block-by-Block Growth of Single-Crystalline Si/SiGe Superlattice Nanowires", Nano Letters, vol. 2, No. 2, (Jan. 19, 2002), pp. 83-86.

Yun, et al., "Ferroelectric Properties of Individual Barium Titanate Nanowires Investigated by Scanned Probe Microscopy", Nano Letters, vol. 2, No. 5, (Feb. 5, 2002), pp. 447-450.

* cited by examiner

METHOD AND SYSTEM FOR PRINTING ALIGNED NANOWIRES AND OTHER ELECTRICAL DEVICES

This application claims the benefit of U.S. Provisional Application No. 60/916,337, filed on May 7, 2007, which is incorporated by reference herein in its entirety.

BACKGROUND OF THE INVENTION

1. Field of the Invention

The present invention relates to nanostructures, and more particularly, to the deposition of aligned nanostructures and electrical devices.

2. Background of the Invention

Nanostructures, such as nanowires, have the potential to facilitate a whole new generation of electronic devices. A major impediment to the emergence of this new generation of electronic devices based on nanostructures is the ability to effectively align and deposit the nanostructures on various surfaces, such as substrates. Electric fields enable the alignment of nanowires suspended in suspension, but current techniques pose stringent constraints on the scalability to large area substrates. Likewise, current techniques for depositing electrical devices, such as integrated circuits, dies, optical components, etc., do not scale well to large area substrates.

What are needed are systems and methods for achieving a high quality deposition of nanostructures and other electrical devices that are suitable for manufacturing large arrays of nanostructure-enabled electronic devices.

SUMMARY OF THE INVENTION

Methods and systems for applying nanowires to surfaces are described. In an example aspect, nanowires are provided proximate to an electrode pair. An electric field is generated by electrodes of the electrode pair to associate the nanowires with the electrodes. The electrode pair is aligned with a region of the destination surface. The nanowires are deposited from the electrode pair to the region.

The nanowires may be deposited to the region in a variety of ways. For example, a passive or active force, or combination of such forces, may be used to move the nanowires from the electrodes to the destination surface. Example forces include an electric field (AC and/or DC), a vacuum force, an electrostatic force, gravity, and/or other forces.

In a first example, the electrode pair may be formed on a transfer surface. The transfer surface is configured to have a first electric charge. The first electric charge applies a repulsive electrostatic force to the nanowires (e.g., the nanowires may have the same charge as the first electric charge). The electric field generated by the electrodes attracts the nanowires to the transfer surface against the repulsive electrostatic force. In one instance, the electric field may be biased with an alternating current (AC) field to attract the nanowires to the transfer surface. The electric field may be reduced (including entirely removed) to enable the nanowires to be moved toward the destination surface by the repulsive electrostatic force of the first electric charge.

In another example, the destination surface has a second electric charge that is opposite the first electric charge. An attractive electrostatic force of the second electric charge attracts the nanowires to the destination surface. A distance between the nanowires and the destination surface may be reduced to increase this attraction.

In another example, the transfer surface is vibrated (e.g., ultrasonically) to enable the attractive electrostatic force of the second electric charge to attract the nanowires toward the destination surface.

In another example, a vacuum is applied from the destination surface to the transfer surface to move the nanowires toward the destination surface. For example, the vacuum may draw a solution in which the nanowires reside towards the destination surface. The solution flow draws the nanowires toward the destination surface.

In another example, a second electric field associated with the destination surface is generated to attract the nanowires toward the destination surface.

In another aspect of the present invention, a system for applying nanowires to a destination surface is described. The system includes a body having a transfer surface, an electrode pair formed on the transfer surface, a suspension that includes a plurality of nanowires provided proximate to the electrode pair, a signal generator, and an alignment mechanism. The signal generator is coupled to the electrode pair. The signal generator is configured to supply an electric signal to enable electrodes of the electrode pair to generate an electric field to associate nanowires of the plurality of nanowires with the electrodes. The alignment mechanism is configured to align the electrode pair with a region of the destination surface to enable the nanowires to be deposited from the electrode pair to the region.

In another aspect of the present invention, electrical devices are transferred to surfaces in a similar manner as described elsewhere herein for nanowires. In aspects, one or more electrical devices are provided proximate to an electrode pair on a transfer surface. The electrode pair is energized, whereby an electrical device becomes associated with the electrode pair. Subsequently, the electrical device is deposited from the electrode pair to a destination surface.

In another aspect of the present invention, nanostructures, such as nanowires, are transferred to a destination surface. A transfer surface of a print head is positioned adjacent to a destination surface. A nanowire is associated with the transfer surface. A distance between the transfer surface and the destination surface is reduced. A fluid is received in one or more openings in the transfer surface from between the transfer surface and the destination surface during the reducing of the distance between the transfer and destination surfaces. Receiving the fluid in the opening(s) reduces a shear force on the nanowire. The nanowire is deposited from the transfer surface to the destination surface.

In still another aspect of the present invention, nanostructures, such as nanowires, are transferred to a destination substrate. A nanowire transfer system includes an association station, a printing station, and a cleaning station. The association station is configured to receive a plurality of print heads, and to associate nanostructures with a transfer surface of each of the received plurality of print heads. The printing station is configured to receive a destination substrate and at least one of the print heads, and to transfer the nanostructures from the received print head(s) to a plurality of regions of a surface of the destination substrate. The cleaning station is configured to receive the plurality of print heads from the printing station, and to clean the received plurality of print heads.

In aspects, the printing station may be configured to perform the transfer of the nanostructures as a "wet" transfer or a "dry" transfer.

In a further aspect, the nanowire transfer system may include an inspection station. The inspection station is configured to perform an inspection of the transfer surfaces of the plurality of print heads, and to select at least one print head of the plurality of print heads based on the inspection. The printing station may be configured to transfer the nanostructures from the selected at least one print head.

In a still further aspect, the nanowire transfer system may include a repair station. The repair station is configured to perform an inspection of the nanostructures transferred to the plurality of regions of the surface of the destination substrate. If the repair station determines an arrangement of nanostructures in need of repair, the repair station is configured to repair the arrangement of nanostructures.

In a still further aspect, the nanowire transfer system may include a print head drying station and a repair station. The print head drying station is configured to dry the nanostructures associated with the transfer surfaces of the plurality of print heads. The repair station is configured to perform an inspection of the dried transfer surfaces. If the repair station determines an arrangement of nanostructures associated with a transfer surface in need of repair, the repair station is configured to repair the determined arrangement of nanostructures. The print head drying station enables a dry transfer of the nanowires to be performed at the printing station.

In a still further aspect, the nanowire transfer system may include a panel drying station. The panel drying station is configured to dry the nanostructures transferred to the plurality of regions of the surface of the destination substrate (e.g., if a wet transfer of the nanowires is performed by the printing station)

Further embodiments, features, and advantages of the invention, as well as the structure and operation of the various embodiments of the invention are described in detail below with reference to accompanying drawings.

BRIEF DESCRIPTION OF THE FIGURES

The invention is described with reference to the accompanying drawings. In the drawings, like reference numbers indicate identical or functionally similar elements. The drawing in which an element first appears is indicated by the left-most digit in the corresponding reference number.

Figure 1A:
FIG. 1A is a diagram of a single crystal semiconductor nanowire.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

It should be appreciated that the particular implementations shown and described herein are examples of the invention and are not intended to otherwise limit the scope of the present invention in any way. Indeed, for the sake of brevity, conventional electronics, manufacturing, semiconductor devices, and nanowire (NW), nanorod, nanotube, and nanoribbon technologies and other functional aspects of the systems (and components of the individual operating components of the systems) may not be described in detail herein. Furthermore, for purposes of brevity, the invention is frequently described herein as pertaining to nanowires.

It should be appreciated that although nanowires are frequently referred to, the techniques described herein are also applicable to other nanostructures, such as nanorods, nanotubes, nanotetrapods, nanoribbons and/or combinations thereof. It should further be appreciated that the manufacturing techniques described herein could be used to create any semiconductor device type, and other electronic component types. Further, the techniques would be suitable for application in electrical systems, optical systems, consumer electronics, industrial electronics, wireless systems, space applications, or any other application.

As used herein, an "aspect ratio" is the length of a first axis of a nanostructure divided by the average of the lengths of the second and third axes of the nanostructure, where the second and third axes are the two axes whose lengths are most nearly equal to each other. For example, the aspect ratio for a perfect rod would be the length of its long axis divided by the diameter of a cross-section perpendicular to (normal to) the long axis.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanocrystal, or the center of a nanocrystal, for example. A shell need not completely cover the adjacent materials to be considered a shell or for the nanostructure to be considered a heterostructure. For example, a nanocrystal characterized by a core of one material covered with small islands of a second material is a heterostructure. In other embodiments, the different material types are distributed at different locations within the nanostructure. For example, material types can be distributed along the major (long) axis of a nanowire or along a long axis of arm of a branched nanocrystal. Different regions within a heterostructure can comprise entirely different materials, or the different regions can comprise a base material.

As used herein, a "nanostructure" is a structure having at least one region or characteristic dimension with a dimension of less than about 500 nm, e.g., less than about 200 nm, less than about 100 nm, less than about 50 nm, or even less than about 20 nm. Typically, the region or characteristic dimension will be along the smallest axis of the structure. Examples of such structures include nanowires, nanorods, nanotubes, branched nanocrystals, nanotetrapods, tripods, bipods, nanocrystals, nanodots, quantum dots, nanoparticles, branched tetrapods (e.g., inorganic dendrimers), and the like. Nanostructures can be substantially homogeneous in material properties, or in certain embodiments can be heterogeneous (e.g., heterostructures). Nanostructures can be, for example, substantially crystalline, substantially monocrystalline, polycrystalline, amorphous, or a combination thereof. In one aspect, each of the three dimensions of the nanostructure has a dimension of less than about 500 nm, for example, less than about 200 nm, less than about 100 nm, less than about 50 nm, or even less than about 20 nm.

As used herein, the term "nanowire" generally refers to any elongated conductive or semiconductive material (or other material described herein) that includes at least one cross-sectional dimension that is less than 500 nm, and preferably, equal to or less than less than about 100 nm, and has an aspect ratio (length:width) of greater than 10, preferably greater than 50, and more preferably, greater than 100. Exemplary nanowires for use in the practice of the methods and systems of the present invention are on the order of 10's of microns long (e.g., about 10, 20, 30, 40, 50 microns, etc.) and about 100 nm in diameter.

The nanowires of this invention can be substantially homogeneous in material properties, or in certain embodiments can be heterogeneous (e.g., nanowire heterostructures). The nanowires can be fabricated from essentially any convenient material or materials, and can be, e.g., substantially crystalline, substantially monocrystalline, polycrystalline, or amorphous. Nanowires can have a variable diameter or can have a substantially uniform diameter, that is, a diameter that shows a variance less than about 20% (e.g., less than about 10%, less than about 5%, or less than about 1%) over the region of greatest variability and over a linear dimension of at least 5 nm (e.g., at least 10 nm, at least 20 nm, or at least 50 nm). Typically the diameter is evaluated away from the ends of the nanowire (e.g., over the central 20%, 40%, 50%, or 80% of the nanowire). A nanowire can be straight or can be e.g., curved or bent, over the entire length of its long axis or a portion thereof. In certain embodiments, a nanowire or a portion thereof can exhibit two- or three-dimensional quantum confinement. Nanowires according to this invention can expressly exclude carbon nanotubes, and, in certain embodiments, exclude "whiskers" or "nanowhiskers", particularly whiskers having a diameter greater than 100 nm, or greater than about 200 nm.

Examples of such nanowires include semiconductor nanowires as described in Published International Patent Application Nos. WO 02/17362, WO 02/48701, and WO 01/03208, carbon nanotubes, and other elongated conductive or semiconductive structures of like dimensions, which are incorporated herein by reference.

As used herein, the term "nanorod" generally refers to any elongated conductive or semiconductive material (or other material described herein) similar to a nanowire, but having an aspect ratio (length:width) less than that of a nanowire. Note that two or more nanorods can be coupled together along their longitudinal axis so that the coupled nanorods span all the way between electrodes. Alternatively, two or more nanorods can be substantially aligned along their longitudinal axis, but not coupled together, such that a small gap exists between the ends of the two or more nanorods. In this case, electrons can flow from one nanorod to another by hopping from one nanorod to another to traverse the small gap. The two or more nanorods can be substantially aligned, such that they form a path by which electrons can travel between electrodes.

A wide range of types of materials for nanowires, nanorods, nanotubes and nanoribbons can be used, including semiconductor material selected from, e.g., Si, Ge, Sn, Se, Te, B, C (including diamond), P, B—C, B—P($BP_6$), B—Si, Si—C, Si—Ge, Si—Sn and Ge—Sn, SiC, BN, BP, BAs, AlN, AlP, AlAs, AlSb, GaN, GaP, GaAs, GaSb, InN, InP, InAs, InSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, AgF, AgCl, AgBr, AgI, $BeSiN_2$, $CaCN_2$, $ZnGeP_2$, $CdSnAs_2$, $ZnSnSb_2$, $CuGeP_3$, $CuSi_2P_3$, $(Cu,Ag)(Al,Ga,In,Ti,Fe)(S,Se,Te)_2$, $Si_3N_4$, $Ge_3N_4$, $Al_2O_3$, $(Al,Ga, In)_2(S,Se,Te)_3$, $Al_2CO$, and an appropriate combination of two or more such semiconductors.

The nanowires can also be formed from other materials such as metals such as gold, nickel, palladium, iridium, cobalt, chromium, aluminum, titanium, tin and the like, metal alloys, polymers, conductive polymers, ceramics, and/or combinations thereof. Other now known or later developed conducting or semiconductor materials can be employed.

In certain aspects, the semiconductor may comprise a dopant from a group consisting of: a p-type dopant from Group III of the periodic table; an n-type dopant from Group V of the periodic table; a p-type dopant selected from a group consisting of: B, Al and In; an n-type dopant selected from a group consisting of: P, As and Sb; a p-type dopant from Group II of the periodic table; a p-type dopant selected from a group consisting of: Mg, Zn, Cd and Hg; a p-type dopant from Group IV of the periodic table; a p-type dopant selected from a group consisting of: C and Si; or an n-type dopant selected from a group consisting of: Si, Ge, Sn, S, Se and Te. Other now known or later developed dopant materials can be employed.

Additionally, the nanowires or nanoribbons can include carbon nanotubes, or nanotubes formed of conductive or semiconductive organic polymer materials, (e.g., pentacene, and transition metal oxides).

Hence, although the term "nanowire" is referred to throughout the description herein for illustrative purposes, it is intended that the description herein also encompass the use of nanotubes (e.g., nanowire-like structures having a hollow tube formed axially therethrough). Nanotubes can be formed in combinations/thin films of nanotubes as is described herein for nanowires, alone or in combination with nanowires, to provide the properties and advantages described herein.

It should be understood that the spatial descriptions (e.g., "above", "below", "up", "down", "top", "bottom," "vertical," "horizontal," etc.) made herein are for purposes of illustration only, and that devices of the present invention can be spatially arranged in any orientation or manner.

FIG. 1A illustrates a single crystal semiconductor nanowire core (hereafter "nanowire") 100. FIG. 1A shows a nanowire 100 that is a uniformly doped single crystal nanowire. Such single crystal nanowires can be doped into either p- or n-type semiconductors in a fairly controlled way. Doped nanowires such as nanowire 100 exhibit improved electronic properties. For instance, such nanowires can be doped to have carrier mobility levels comparable to bulk single crystal materials.

Figure 1B:
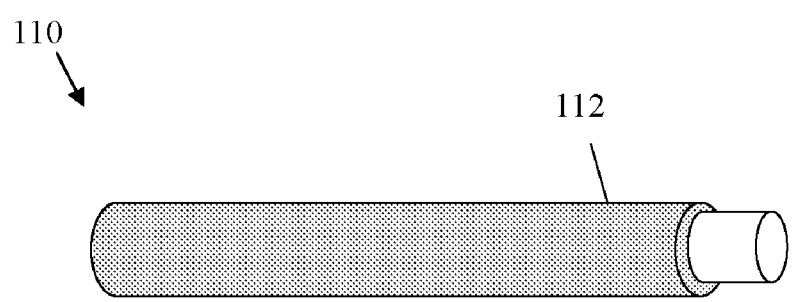
FIG. 1B is a diagram of a nanowire doped according to a core-shell (CS) structure.
Figure 1C:
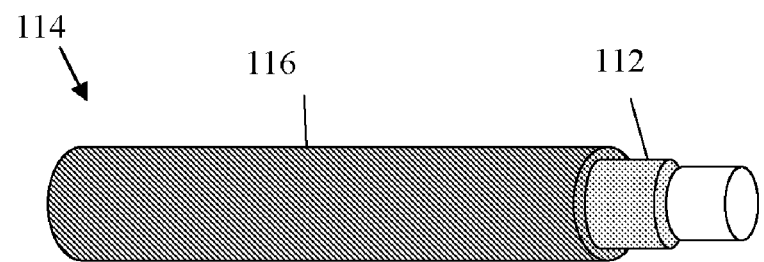
FIG. 1C is a diagram of a nanowire doped according to a core-shell-shell (CSS) structure.

FIG. 1B shows a nanowire 110 having a core-shell structure, with a shell 112 around the nanowire core. Surface scattering can be reduced by forming an outer layer of the nanowire, such as by the passivation annealing of nanowires, and/or the use of core-shell structures with nanowires. An insulating layer, such as an oxide coating, can be formed on a nanowire as the shell layer. Furthermore, for example, for silicon nanowires having an oxide coating, the annealing of the nanowires in hydrogen ($H_2$) can greatly reduce surface states. In embodiments, the core-shell combination is configured to satisfy the following constraints: (1) the shell energy level should be higher than the core energy level, so that the conducting carriers are confined in the core; and (2) the core and shell materials should have good lattice match, with few surface states and surface charges. Other more complex NW core-shell structures may also be used to include a core of single crystal semiconductor, an inner-shell of gate dielectric, and an outer-shell of conformal gate, such as shown in FIG. 1C. FIG. 1C shows a nanowire 114 having a core-shell-shell structure, with an inner shell 112 and outer shell 116 around the nanowire core. This can be realized by depositing a layer of TaAlN, WN, or highly-doped amorphous silicon around the $Si/SiO_x$ core-shell structure (described above) as the outer-gate shell, for example.

The valence band of the insulating shell can be lower than the valence band of the core for p-type doped wires, or the conduction band of the shell can be higher than the core for n-type doped wires. Generally, the core nanostructure can be made from any metallic or semiconductor material, and the one or more shell layers deposited on the core can be made from the same or a different material. For example, the first core material can comprise a first semiconductor selected from the group consisting of: a Group II-VI semiconductor, a Group III-V semiconductor, a Group IV semiconductor, and an alloy thereof. Similarly, the second material of the one or more shell layers can comprise an oxide layer, a second semiconductor, the same as or different from the first semiconductor, e.g., selected from the group consisting of: a Group II-VI semiconductor, a Group III-V semiconductor, a Group IV semiconductor, and an alloy thereof. Example semiconductors include, but are not limited to, CdSe, CdTe, InP, InAs, CdS, ZnS, ZnSe, ZnTe, HgTe, GaN, GaP, GaAs, GaSb, InSb, Si, Ge, AlAs, AlSb, PbSe, PbS, and PbTe. As noted above, metallic materials such as gold, chromium, tin, nickel, aluminum etc. and alloys thereof can be used as the core material, and the metallic core can be overcoated with an appropriate shell material such as silicon dioxide or other insulating materials, which may in turn may be coated with one or more additional shell layers of the materials described above to form more complex core-shell-shell nanowire structures.

Nanostructures can be fabricated and their size can be controlled by any of a number of convenient methods that can be adapted to different materials. For example, synthesis of nanocrystals of various composition is described in, e.g., Peng et al. (2000) "Shape Control of CdSe Nanocrystals" *Nature* 404, 59-61; Puntes et al. (2001) "Colloidal nanocrystal shape and size control: The case of cobalt" *Science* 291, 2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 5,505,928 to Alivisatos et al. (Apr. 9, 1996) entitled "Preparation of III-V semiconductor nanocrystals"; U.S. Pat. No. 5,751,018 to Alivisatos et al. (May 12, 1998) entitled "Semiconductor nanocrystals covalently bound to solid inorganic surfaces using self-assembled monolayers"; U.S. Pat. No. 6,048,616 to Gallagher et al. (Apr. 11, 2000) entitled "Encapsulated quantum sized doped semiconductor particles and method of manufacturing same"; and U.S. Pat. No. 5,990,479 to Weiss et al. (Nov. 23, 1999) entitled "Organo luminescent semiconductor nanocrystal probes for biological applications and process for making and using such probes."

Growth of nanowires having various aspect ratios, including nanowires with controlled diameters, is described in, e.g., Gudiksen et al (2000) "Diameter-selective synthesis of semiconductor nanowires" *J. Am. Chem. Soc.* 122, 8801-8802; Cui et al. (2001) "Diameter-controlled synthesis of single-crystal silicon nanowires" *Appl. Phys. Lett.* 78, 2214-2216; Gudiksen et al. (2001) "Synthetic control of the diameter and length of single crystal semiconductor nanowires" *J. Phys. Chem. B* 105, 4062-4064; Morales et al. (1998) "A laser ablation method for the synthesis of crystalline semiconductor nanowires" *Science* 279, 208-211; Duan et al. (2000) "General synthesis of compound semiconductor nanowires" *Adv. Mater.* 12, 298-302; Cui et al. (2000) "Doping and electrical transport in silicon nanowires" *J. Phys. Chem. B* 104, 5213-5216; Peng et al. (2000) "Shape control of CdSe nanocrystals" *Nature* 404, 59-61; Puntes et al. (2001) "Colloidal nanocrystal shape and size control: The case of cobalt" *Science* 291, 2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 6,036,774 to Lieber et al. (Mar. 14, 2000) entitled "Method of producing metal oxide nanorods"; U.S. Pat. No. 5,897,945 to Lieber et al. (Apr. 27, 1999) entitled "Metal oxide nanorods"; U.S. Pat. No. 5,997,832 to Lieber et al. (Dec. 7, 1999) "Preparation of carbide nanorods"; Urbau et al. (2002) "Synthesis of single-crystalline perovskite nanowires composed of barium titanate and strontium titanate" *J. Am. Chem. Soc.*, 124, 1186; and Yun et al. (2002) "Ferroelectric Properties of Individual Barium Titanate Nanowires Investigated by Scanned Probe Microscopy" *Nanoletters* 2, 447.

Growth of branched nanowires (e.g., nanotetrapods, tripods, bipods, and branched tetrapods) is described in, e.g., Jun et al. (2001) "Controlled synthesis of multi-armed CdS nanorod architectures using monosurfactant system" *J. Am. Chem. Soc.* 123, 5150-5151; and Manna et al. (2000) "*Synthesis of Soluble and Processable Rod-, Arrow-Teardrop-and Tetrapod-Shaped CdSe Nanocrystals*" *J. Am. Chem. Soc.* 122, 12700-12706.

Synthesis of nanoparticles is described in, e.g., U.S. Pat. No. 5,690,807 to Clark Jr. et al. (Nov. 25, 1997) entitled "Method for producing semiconductor particles"; U.S. Pat. No. 6,136,156 to El-Shall, et al. (Oct. 24, 2000) entitled "Nanoparticles of silicon oxide alloys"; U.S. Pat. No. 6,413,489 to Ying et al. (Jul. 2, 2002) entitled "Synthesis of nanometer-sized particles by reverse micelle mediated techniques"; and Liu et al. (2001) "Sol-Gel Synthesis of Free-Standing Ferroelectric Lead Zirconate Titanate Nanoparticles" *J. Am. Chem. Soc.* 123, 4344. Synthesis of nanoparticles is also described in the above citations for growth of nanocrystals, nanowires, and branched nanowires, where the resulting nanostructures have an aspect ratio less than about 1.5.

Synthesis of core-shell nanostructure heterostructures, namely nanocrystal and nanowire (e.g., nanorod) core-shell heterostructures, are described in, e.g., Peng et al. (1997) "Epitaxial growth of highly luminescent CdSe/CdS core/shell nanocrystals with photostability and electronic accessibility" *J. Am. Chem. Soc.* 119, 7019-7029; Dabbousi et al. (1997) "(CdSe)ZnS core-shell quantum dots: Synthesis and characterization of a size series of highly luminescent nanocrysallites" *J. Phys. Chem. B* 101, 9463-9475; Manna et al. (2002) "Epitaxial growth and photochemical annealing of graded CdS/ZnS shells on colloidal CdSe nanorods" *J. Am. Chem. Soc.* 124, 7136-7145; and Cao et al. (2000) "Growth and properties of semiconductor core/shell nanocrystals with InAs cores" *J. Am. Chem. Soc.* 122, 9692-9702. Similar approaches can be applied to growth of other core-shell nanostructures.

Growth of nanowire heterostructures in which the different materials are distributed at different locations along the long axis of the nanowire is described in, e.g., Gudiksen et al. (2002) "Growth of nanowire superlattice structures for nanoscale photonics and electronics" *Nature* 415, 617-620; Bjork et al. (2002) "One-dimensional steeplechase for electrons realized" *Nano Letters* 2, 86-90; Wu et al. (2002) "Block-by-block growth of single-crystalline Si/SiGe superlattice nanowires" *Nano Letters* 2, 83-86; and U.S. patent application 60/370,095 (Apr. 2, 2002) to Empedocles entitled "Nanowire heterostructures for encoding information." Similar approaches can be applied to growth of other heterostructures.

Example Embodiments for Transferring Nanowires

Embodiments for applying nanostructures such as nanowires to surfaces are described in this section. In embodiments, one or more nanowires are provided proximate to an electrode pair on a transfer surface. The electrode pair is energized, whereby the nanowires become associated with the electrode pair. Subsequently, the nanowires are deposited from the electrode pairs to a destination surface.

The term "positioning" as used throughout refers to the alignment and association, as well as the deposition or coupling, of nanowires onto a surface, for example, an electrode pair. Positioning includes nanowires that are both aligned and non-aligned. The term "aligned" nanowires as used throughout refers to nanowires that are substantially parallel or oriented in the same or substantially same direction of one another (i.e. the nanowires are aligned in the same direction, or within about 45° of one another). The nanowires of the present invention are aligned such that they are all substantially parallel to one another and substantially perpendicular to each electrode of an electrode pair (e.g., aligned parallel to an axis through both electrodes) (though in additional embodiments, they can be aligned parallel to an electrode). Positioning of nanowires onto an electrode pair includes positioning the nanowires such that the nanowires span the electrode pair. In embodiments in which the nanowires are longer than the distance separating two electrodes of an electrode pair, the nanowires may extend beyond the electrodes.

Methods for providing nanowires for use in the methods and systems of the present invention are well known in the art. In an embodiment, the nanowires are provided in a suspension, which is a plurality of nanowires suspended in a liquid. In an embodiment, the liquid is an aqueous media, such as water or a solution of water, ions (including salts), and other components, for example surfactants. Additional examples of liquids suitable for preparing nanowire suspensions include, but are not limited, organic solvents, inorganic solvents, alcohols (e.g., isopropyl alcohol) (IPA), etc.

As used herein the phrase "proximate to an electrode pair" as it relates to providing the nanowires means that the nanowires are provided or positioned such that they can be acted upon by an electric field generated at the electrode pair. This is a distance from the electrode pair such that they can be associated with the electrodes. In example embodiments, the nanowires are provided such that they are at distance of less than about 10 mm from the electrode pairs. For example, the nanowires may be provided such that they are less than about 100 μm, less than about 50 μm, or less than about 1 μm from the electrode pair.

Figure 2:
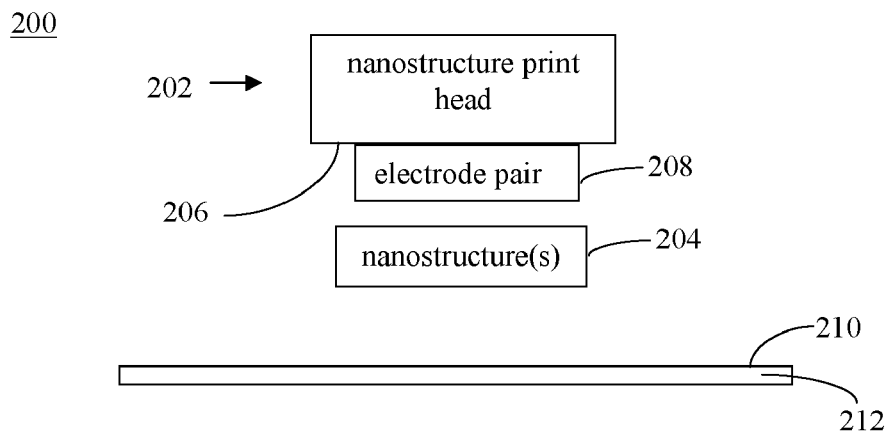
FIG. 2 shows a block diagram of a nanostructure transfer system, according to an example embodiment of the present invention.

In embodiments, the present invention provides a system or apparatus for nanostructure alignment and deposition. For example, FIG. 2 shows a nanostructure transfer system 200, according to an example embodiment of the present invention. As shown in FIG. 2, transfer system 200 includes a nanostructure print head 202, nanostructure(s) 204, and a destination substrate 212. Nanostructure print head 202 is a body configured to receive nanostructure(s) 204, and to transfer nanostructure(s) 204 to substrate 212. As shown in FIG. 2, nanostructure print head 202 has a transfer surface 206 and includes an electrode pair 208. Substrate 212 has a surface 210, referred to as a "destination surface" for receiving nanostructure(s) 204. Electrode pair 208 is located on transfer surface 206. Nanostructure(s) 204 are received by electrode pair 208 of transfer surface 206, for transfer to destination surface 210. Nanostructure(s) 204 can include any of the nanostructure types mentioned elsewhere herein, including one or more nanowires. Further description of the components of transfer system 200 is provided further below.

Figure 3:
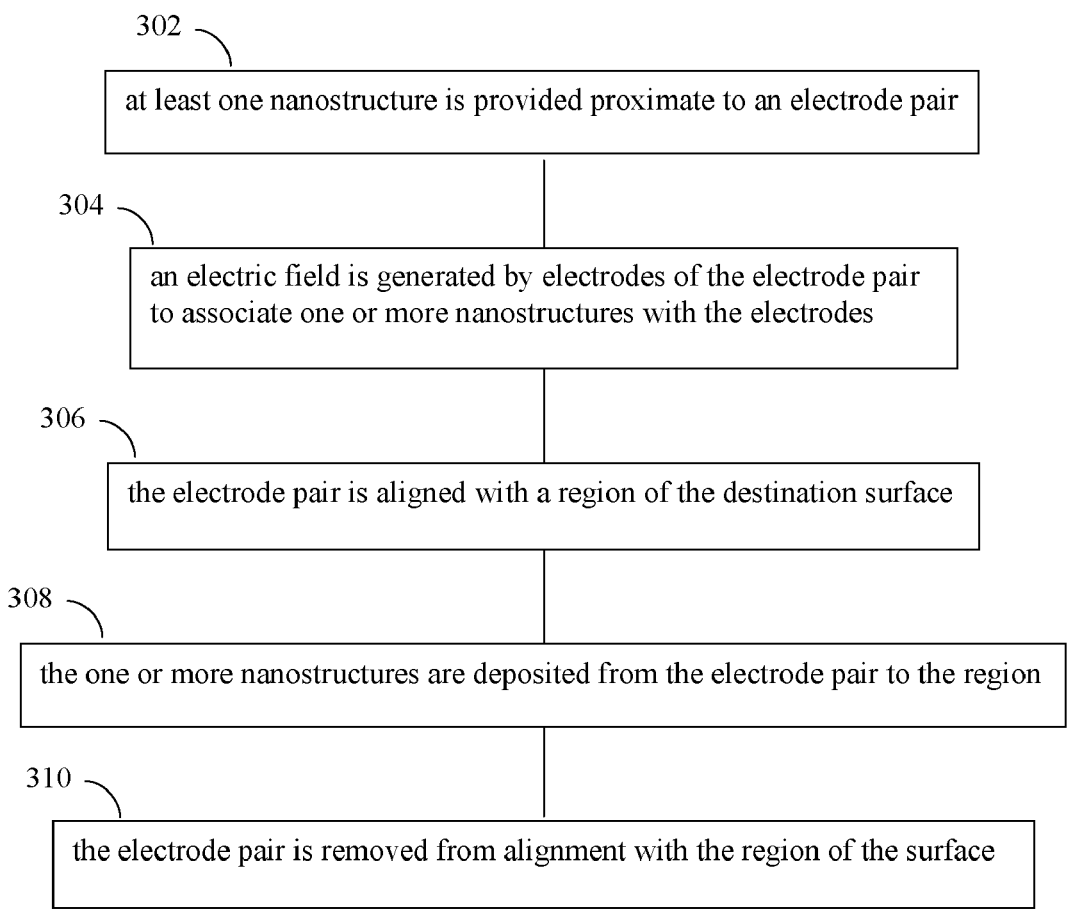
FIG. 3 shows a flowchart providing example steps for transferring nanostructures, according to example embodiments of the present invention.

FIG. 3 shows a flowchart 300 providing example steps for transferring nanostructures, according to example embodiments of the present invention. For example, nanostructure print head 202 of FIG. 2 can be used to transfer nanostructure(s) 204 according to flowchart 300. For illustrative purposes, flowchart 300 is described as follows with respect to FIGS. 2 and 4-6, which show various block diagrams of embodiments of the present invention. Other structural and operational embodiments will be apparent to persons skilled in the relevant art(s) based on the following discussion. Not all steps of flowchart 300 are necessarily performed in all embodiments.

Flowchart 300 begins with step 302. In step 302, at least one nanostructure is provided proximate to an electrode pair. For example, as shown in FIG. 2, nanostructure(s) 204 are provided proximate to electrode pair 208. For instance, nanostructure(s) 204 may be present in a solution which flows in contact with electrode pair 208, to enable nanostructure(s) 204 to be positioned proximate to electrode pair 208. Alternatively, nanostructure(s) 204 may be provided proximate to electrode pair 208 in other ways.

Figure 4:
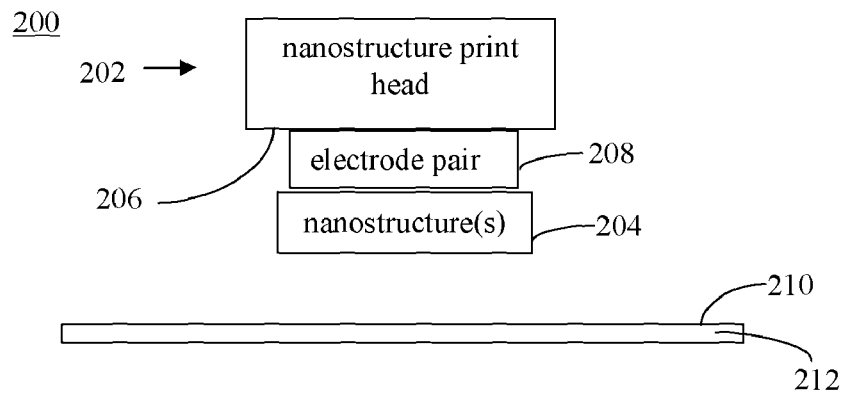
FIGS. 4-6 show block diagram views of the nanostructure transfer system of FIG. 2 during different phases of operation, according to example embodiments of the present invention.

In step 304, an electric field is generated by electrodes of the electrode pair to associate one or more nanostructures with the electrodes. For instance, an electrical potential may be coupled to electrode pair 208 to generate the electric field. The electric field generated by electrode pair 208 may be used to associate nanostructure(s) 204 with electrode pair 208 that are proximately located to electrode pair 208. As shown in FIG. 4, nanostructures 204 are associated with electrode pair 208. In an embodiment, associated nanostructure(s) 204 are held suspended at a distance from transfer surface 206 by the electric field. Example embodiments for generating an electric field by an electrode pair to associate nanostructures are described in further detail below.

Figure 5:
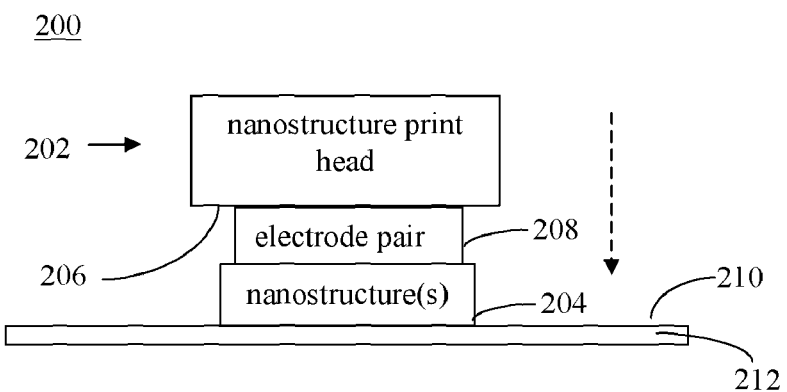

In step 306, the electrode pair is aligned with a region of the destination surface. For example, as shown in FIG. 5, electrode pair 208 is aligned with destination surface 210, by nanostructure print head 202, which is moved towards destination surface 210 (e.g., in a direction shown by a dotted arrow in FIG. 5). In an embodiment, electrode pair 208 is aligned in contact with destination surface 210. In another embodiment, electrode pair 208 is aligned adjacent to destination surface 210, a short distance away from destination surface 210. Electrode pair 208 may be aligned with any region of surface 210, including a generally open region (i.e., no contacts on surface 210 are required), a region having electrical contacts corresponding to electrode pair 208, or other region. Electrode pair 208 is aligned with a region of surface 210 on which nanostructure(s) 204 are to be positioned.

In step 308, the one or more nanostructures are deposited from the electrode pair to the region. Nanostructure(s) 204 may be deposited on destination surface 210 in a variety of ways. Various example embodiments for depositing nanostructures on a surface are described in detail below.

Figure 6:
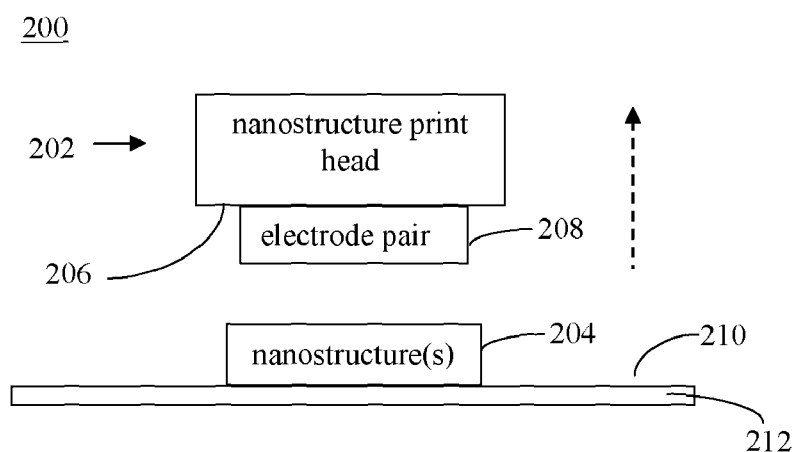

In step 310, the electrode pair is removed from alignment with the region of the surface. For example, as shown in FIG. 6, nanostructure print head 202 is moved away from destination surface 210 (e.g., in a direction shown by dotted arrow in FIG. 6). Nanostructure(s) 204 remain deposited on surface 210. Nanostructure print head 202 can subsequently be used to repeat performing flowchart 300 for the same region of surface 210, a different region of surface 210, and/or a surface of a structure other than substrate 212, to deposit further nanostructures.

Detailed example embodiments for nanostructure transfer system 200 and for performing flowchart 300 are described as follows. The embodiments are described below with respect to nanowires. These embodiments are provided for illustrative purposes, and are not intended to be limiting. It will be understood by persons skilled in the relevant art(s) that these embodiments may be used to transfer other types of nanostructures than just nanowires. Furthermore, these various embodiments may be adapted and/or combined in a variety of ways, as would be known to persons skilled in the relevant art(s) from the teachings herein.

Figure 7:
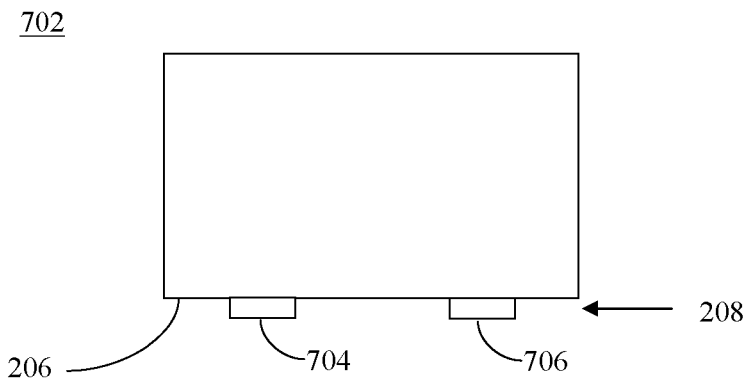
FIG. 7 shows a nanowire print head, according to an embodiment of the present invention.

FIG. 7 shows a nanowire print head 702, which is an example of nanostructure print head 202 shown in FIG. 2, according to an embodiment of the present invention. As shown in FIG. 7, nanowire print head 702 includes electrode pair 208 on transfer surface 206. Transfer surface 206 may be a surface of a substrate or other structure of print head 702 onto which electrode pair 208 is formed (e.g., patterned, plated, etc.). Electrode pair 208 includes a first electrode 704 and a second electrode 706. Transfer surface 206 may be formed of any suitable material, such as a semiconductor wafer or dielectric material. Example suitable materials include, but are not limited to Si, $SiO_2$, GaAs, InP, and other semiconductor materials described herein. Exemplary materials for use as first and second electrodes 704 and 706 include, but are not limited to, Al, Mo (Moly electrodes), Cu, Fe, Au, Ag, Pt, Cr/Au, doped polysilicon, etc. Electrodes for use in the practice of the present invention can also further comprise an oxide coating or other layer on their surface, if desired. Any suitable orientation or pattern of first and second electrodes 704 and 706 can be used. Note that in embodiments, one or more additional electrodes may be positioned on print head 702 (e.g., between electrodes 704 and 706). Such additional electrodes may be configured to modify an attractive or repulsive force (e.g., an electrostatic force) between the nanowires associated with print head 702 and transfer surface 206 and/or a destination surface.

Figure 8:
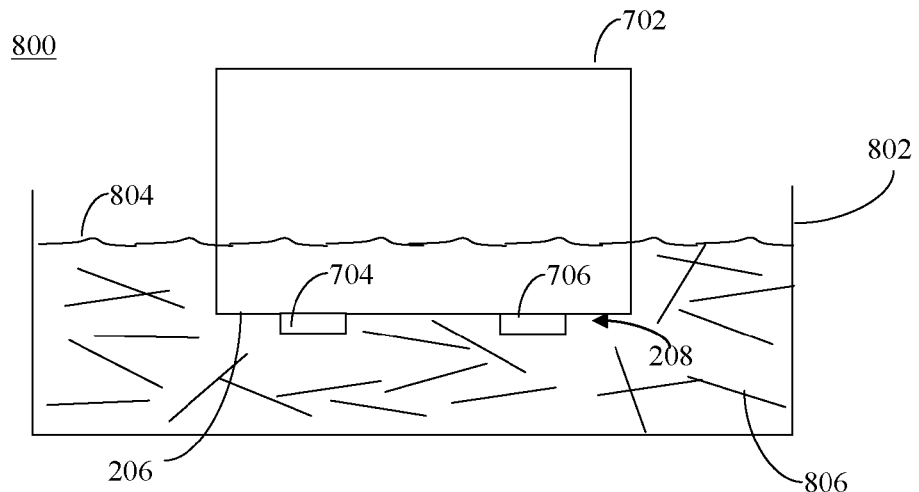
FIGS. 8 and 9 show portions of example nanowire transfer systems, according to embodiments of the present invention.

Nanowires may be provided proximate to first and second electrodes 704 and 706 in a variety of ways according to step 302 of flowchart 300. For example, FIG. 8 shows a portion of a nanowire transfer system 800, according to an embodiment of the present invention. As shown in FIG. 8, transfer system 800 includes print head 702 and a solution container 802. Container 802 contains a solution 804 that includes a plurality of nanowires 806, which may be referred to as a "nanowire suspension." In the embodiment of FIG. 8, transfer surface 206 of print head 702 is temporarily moved (e.g., "dipped") into solution 804 to enable nanowires 806 to become proximate to electrode pair 208, according to step 302 of flowchart 300.

Figure 9:
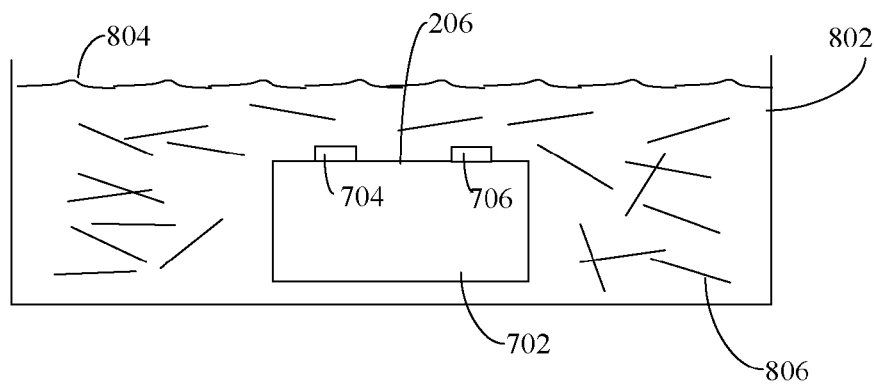

FIG. 9 shows a portion of a nanowire transfer system 900, according to an alternative embodiment of the present invention. As shown in FIG. 9, transfer system 900 includes print head 702 and solution container 802. Container 802 contains solution 804 that includes plurality of nanowires 806. In the embodiment of FIG. 9, transfer surface 206 (and the rest of print head 702) resides in solution 804, to enable nanowires 806 to become proximate to electrode pair 208, according to step 302 of flowchart 300.

Note that although electrode pair 208 is shown in FIG. 9 as facing upward in solution 804, and is shown in FIG. 8 as facing downward, print head 702 may be oriented in other ways so that electrode pair 208 may face in other directions, including upwards, downwards or sideways.

Nanowires 806 may be any suitable nanowire type described herein or otherwise known. For example, nanowires 806 may have a semiconductor core and one or more shell layers disposed about the core (i.e., the shell layers surround the core) (such as shown in FIGS. 1B and 1C). Examples semiconductor materials and shell materials include those described elsewhere herein. In an example embodiment, the core includes silicon (Si) and at least one of the shell layers, such as the outermost shell layer (i.e., the shell layer that is in contact with the external environment) includes a metal, such as TaAlN or WN. Additional examples of metal shell layers include those described elsewhere herein. Further exemplary nanowires include core:shell (CS) nanowires (e.g., $SiO_2$), core:shell:shell (CSS) nanowires (e.g., $SiO_2$:metal), and core: no oxide shell:metal shell nanowires (CNOS) (e.g., Si:metal).

Figure 10:
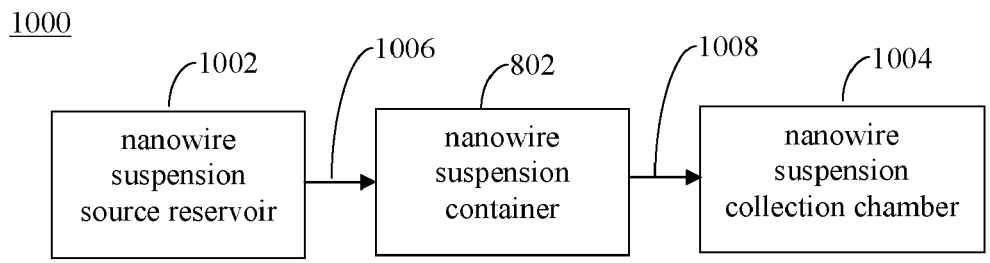
FIG. 10 shows a block diagram of a nanowire solution flow system, according to an example embodiment of the present invention.

In an embodiment, container 802 receives a flow of solution 804 containing nanowires 806. For instance, FIG. 10 shows a block diagram of a nanowire solution flow system 1000, according to an example embodiment of the present invention. As shown in FIG. 10, flow system 1000 includes a nanowire suspension source reservoir 1002, container 802, and a nanowire suspension collection chamber 1004. Nanowire suspension source reservoir 1002 is a tank or other type of reservoir that contains a supply of solution 804. Nanowires 806 may be introduced into solution 804 in reservoir 1002 to form the suspension, if desired. Solution 804 may be any suitable type of liquid for containing nanowires 806, including water, isopropyl alcohol (IPA), other liquids described herein, etc.

As shown in FIG. 10, nanowire suspension source reservoir 1002 outputs a nanowire suspension flow 1006 that is received by container 802. Nanowire suspension flow 1006 may be supplied by reservoir 1002 to container 802 by one or more flow channels, pipes, valves, etc. After enabling the suspension to interact with print head 702, container 802 outputs a residual nanowire suspension flow 1008 that is received by nanowire suspension collection chamber 1004. Nanowire suspension collection chamber 1004 is a tank or other type of reservoir. The residual nanowire suspension flow received in chamber 1004 may be filtered and/or supplied back to source reservoir 1002 for recirculation through system 1000, may have residual nanowires recovered therefrom, may be discarded, etc.

Thus, in the embodiments described above, one or more nanowires 806 are provided by providing a suspension of nanowires (e.g., a nanowire "ink") to electrode pair 208. As represented in FIG. 10, a nanowire suspension is provided by flowing a solution containing nanowires against an electrode pair on a transfer surface. As nanowires 806 are provided, the suspension flow helps to align the nanowires in the direction of the flow.

In an embodiment, container 802 can be stirred, vibrated, or otherwise moved to maintain a homogeneous suspension of nanowires 806. In another embodiment, where a stratified suspension of nanowires is desired, gravity, electric fields and/or an overflow by a nanowire-free solvent of similar or lower density can be used to create stratification. A stratified suspension of nanowires may be used in a variety of ways. For example, print head 702 may be positioned in a high nanowire-density region of the stratified suspension for deposition of nanowires, and subsequently positioned in a lower density, "clean solvent" region for removal of excess nanowires.

Additional methods for providing nanowires to an electrode pair are well known in the art, and include, but are not limited to, spray coaters, spray painting, meniscus coater, dip-coater, bar-coater, gravure coater, Meyer rod, doctor blade, extrusion, micro-gravure, web coaters, doctor blade coaters, in-line or ink jet printers.

Figure 11:
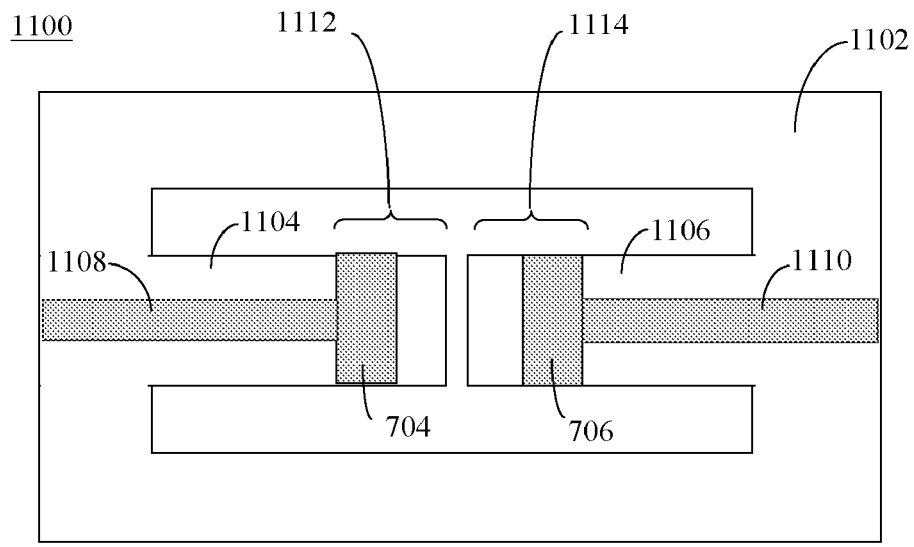
FIGS. 11 and 12 show views of an example print head having cantilevers, according to an example embodiment of the present invention.
Figure 12:
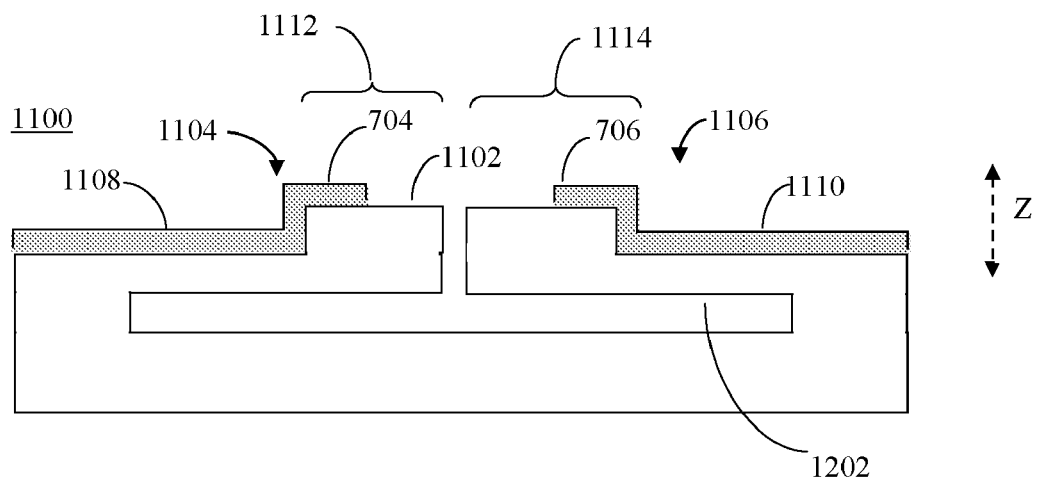
Figure 13:
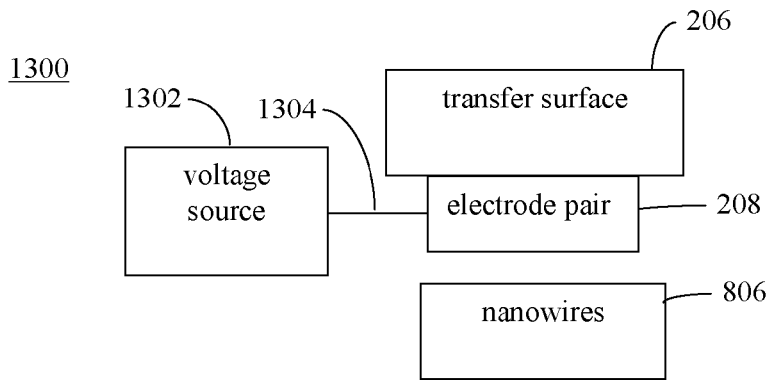
FIG. 13 shows an electric field generation system for a transfer system, according to an example embodiment of the present invention.

As described above, a variety of configurations for electrode pair 208 may be used in embodiments. For example, electrode pair 208 may be fixed position electrodes. In another embodiment, electrode pair 208 may be configured to enable compliance with a destination surface to which they may be applied. For instance, FIG. 11 shows a plan view of an example print head 1100, according to an embodiment of the present invention. Print head 1100 has a transfer surface 1102 having first and second cantilevers 1104 and 1106 that mount electrode pair 208. FIG. 12 shows a side cross-sectional view of print head 1100. As shown in FIGS. 12 and 13, first and second cantilevers 1104 and 1106 are generally coplanar and coaxial bodies, having adjacently positioned movable ends, and oppositely positioned fixed ends. First cantilever 1104 has a raised end portion 1112 on its movable end, and second cantilever 1106 has a raised end portion 1114 on its movable end. First electrode 704 is formed on raised end portion 1112 of first cantilever 1104, and second electrode 706 is formed on raised end portion 1114 of second cantilever 1106. A first electrical conductor 1108 (e.g., a metal trace) is formed on first cantilever 1104 to electrically couple first electrode 704 to an external circuit, and a second electrical conductor 1110 (e.g., a metal trace) is formed on second cantilever 1106 to electrically couple second electrode 706 to an external circuit. For example, first and second electrical conductors 1110 may electrically couple first and second electrodes 704 and 706 to a DC and/or AC electrical signal source.

First and second cantilevers 1104 and 1106 are not substantially flexible in the plane of transfer surface 1102, but are flexible in a direction normal to the plane of transfer surface 1102 (shown as a Z-axis in FIG. 12). Thus, when first and second electrodes 704 and 706 are positioned in contact with a surface (e.g., destination surface 210), the free ends of first and second cantilevers 1104 and 1106 can flex into a gap 1202 below their free ends, to provide compliance to protect first and second electrodes 704 and 706 from damage, and to aid in complying with a non-level destination surface.

Cantilevers 1104 and 1106 may be any type and configuration of cantilever. In an embodiment, cantilevers 1104 and 1106 are micro-electromechanical system (MEMS) cantilevers.

Figure 14:
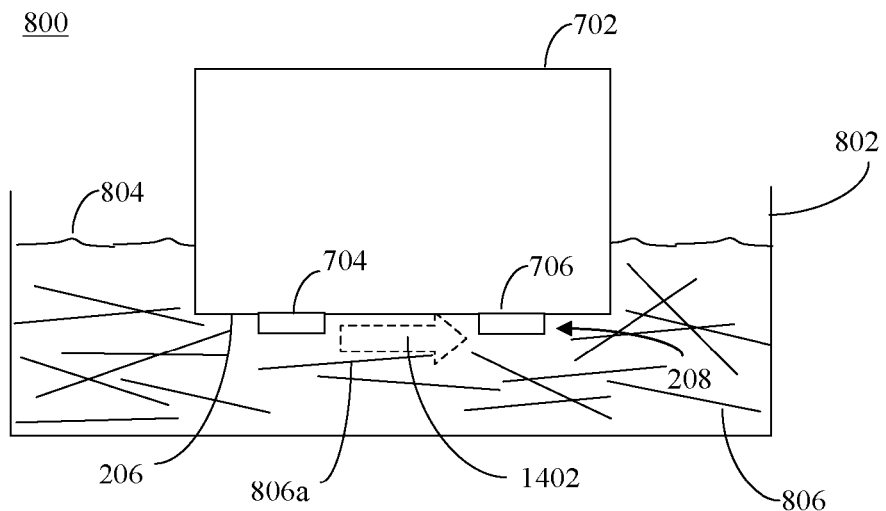
FIG. 14 shows a transfer system, where an electric field is generated to associate nanowires with an electrode pair, according to an example embodiment of the present invention.

According to step 304 of flowchart 300 (FIG. 3), an electric field is generated by electrodes of an electrode pair to associate nanostructures with the electrodes. FIG. 13 shows a nanowire transfer system 1300 that can be used to perform step 304 of flowchart 300 (FIG. 3), according to an example embodiment of the present invention. As shown in FIG. 13, system 1300 includes a voltage source 1302. Voltage source 1302 is a signal/waveform generator coupled to electrode pair 208 by electrical signal 1304. Voltage source 1302 generates electrical signal 1304 as a direct current (DC) and/or alternating current (AC) signal to cause electrode pair 208 to generate an electric field. For example, FIG. 14 shows transfer system 800 of FIG. 8, where an electric field, represented between first and second electrodes 704 and 706 by arrow 1402, is generated by application of a voltage to electrode pair 208. Electric field 1402 is generated between electrodes 704 and 706 of electrode pair 208 by energizing electrode pair with electrical signal 1304 to associate at least some of nanowires 806 with electrode pair 208. It should be noted that electric field 1402 can be generated before, after, or during the period of nanowire producing/introduction into container 802. As used herein, the terms "electric field" and "electromagnetic field" are used interchangeably and refer to the force exerted on charged objects in the vicinity of an electric charge. As used herein, "energizing the electrode pair" refers to any suitable mechanism or system for providing an electric current to the electrodes such that an electric field is generated between electrodes of an electrode pair.

Energizing electrode pair 208 to generate electric field 1402 can be performed during part or all of a nanowire alignment and deposition process. For example, electrode pair 208 may remain energized during step 306 of flowchart 300 (alignment of print head) and during a portion or all of step 308 of flowchart 300 (deposition of nanowires). In an example embodiment, electric field 1402 is generated by coupling (e.g., using wires or other connection) first electrode 704 to a positive electrode terminal of voltage source 1302, and coupling second electrode 706 to a negative electrode terminal of voltage source 1302. When an electric current is switched on and supplied by electrical signal 1304, the negative and positive terminals transfer charge to electrodes 704 and 706 positioned on transfer surface 206, thereby generating electric field 1402 between electrodes 704 and 706 of electrode pair 208. In embodiments, electric field 1402 can be constant electric field, a pulsed electric field such as a pulsed AC electric field, or other electric field type.

The energizing of electrode pair 208 to create electric field 1402 can also be caused by supplying an electromagnetic wave to electrode pair 208. As is well known in the art, waveguides of various dimensions and configurations (e.g., cylindrical, rectangular) can be used to direct and supply an electromagnetic wave (see e.g., Guru, B. S. et al., "Electromagnetic Field Theory Fundamentals," Chapter 10, PWS Publishing Company, Boston, Mass. (1998)). Operation frequencies of waveguides for use in the practice of the present invention are readily determined by those of skill in the art, and may be in the range of about 100 MHz to 10 GHz, about 1 GHz-5 GHz, about 2-3 GHz, about 2.5 GHz, or about 2.45 GHz, for example.

Figure 15:
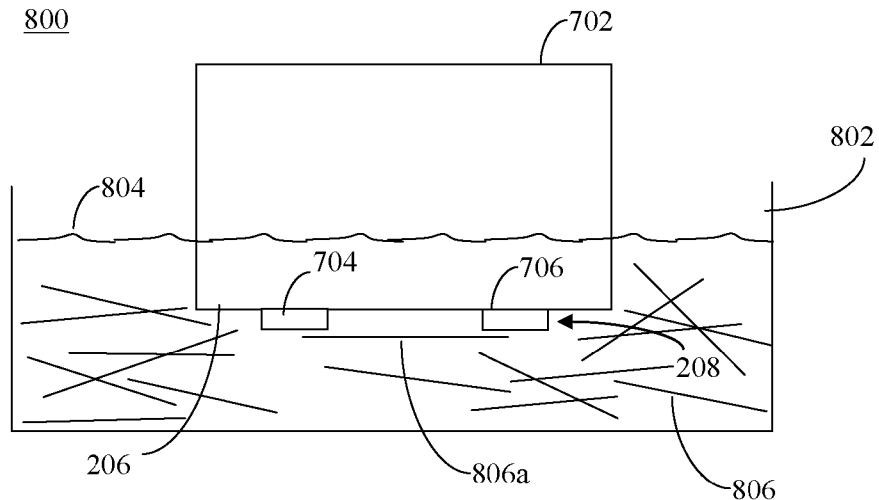
FIG. 15 shows the transfer system of FIG. 14, with an associated nanowire, according to an example embodiment of the present invention.

As is further described below, as nanowires 806 encounter an AC electric field 1402 generated between electrodes 704 and 706, a field gradient results. A net dipole moment is produced in proximate nanowires 806 (e.g., nanowire 806*a* in FIG. 14), and the AC field exerts a torque on the dipole, such that proximate nanowires align parallel to the direction of the electric field. For example, FIG. 15 shows nanowire 806*a* having been aligned by electric field 1402 parallel to electric field 1402 in association with electrode pair 208.

In embodiments, first and second electrodes 704 and 706 are separated by a distance that is less than, equal to, or greater than a long axis length of nanowires 806. Nanowires 806 of any length can be aligned and positioned using the methods of the present invention. In an embodiment, the distance between electrodes of an electrode pair is such that the nanowires extend just beyond the first edge of the electrode. In an embodiment, nanowires 806 extend just beyond a first edge and into a middle of each electrode, with tens of nanometers to several microns overlapping the electrode material at the end of a nanowire 806. Nanowires 806 that are shorter than the distance between electrodes 704 and 706 may be able to couple to only one electrode in a pair (if they couple at all), and thus may be removed during subsequent removing phases if desired. Similarly, nanowires 806 that are substantially longer than the distance between electrodes 704 and 706 hang over one or more of electrodes 704 and 706, and may be removed during subsequent removing phases (larger exposed surface area). Thus, this embodiment additionally provides a way to preferentially select nanowires 806 of a particular length from a suspension of a range of nanowire sizes, and align and deposit them onto an electrode pair 208. Embodiments may also associate and couple nanowires 806 that are "straight" rather than bent or crooked. Hence, such embodiments provide an added benefit of depositing preferably straight nanowires 806, rather than less preferred bent or crooked nanowires 806.

Figure 16:
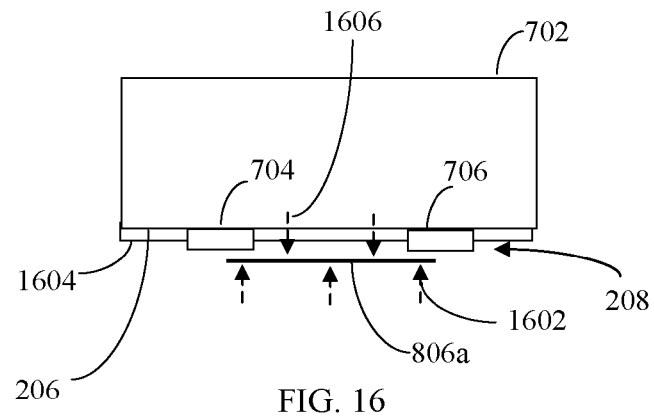
FIG. 16 shows forces acting upon a nanowire in a transfer system, according to an example embodiment of the present invention.

In addition to aligning the nanowires parallel to an AC electric field, the field gradient exerts a dielectrophoretic force on proximate nanowires 806, attracting them toward electrode pair 208. FIG. 16 shows a force 1602 attracting nanowire 806a towards electrode pair 208 of print head 702. In an embodiment, force 1602 is a dielectrophoretic force. The gradient is highest at electrode pair 208, exerting an increasing attraction toward the electrodes. An electric double-layer is produced at the surface of each electrode of electrode pair 208, such that oppositely charged ions are present at each electrode. In the presence of electric field 1402, the ions migrate away from each electrode and initially toward nanowire 806a hovering proximately nearby (e.g., above or below). As ions approach oppositely charged nanowire 806a, the ions are repulsed by the like charge and then directed back toward the respective electrode resulting in a circulating pattern of ions. Liquid that is present (i.e., the nanowire suspension) is also circulated, generating an electro-osmotic force that opposes the dielectrophoretic force attracting nanowire 806a to the electrodes. Thus, in an embodiment, a force 1606 shown in FIG. 16 may be an osmotic force. As forces 1602 and 1606 reach an equilibrium (or relative equilibrium), nanowire 806a is held in place such that it becomes associated with electrode pair 208. As used herein the terms "associated" and "pinned" are used to indicate that nanowires (such as nanowire 806a) are in such a state that the electro-osmotic force and the dielectrophoretic force are at equilibrium, such that there is no or little net movement of the nanowires away from electrode pair 208 (i.e., normal or substantially normal to transfer surface 206 and electrode pair 208). This is also called the "association phase" throughout.

Furthermore, in an embodiment, charge values of nanowires 806 and transfer surface 206 affect association or pinning of nanowires to electrode pair 208. For example, FIG. 16 shows print head 702 having associated nanowire 806a (additional nanowires not shown may also be associated). As shown in FIG. 16, transfer surface 206 may have a layer 1604 that provides a surface charge to transfer surface 206, such as an oxide layer. The charge polarity of layer 1604 can be selected to attract or repel nanowire 806a, as desired. For example, layer 1604 can provide a negative surface charge to transfer surface 206 that results in a repulsive force on nanowire 806a, which may also have a negative surface charge (e.g., in isopropyl alcohol). Thus, force 1606 repelling nanowire 806a in FIG. 16 may include an electrostatic repulsive force that results from a same charge polarity of nanowire 806a and layer 1604.

Figure 17:
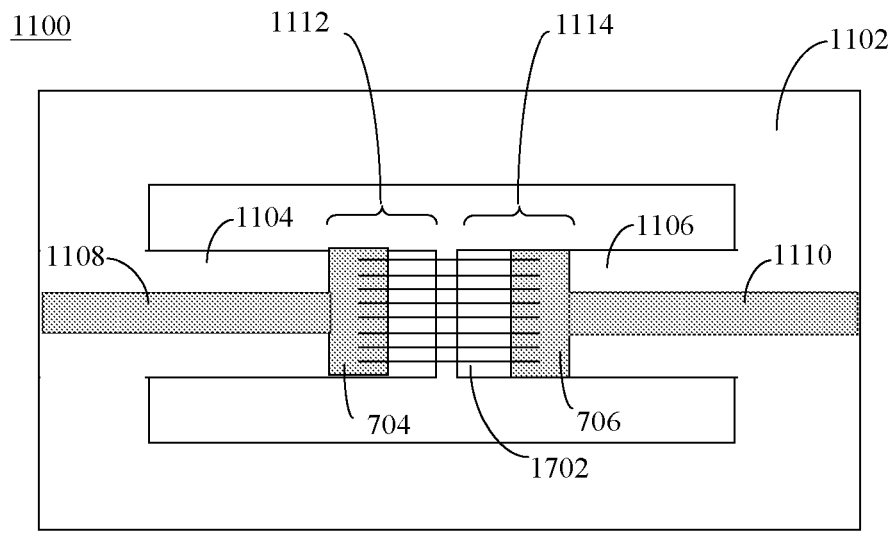
FIGS. 17 and 18 show plan and side views of the print head of FIG. 11, with associated nanowires, according to example embodiment of the present invention.
Figure 18:
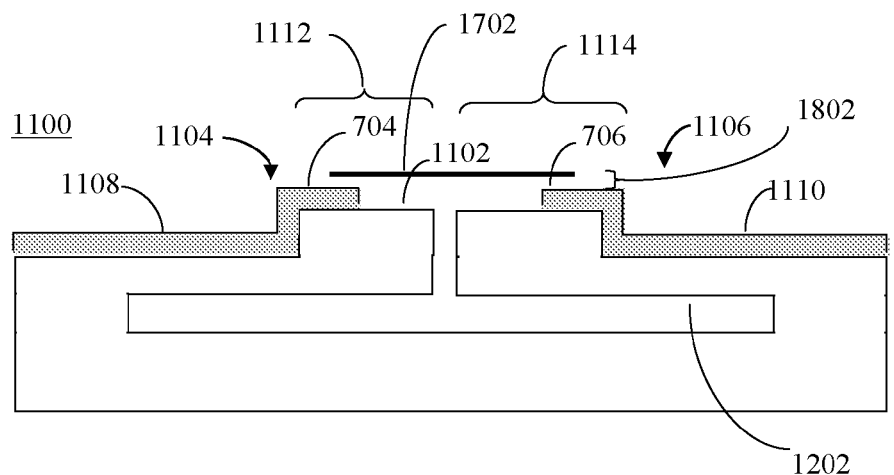

In the associated, or pinned state, the nanowires are aligned parallel to the electric field, but are sufficiently mobile along the electrode edges (i.e. in a plane just above the surface of the electrodes). For example, FIGS. 17 and 18 show plan and side cross-sectional views, respectively, of electrode pair 208 on cantilevers 1104 and 1106 of FIG. 11. As shown in FIGS. 17 and 18, a plurality of nanowires 1702 is associated, or pinned, with first and second electrodes 704 and 706. Nanowires 1702 are pinned at a distance 1802 from electrode pair 208. The amount of distance 1802 depends on a variety of factors, including a strength of the applied electric field 1402, a frequency of electric field 1402, a strength of charge of nanowires 1702, a strength of charge of layer 1604, etc.

In the associated or pinned state, nanowires 1702 are free to rearrange, migrate and/or align along the length of the electrodes 704 and 706. Nanowires 1702 that are already substantially aligned with electric field 1402 will tend to migrate along electrode pair 208 until contacting, and/or being repelled by, a nearest neighbor nanowire. Nanowires 1702 that are not substantially aligned will tend to migrate such that they become aligned as they contact, and/or are repelled by, nearest neighbor nanowires and, an equilibrium between the various forces acting on nanowires 1702 is reached. The lateral mobility (i.e., along electrode pairs 208, perpendicular to a direction of electric field 1402) of nanowires 1702 allows them to accommodate a chronological sequence of alignment and association events without giving rise to nanowire clumping. That is, as nanowires are continuously supplied to electrode pair 208 (i.e., from a suspension) additional nanowires are able to associate with the electrodes, as the nanowires that are previously associated are freely mobile such that they move out of the way to accommodate additional nanowires.

For further example description regarding the association of nanowires with electrode pairs, various nanowire densities, alternating current frequencies, modulating of the electric field, "locking" nanowires to an electrode pair, etc., refer to co-pending U.S. Appl. No. 60/857,765, filed Nov. 9, 2006, titled "Methods for Nanowire Alignment and Deposition," which is incorporated by reference herein in its entirety.

Following the associating of nanowires 1702 with electrodes 704 and 706, uncoupled nanowires can then be removed from electrode pair 208 so as to substantially eliminate nanowires that are not fully aligned, not fully coupled, overlapped, crossing, or otherwise not ideally coupled to electrode pair 208. Nanowires that are to be removed following the coupling phase are described herein as "uncoupled nanowires." Any suitable method for removing uncoupled nanowires can be used. For example, the uncoupled nanowires can be removed using tweezers (e.g., optical tweezers, see, e.g., U.S. Pat. Nos. 6,941,033, 6,897,950 and 6,846,084, the disclosures of each of which are incorporated herein by reference in their entireties) or similar instrument, or by shaking or physically dislodging the uncoupled nanowires. Suitably, uncoupled nanowires are removed by flushing away the nanowires. As used herein, the term "flushing away" includes processes where a fluid (either gaseous or liquid phase) is flowed over or around the nanowires so as to remove them from the electrode pairs. Nanowires that are crossed can be uncrossed using a suitably modulated electric field, and a third electrode can be used to remove "uncoupled nanowires," such as dielectrophoretically or electroosmotically. Uncoupled nanowires can also be removed inertially, and by other techniques.

Figure 19:
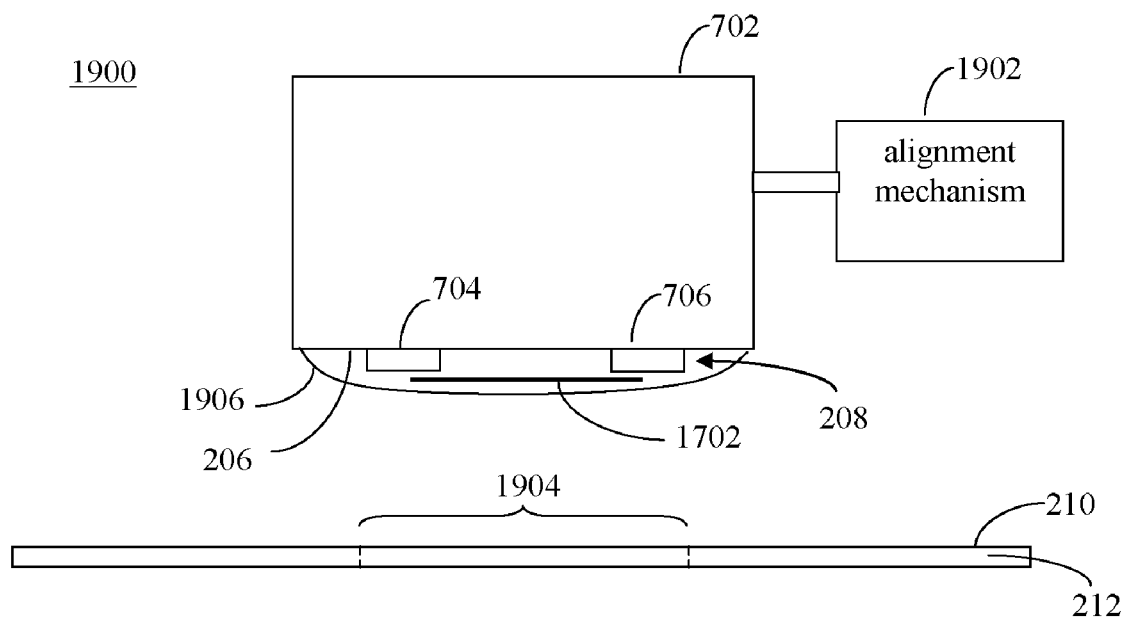
FIG. 19 shows an alignment system, according to an example embodiment of the present invention.

According to step 306 of flowchart 300 (FIG. 3), the electrode pair is aligned with a region of the destination surface. FIG. 19 shows a print head alignment system 1900 that can be used to perform step 306 for a nanowire transfer system, according to an example embodiment of the present invention. As shown in FIG. 19, system 1900 includes an alignment mechanism 1902 that is coupled to print head 702. Alignment mechanism 1902 is configured to move print head 702 such that electrode pair 208 is aligned with a designated nanowire transfer region 1904 on destination surface 210 of substrate 212. Alignment mechanism 1902 may be configured to move print head 702 so that electrode pair 208 is adjacent to but not in contact with region 1904, and/or to move print head 702 so that electrode pair 208 contacts region 1904. For example, alignment mechanism 1902 may include a motor (e.g., a linear motor) or other movement mechanism for moving print head 702 to region 1904. Furthermore, alignment mechanism 1902 may include position detecting sensors for detecting a position of print head 702 and/or substrate 212 to accurately position print head 702 with respect to region 1904. Example position detecting sensors may include optical sensors (e.g., vision systems), proximity sensors, mechanical sensors, etc., to detect relative position.

Substrate 212 may be any type of structure suitable for placement of nanostructures. For example, substrate 212 may be formed of a variety of materials, including a semiconductor material (e.g., silicon, GaAs, etc.), a polymer (e.g., a plastic material), glass, a ceramic material, a composite material, a printed circuit board (PCB), etc.

Note that FIG. 19 shows an embodiment where electrode pair 208 and a plurality of associated nanowires 1702 are covered in a fluid membrane 1906. For example, print head 702 may have been dipped in solution 804, as shown in FIG. 8, to have nanowires 1702 associated with electrode pair 208, as shown in FIGS. 14 and 15. Subsequently, print head 702 is withdrawn from solution 804. However, fluid membrane 1906 remains on transfer surface 206 to keep nanowires 1702 wet. In this manner, nanowires 1702 remain associated with electrode pair 208, including being aligned and positioned relative to first and second electrodes 704 and 706. For example, transfer surface 206 may be coated with a hydrophilic material that enables fluid membrane 1906 to stick to transfer surface 206. In embodiments, region 1904 on destination surface 210 may also be coated with a solution or may alternatively be relatively dry.

Figure 20:
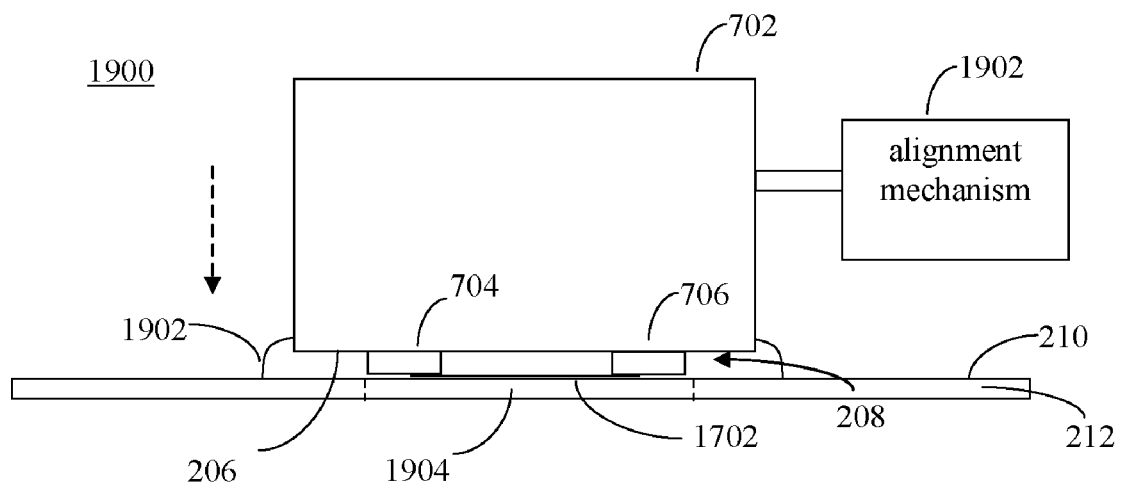
FIG. 20 shows a print head having been aligned with a surface region by alignment mechanism, according to an embodiment of the present invention.

FIG. 20 shows print head 702 having been aligned with region 1904 by alignment mechanism 1902 (e.g., in the direction of the downward dotted arrow shown in FIG. 20). As shown in FIG. 20, first and second electrodes 704 and 706 physically hold nanowires 1702 in contact with region 1904. Furthermore, nanowires 1702 substantially retain their alignment and position on electrode pair 208 while making contact with region 1904 due to the action of electric field 1402 and other forces acting on nanowires 1702.

Figure 21:
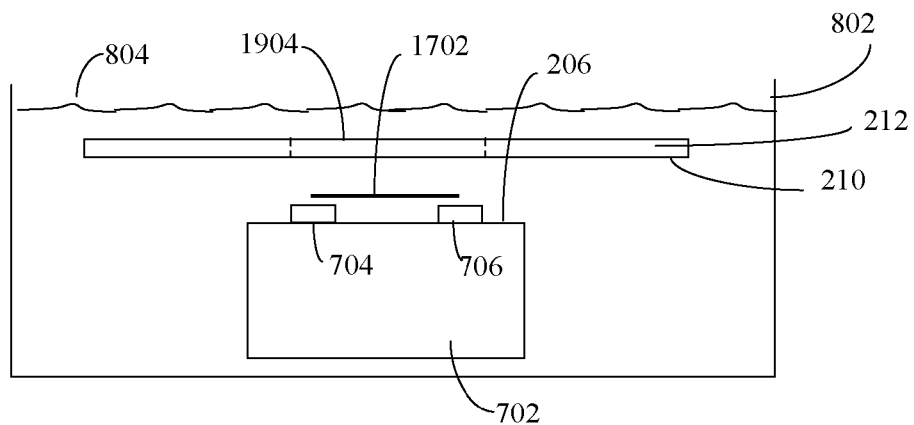
FIGS. 21 and 22 show the print head in solution of FIG. 9 being aligned with a destination surface, according to an example embodiment of the present invention.
Figure 22:
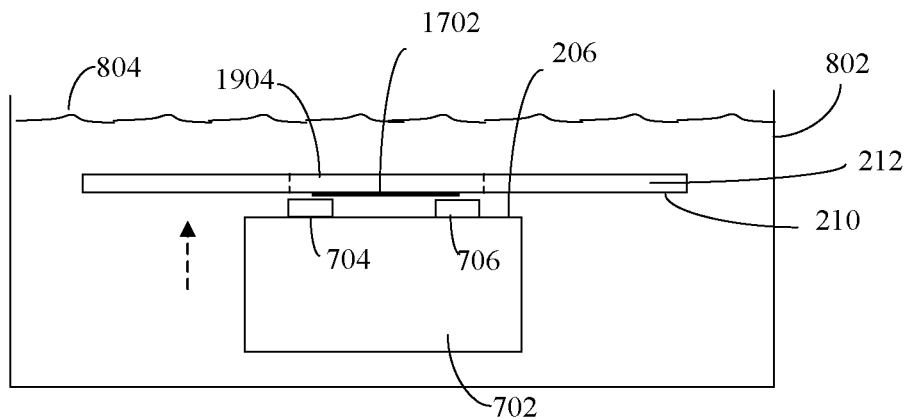

FIGS. 21 and 22 show print head 702 of FIG. 9 being aligned with destination surface 210, according to an example embodiment of the present invention. Nanowires 806 are shown removed from solution 804 in FIGS. 21 and 22, although they may alternatively still be present in solution 804. As shown in FIG. 21, substrate 212 and print head 702 are both submerged in solution 804. Nanowires 1702 are shown associated with electrodes 704 and 706 (e.g., according to step 304 of flowchart 300). As shown in FIG. 22, print head 702 has been aligned with region 1904 (e.g., by alignment mechanism 1902, not shown in FIGS. 21 and 22). First and second electrodes 704 and 706 physically hold nanowires 1702 in contact with region 1904 in FIG. 22. Furthermore, nanowires 1702 substantially retain their alignment and position on electrode pair 208 while making contact with region 1904, as described above.

Figure 23:
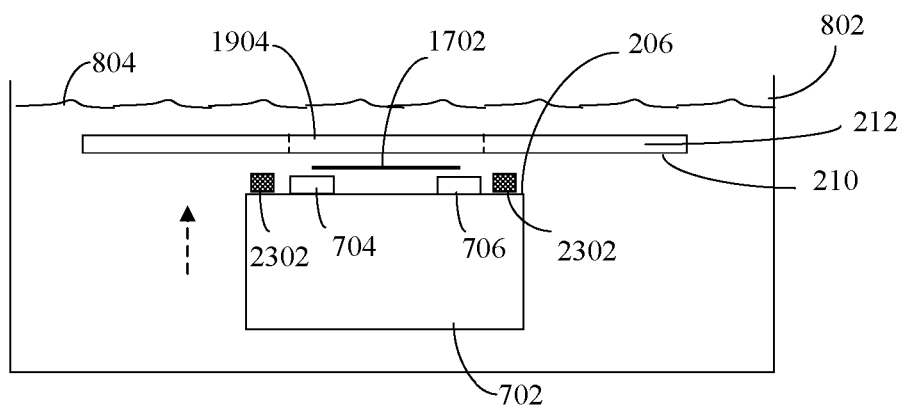
FIG. 23 shows an example print head with spacers, according to an embodiment of the present invention.

Note that in an embodiment, as shown in FIG. 23, one or more spacers or spacing members 2302 may be present on transfer surface 206 (and/or on destination surface 210) to hold transfer surface 206/electrode pair 208 at a predetermined distance from destination surface 210, and/or to reduce an impact between electrodes 704 and 706 and destination surface 210 when making contact. This may further be useful in aiding associated nanowires 1702 from losing their alignment and position when transfer surface 206 is being aligned with destination surface 210 according to step 306. Spacing members 2302 may be used in combination with any embodiment described herein. Spacing members 2302 may have any height, as determined for a particular application. For example, in an embodiment, a spacing member 2302 has a height of approximately 100 μm.

Figure 24:
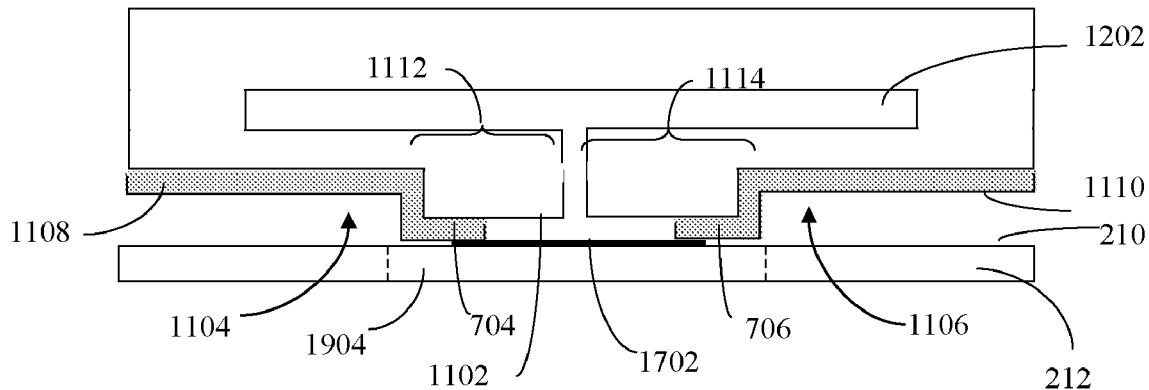
FIGS. 24 and 25 show side views of the print head of FIG. 11 in alignment with a destination surface, according to an example embodiment of the present invention.
Figure 25:
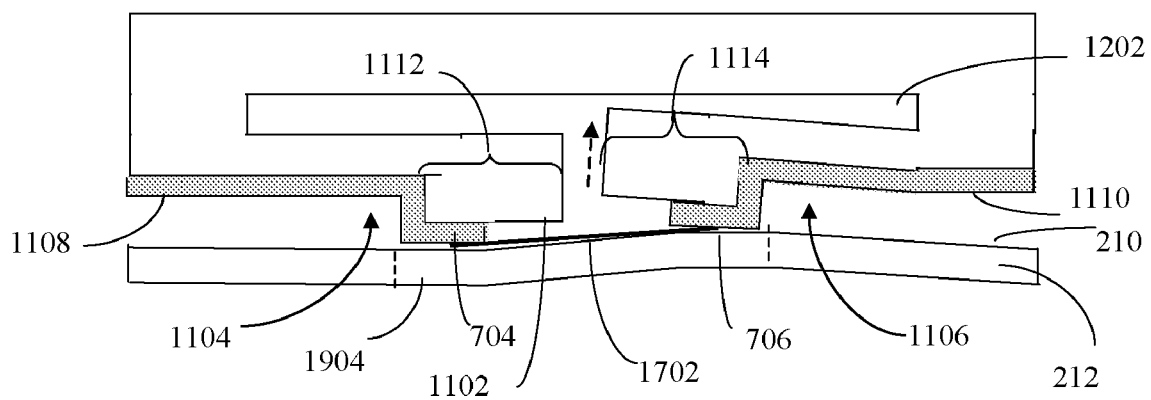

FIGS. 24 and 25 show examples of print head alignment for the configuration of print head 1100 of FIGS. 11, 17, and 18.

As shown in FIG. 24, print head 1100 has been aligned with region 1904 (e.g., by alignment mechanism 1902, not shown in FIGS. 24 and 25). First and second electrodes 704 and 706 physically hold nanowire 1702 in contact with region 1904 in FIG. 22. Furthermore, nanowires 1702 substantially retain their alignment and position on electrode pair 208 while making contact with region 1904, as described above.

In FIG. 25, substrate 212 is not planar, but instead has an uneven surface. A portion of region 1904 corresponding to second electrode 706 is higher than a portion of region 1904 corresponding to first electrode 704. Thus, second cantilever 1106 of print head 1100 flexes (e.g., in an upward direction indicated by a dotted arrow) in order for second electrode 706 to maintain contact with region 1904. Furthermore, by second cantilever 1106 flexing, first electrode 704 is able to maintain holding its respective ends of nanowires 1702 on region 1904.

Figure 26:
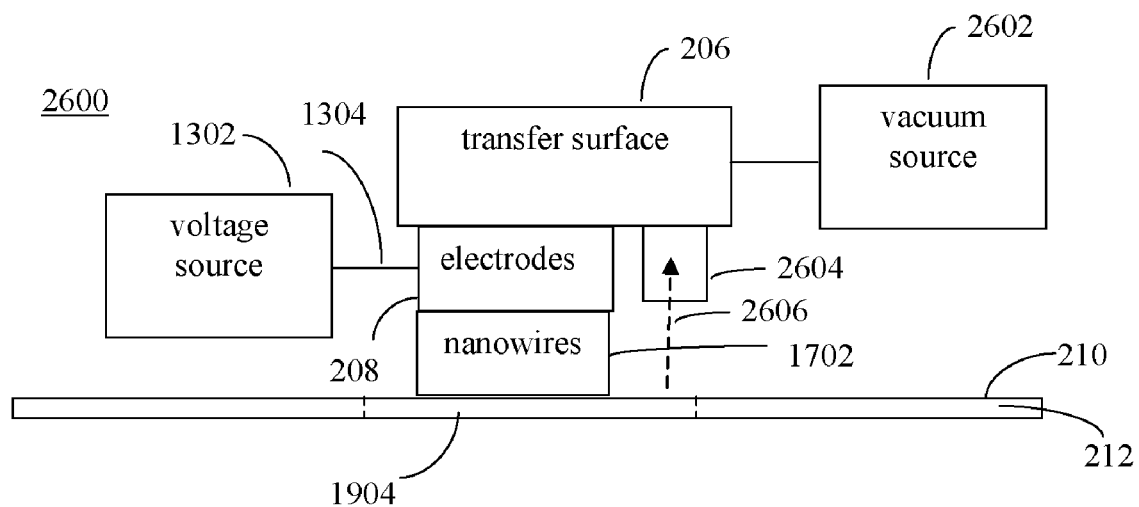
FIG. 26 shows a nanowire transfer system with a vacuum source, according to an example embodiment of the present invention.

Note that in an embodiment where a print head is aligned with a destination surface in solution, the solution between the print head and destination surface will be displaced during alignment. If the solution is displaced laterally, this may cause problems with displacing associated nanowires, with increasing an area of the print head, and/or further problems. FIG. 26 shows a nanowire transfer system 2600, according to an example embodiment of the present invention. System 2600 is similar to system 1300 shown in FIG. 13, with the addition of a vacuum source 2602. Furthermore, transfer surface 206 includes one or more vacuum ports 2604 coupled to vacuum source 2602. Vacuum source 2602 applies a vacuum or suction 2606 through vacuum port 2604 to the volume between transfer surface 206 and substrate 212 to remove excess solution. Thus, as transfer surface 206 and substrate 212 approach each other, excess solution can be removed to prevent displacement of associated nanowires, etc.

Figure 27:
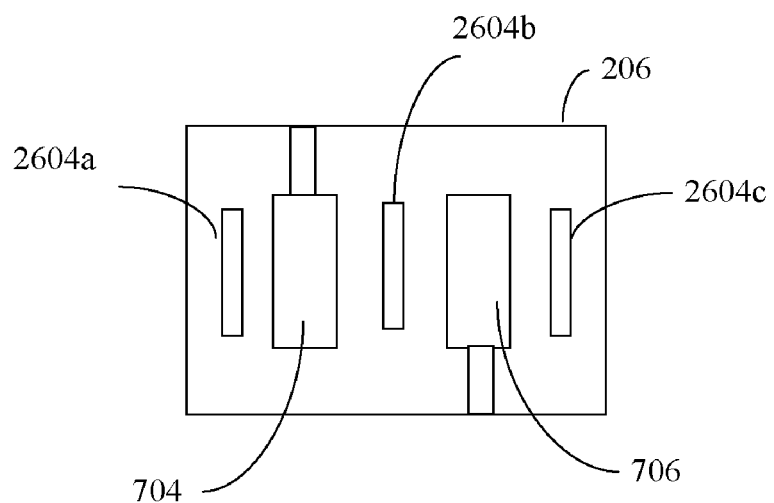
FIG. 27 shows an example plan view of a transfer surface with vacuum ports, according to an example embodiment of the present invention.

FIG. 27 shows an example plan view of transfer surface 206, according to an example embodiment of the present invention. As shown in FIG. 27, transfer surface 206 includes first and second electrodes 704 and 706, and a plurality of vacuum ports 2604a-2604c. In the example of FIG. 27, three vacuum ports 2604a-2604c are shown. First vacuum port 2604a is positioned on transfer surface 206 adjacent to first electrode 704. Second vacuum port 2604b is positioned on transfer surface 206 between first and second electrodes 704 and 706. Third vacuum port 2604c is positioned on transfer surface 206 adjacent to second electrode 706. Any number of vacuum ports 2604 may be present, and may be distributed on transfer surface 206 as desired. In the example of FIG. 27, vacuum ports 2604a-2604c are rectangular shaped. In other embodiments, vacuum ports 2604 may have other shapes, including round, square, etc.

According to step 308 of flowchart 300 (FIG. 3), one or more nanostructures are deposited from the electrode pair to the region. Nanowires may be deposited on destination surface 210 in a variety of ways. Various example embodiments for depositing nanowires on a surface are described as follows.

Figure 28:
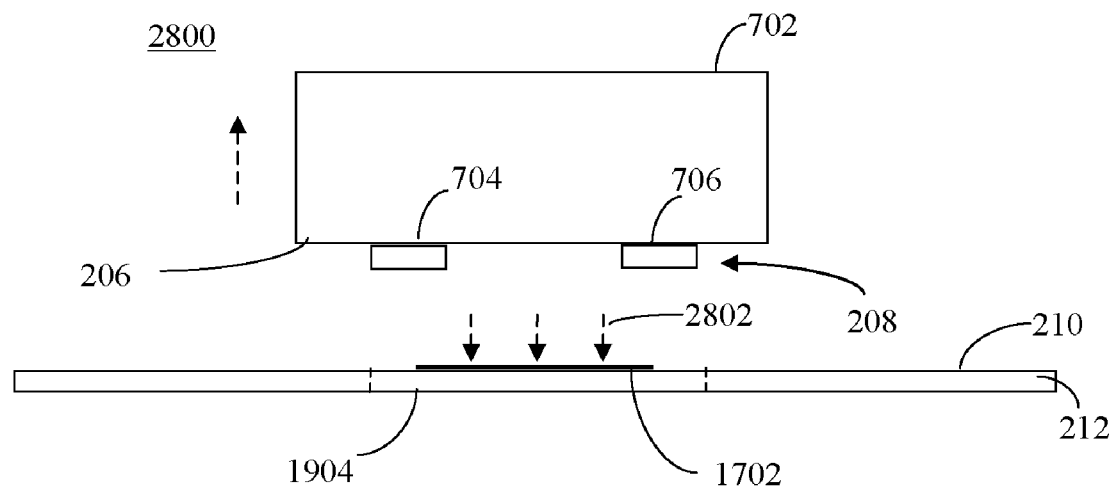
FIGS. 28, 29, 31A, 31B, 32, and 33 show example nanowire transfer systems configured to deposit nanowires, according to example embodiments of the present invention.

For example, FIG. 28 shows a nanowire transfer system 2800, according to an embodiment of the present invention. As shown in FIG. 28, nanowires 2802 are deposited on region 1904 from electrode pair 208. In the embodiment of FIG. 28, a force 2802 is present (which may include one or more forces) that attracted nanowires 1702 from print head 702 to destination surface 210 while they are aligned, and/or repelled nanowires 1702 from print head 702, overcoming any force(s) that attracted nanowires 1702 to transfer surface 206 of print head 702. Example forces that may be present in force 2802 include an electric field (AC and/or DC), a vacuum force, an electrostatic force, gravity, ultrasonic excitation, and/or other forces. These and other passive and active forces may be used to attract/repel nanowires 1702, as would be known to persons skilled in the relevant art(s). Example embodiments for utilizing some of these forces are described as follows.

Figure 29:
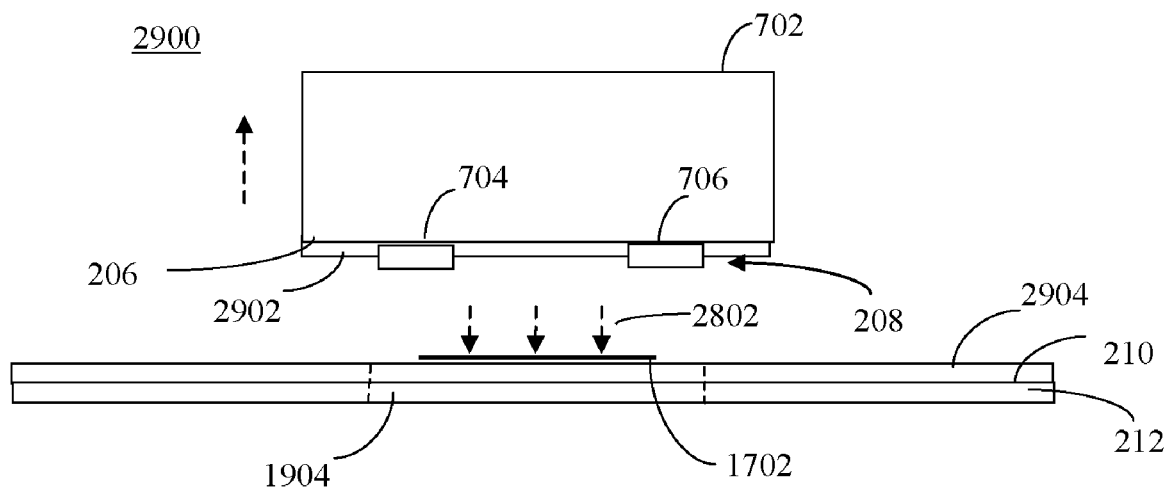

For example, FIG. 29 shows a transfer system 2900, according to an embodiment of the present invention. Transfer system 2900 is generally similar to transfer system 2800 of FIG. 28. However, as shown in FIG. 29, transfer surface 206 has negatively charged layer 2902 formed thereon. Negatively charged layer 2902 results in a negative surface charge for transfer surface 206, and thus a DC repulsive force on nanowires 1702 (which may be negatively charged). For example, layer 2902 may be an oxide layer. An electric field generated by electrode pair 208 (e.g., electric field 1402) is biased with an AC field condition to previously capture nanowires 1702 from solution, according to step 304 of flowchart 300 described above.

Furthermore, as shown in FIG. 29, destination surface 210 has a positively charged layer 2904 formed thereon. For example, positively charge layer 2904 may be an alumina layer. Positively charged layer 2904 results in a positive surface charge for destination surface 210, and thus a DC attractive force on nanowires 1702. When transfer surface 206 and destination surface 210 are sufficiently close (e.g., in the range of 1 µm to 4 µm), including when they are in contact with each other, nanowires 1702 transfer onto destination surface 210, as shown in FIG. 29, because the DC attractive force of layer 2904 overcomes the attractive force (dielectrophoretic force) caused by the AC electric field generated by electrode pair 208. In an embodiment, to enable transfer, the AC electric field may be reduced (e.g., by voltage source 1302) or entirely removed to reduce or remove the dielectrophoretic force.

Figure 30:
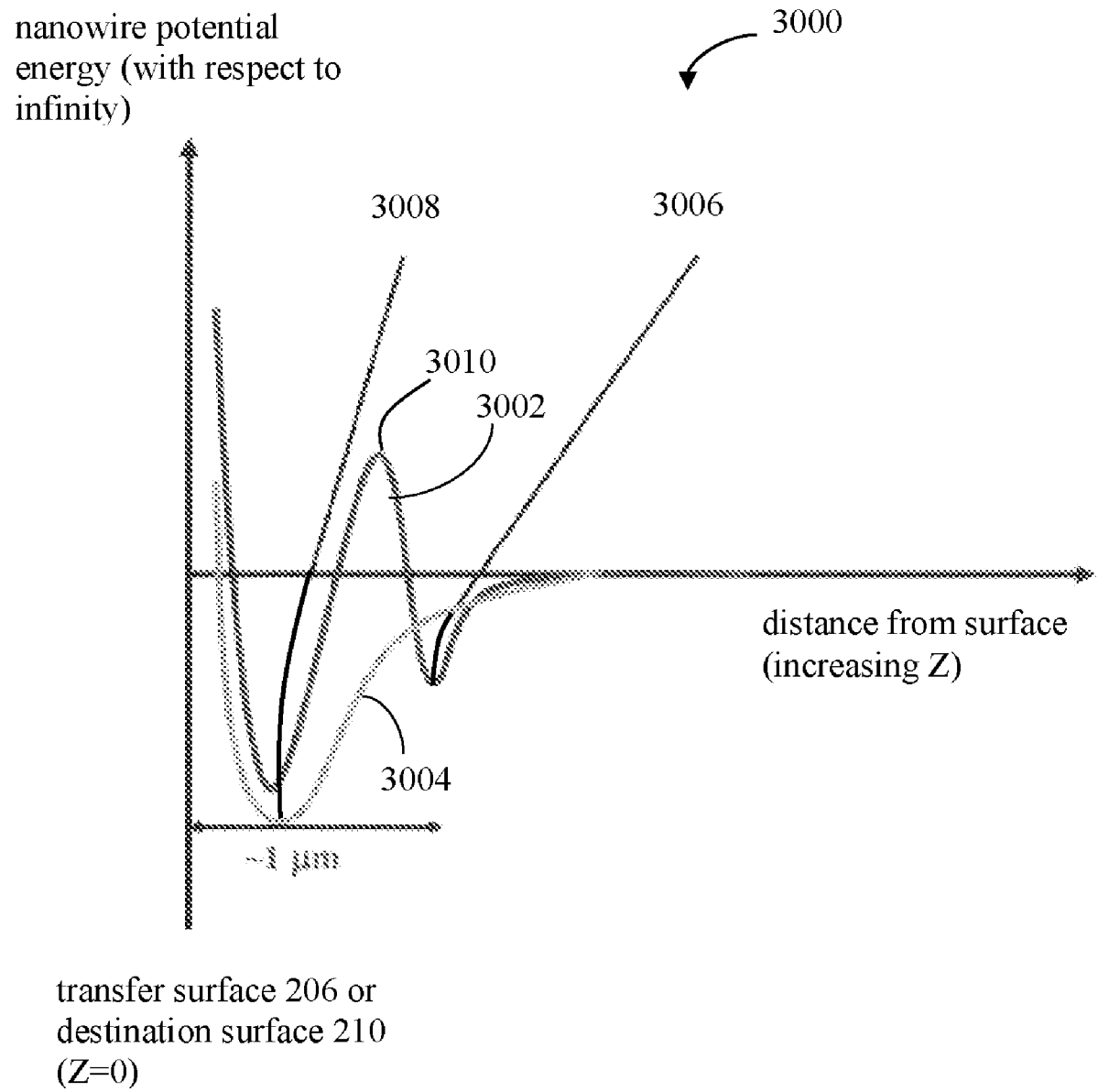
FIG. 30 shows a plot of potential energy levels for a transfer surface having an oxide layer and for a destination surface having a nitride layer, according to an embodiment of the present invention.

FIG. 30 shows a plot 3000 of nanowire potential energy as a function of distance from either transfer surface 206 or destination surface 210. Transfer surface 206 can have a negatively charged layer 2902 as an oxide layer and destination surface 210 can have a positively charged layer 2904 as a nitride layer, according to an embodiment of the present invention. A plot line 3002 represents the potential energy of nanowires suspended in solution over transfer surface 206 and a plot line 3004 represents the potential energy of nanowires suspended in solution over destination surface 210.

As shown in FIG. 30, at a first plot region 3006 representing a first potential minimum on plot line 3002 for transfer surface 210, nanowires 1702 are associated (pinned) with electrode pair 208. The pinned nanowires remain relatively rigid/aligned without being in contact with a transfer surface. In the current example, first plot region (first potential minimum) 3006 occurs when transfer surface 206 and destination surface 210 are approximately 1 µm-4 µm apart. At a second plot region (second potential minimum) 3008 representing a potential minimum on plot line 3004 for destination surface 210, nanowires 1702 are attracted to destination surface 210 due to the electrostatic attraction by the nitride layer. Nanowires 1702 may be "locked" on destination surface 210 in this manner. Second plot region 3008 occurs when nanowires and destination surface 210 are spaced approximately 0.1 µm-0.4 µm apart.

The transfer of nanowires 1702 from transfer surface 206 onto destination surface 210 is achieved by first "weakly" pinning nanowires 1702 on transfer surface 206 at low electric fields and low frequencies, "strongly" pinning nanowires 1702 on transfer surface 206 using low electric fields and high frequencies, moving transfer surface 206 to close proximity with destination surface 210, and finally releasing nanowires 1702 from potential minimum 3006 of transfer surface 206 by reducing the AC field on electrodes 704 and 706 of transfer surface 206. Due to the electrostatic repulsion represented by a potential maximum 3010 between nanowires 1702 and transfer surface 206 (e.g. layer 2902 on transfer surface 206) nanowires 1702 move away from transfer surface 206 after reduction of the AC attractive field. Within the rotational diffusion time (i.e. time required for nanowires to be rotated by an angle θ from a pre-aligned direction while subjected to gravity and Brownian motion) nanowires 1702 maintain the desired alignment determined by the AC field across electrodes 704 and 706 on transfer surface 206. The close proximity (e.g., ~1 µm) of the pre-aligned nanowires 1702 in solution to destination surface 210 enables a transfer onto destination surface 210 due to the electrostatic attraction represented by potential minimum 3008 (e.g. layer 2904 on destination surface 210). An efficient transfer of nanowires 1702 is enabled when the rotational diffusion time is large compared to the translational diffusion time for motion of nanowires from potential minimum 3006 to potential minimum 3008. Functional layers on nanowires 1702 and on destination surface 210 can be used to minimize the translational diffusion time without affecting the rotational diffusion time.

Figure 31A:
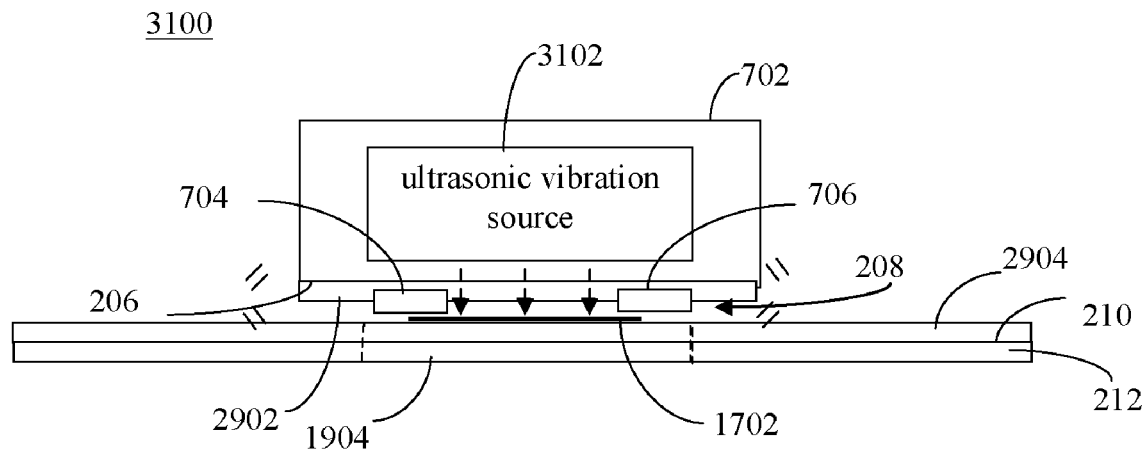

Note that in an embodiment, ultrasonic excitation/vibration can be used to enhance the process just described. For example, FIG. 31A shows a transfer system 3100, according to an embodiment of the present invention. Transfer system 3100 is generally similar to transfer system 2900 of FIG. 29, with the addition of ultrasonic vibration source 3102. Ultrasonic vibration source 3102 includes a piezoelectric transducer or other ultrasonic vibration source to ultrasonically vibrate print head 702 and transfer surface 206. In an embodiment, ultrasonic vibration of print head 702 causes nanowires to be separated from the transfer head up to approximately 100 µm, which enables the distance between transfer surface 206 and destination surface 210 to be larger while still allowing nanowires 1702 to be deposited on destination surface 210. The rate at which print head 702 moves toward destination surface 210 may be high initially and reduced gradually as print head 702 moves close to destination surface 210. For example, ultrasonic vibration source 3102 can be activated when transfer surface 206 approaches within 100 µm of destination surface 210. This enables depositing of nanowires 1702 to destination surface 210 (e.g., by gravity, electrostatic attraction, etc.) sooner (at a larger distance) while better maintaining the alignment of nanowires 1702 with electrode pair 208 than when electrode pair 208 is moved closer or even contacts destination surface 210.

Figure 31B:
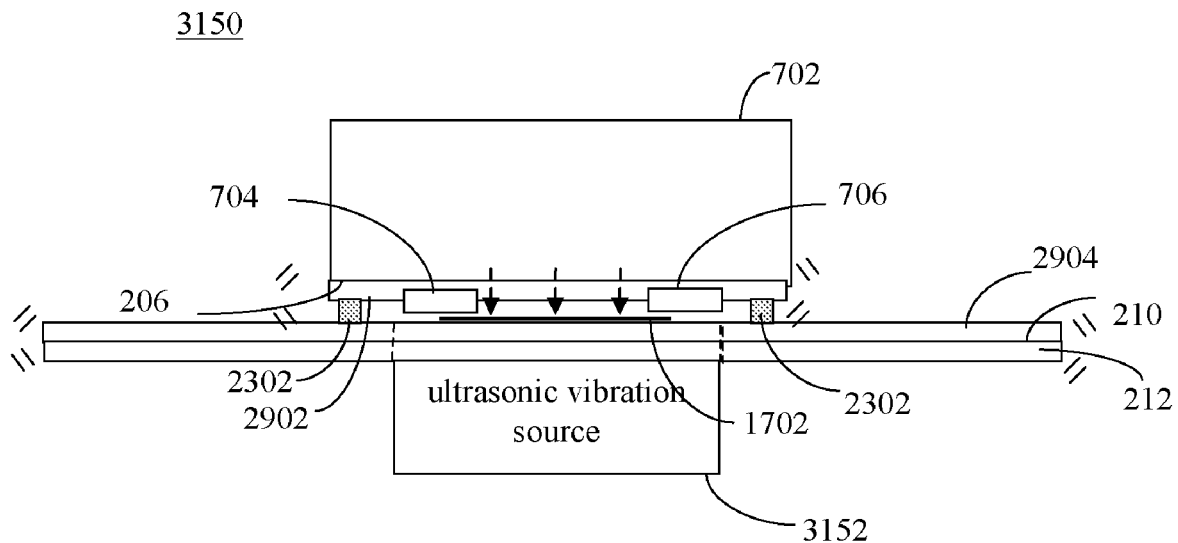

FIG. 31B shows a transfer system 3150, according to an embodiment of the present invention. Transfer system 3150 is generally similar to transfer system 3100 of FIG. 31A, except that an ultrasonic vibration source 3152 is coupled to substrate 212, rather than ultrasonic vibration source 3102 being associated with print head 702. Although shown coupled to a bottom surface of substrate 212, ultrasonic vibration source 3152 can be coupled to substrate 212 in any manner, including being coupled to the top surface, or being embedded in substrate 212 Ultrasonic vibration source 3152 may be secured in an ultrasonic chuck, or other application mechanism.

Ultrasonic vibration source 3152 includes a piezoelectric transducer or other ultrasonic vibration source to ultrasonically vibrate substrate 212, and thus to ultrasonically vibrate destination surface 210. Furthermore, when transfer surface 206 and destination surface 210 are brought near each other, spacers 2302 (on print head 702 and/or substrate 212) contact print head 702 and destination surface 210 together. Thus, ultrasonic vibration source 3152 also vibrates print head 702 and transfer surface 206. Because ultrasonic vibration source 3152 vibrates both transfer surface 206 and destination surface 210, they vibrate synchronously, such that they both vibrate in the same direction simultaneously. This causes less turbulence than when only one of transfer surface 206 and destination surface 210 vibrate, and thus nanowires 1702 are better able to retain their alignment while being transferred (e.g., by gravity, electrostatic attraction, etc.) from transfer surface 206 to destination surface 210.

Figure 31C:
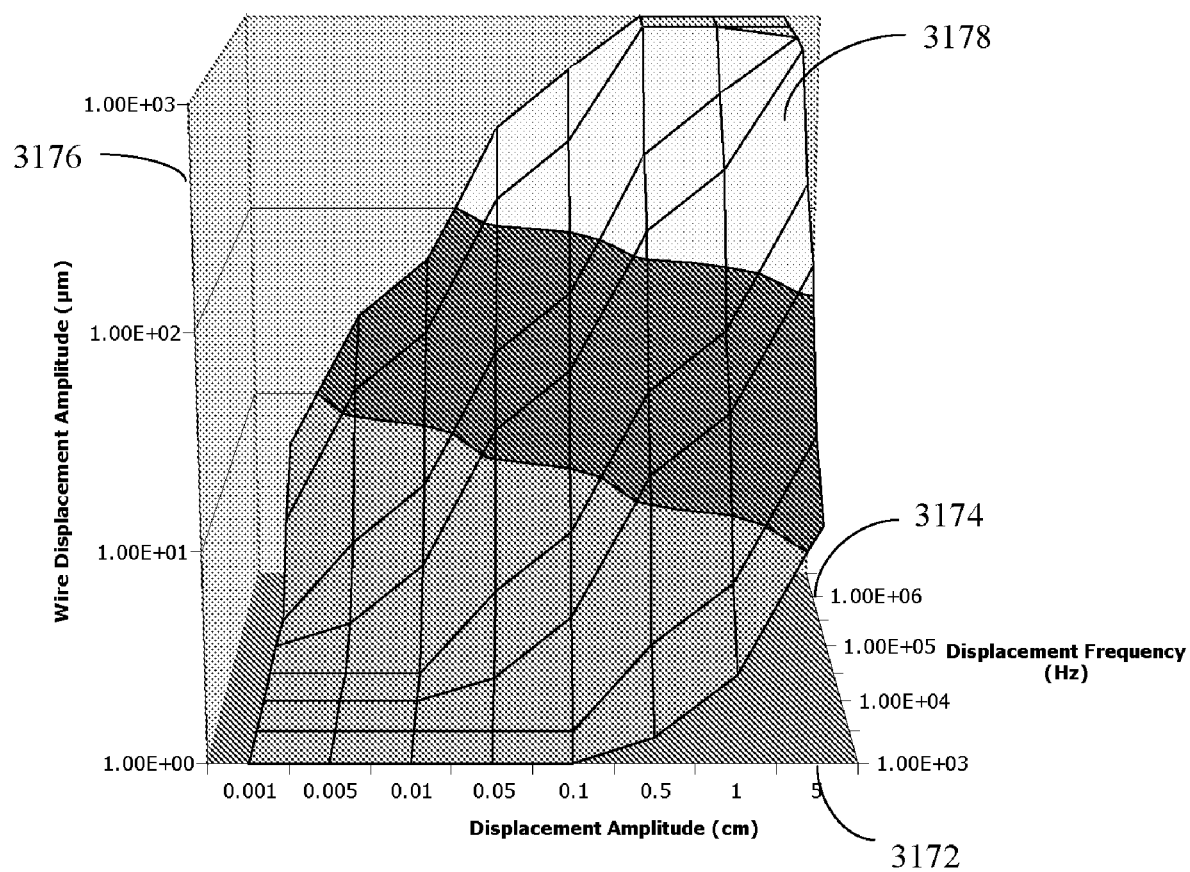
FIG. 31C shows a plot of the inertial motion of nanowires in isopropyl alcohol, according to an embodiment of the present invention.

FIG. 31C shows a plot 3170 of an inertial motion of nanowires in isopropyl alcohol (IPA) solution, according to an embodiment of the present invention. An X-axis 3172 of plot 3170 is a displacement amplitude, in centimeters, of destination surface 210 and transfer surface 206 caused by ultrasonic vibration source 3152. A Y-axis 3174 of plot 3170 is a displacement frequency caused by ultrasonic vibration source 3152. A Z-axis 3176 of plot 3170 shows a resulting displacement amplitude of nanowires 1702 in µm. A plot surface 3178 indicates generally that as surface displacement amplitude increases (on X-axis 3172), nanowire displacement amplitude (on Z-axis 3176) also increases. Likewise, as displacement frequency (on Y-axis 3174) increases, nanowire displacement amplitude (on Z-axis 3176) also increases.

In an example embodiment, transfer surface 206 and/or destination surface 210 may be ultrasonically vibrated at relatively high frequency, such as 10 KHz, with a low amplitude, such as 50-100 microns, to effectively transfer nanowires 1702 from transfer surface 206 to destination surface 210. A variety of other combinations of displacement amplitude (X-axis 3172) and displacement frequency (Y-axis 3174) combinations are apparent from plot 3170, and may be used to cause wire displacement (Z-axis 3176) to transfer nanowires, as desired for a particular application.

Figure 32:
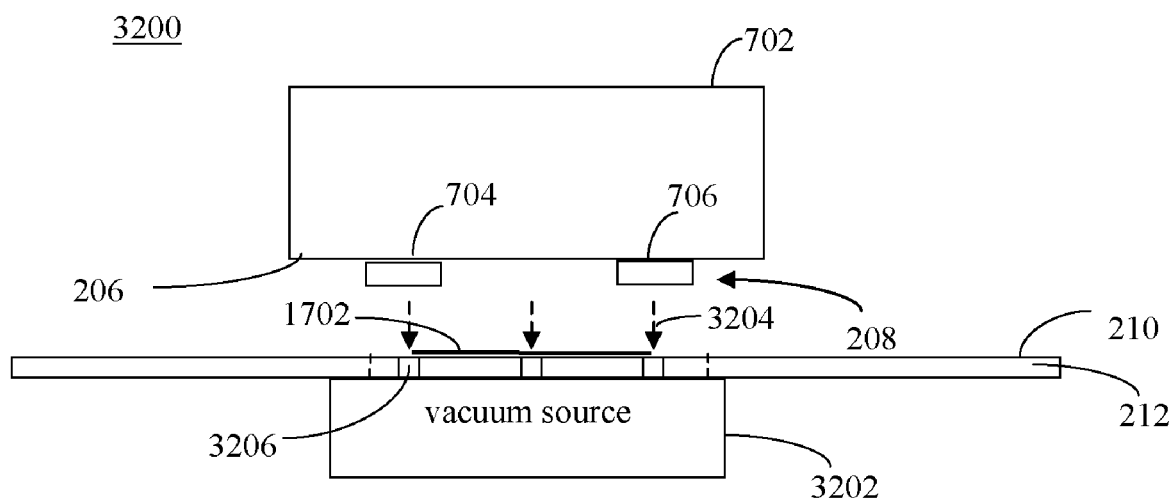

FIG. 32 shows an example transfer system 3200, according to another embodiment of the present invention. Transfer system 3200 is similar to transfer system 2800 of FIG. 28, with the addition of a vacuum source 3202 that applies a vacuum force 3204 through vacuum ports 3206 in substrate 212 to attract nanowires 1702 to destination surface 210. For example, using vacuum force 3204, vacuum source 3202 draws a solution surrounding nanowires 1702 in through vacuum ports 3206. The resulting solution flow exerts a pull on nanowires 1702 toward destination surface 210.

Figure 33:
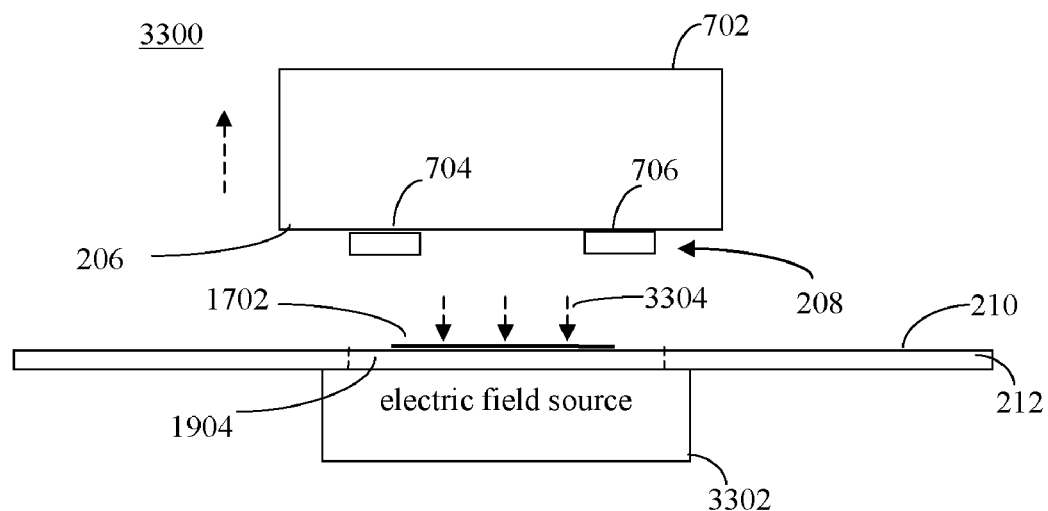

FIG. 33 shows an example transfer system 3300, according to another embodiment of the present invention. Transfer system 3300 is similar to transfer system 2800 of FIG. 28, with the addition of an electric field source 3302 that generates an electric field 3304 to attract nanowires 1702 to destination surface 210. For example, in an embodiment, electric field source 3302 may generate a DC electric field for electric field 3304. The DC electric field (e.g., a positive charge) exerts an attractive force on nanowires 1702 due to the opposite charge of nanowires 1702 (e.g., a negative charge), causing nanowires 1702 to move. Such movement of nanowires 1702 enables nanowires 1702 to be attracted to destination surface 210 by electric field 3304 and/or other force. In another embodiment, electric field source 3302 may generate an AC electric field for electric field 3304 which operates in an analogous fashion to move nanowires 1702, to enable nanowires 1702 to be attracted to destination surface 210. In still another embodiment, a combination of DC and AC electric fields may be used. In an embodiment, electric field source 3302 is a signal generator, voltage supply, or other component or device capable of generating an electric field.

It is noted that the above described embodiments for depositing nanowires on a destination surface according to step 308 of flowchart 300 (FIG. 3) may be combined in any manner, as would be understood by persons skilled in the relevant art(s) from the teachings herein.

According to step 310 of flowchart 300 (FIG. 3), the electrode pair is removed from alignment with the region of the surface. For example, as shown in FIG. 28, print head 702 may be moved in the upward direction (shown by dotted arrow) to be removed from alignment with region 1904. For example, alignment mechanism 1902 (shown in FIG. 19) may be used to move print head 702 from alignment with region 1904. In an embodiment, a fluid can be supplied (e.g., through ports 2604 of FIG. 26 and/or ports 3206 of FIG. 32) between transfer surface 206 and destination surface 210 to provide pressure to move the surfaces apart (e.g., gas or liquid pressure). In this manner, flowchart 300 of FIG. 3 may be repeated by print head 702, to associate and deposit further nanowires on region 1904, on other region(s) of substrate 212, and/or on alternative surfaces.

Figure 34:
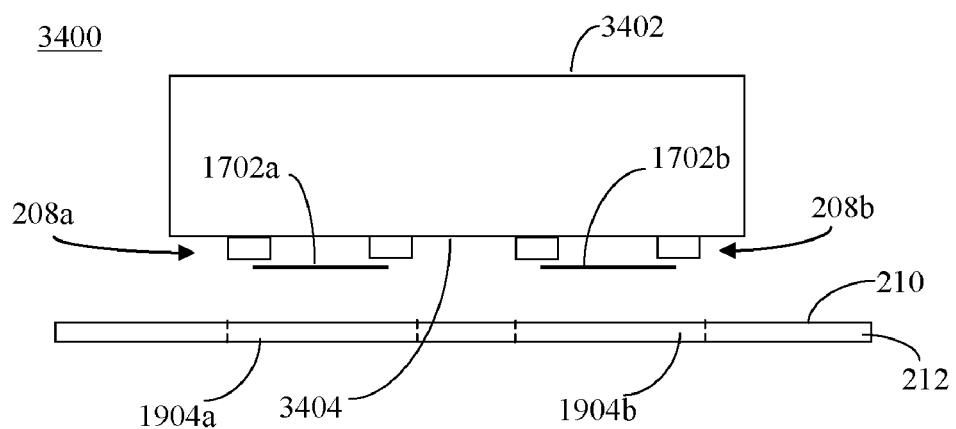
FIG. 34 shows a nanowire transfer system that includes a print head having two electrode pairs, according to an embodiment of the present invention.

Furthermore, flowchart 300 is adaptable to using multiple electrode pairs on a single transfer surface to deposit groups of nanowires on substrates in parallel. For example, FIG. 34 shows a nanowire transfer system 3400 that includes a print head 3402 having two electrode pairs, according to an embodiment of the present invention. As shown in FIG. 34, print head 3402 has a transfer surface 3404 having a first electrode pair 208a and a second electrode pair 208b. First electrode pair 208a is shown having associated nanowires 1702a, and second electrode pair 208b is shown having associated nanowires 1702b. Nanowires 1702a are designated for deposit on first region 1904a of destination surface 210, and nanowires 1702b are designated for deposit on second region 1904b of destination surface 210.

Thus, in an embodiment, each step of flowchart 300 shown in FIG. 3 may be performed for both of first and second electrode pairs 208a and 208b in parallel. In step 302, in parallel with providing nanowires 1702a proximate to first electrode pair 208a, nanowires 1702b can be provided proximate to second electrode pair 208b. In step 304, in parallel with generating a first electric field (e.g., electric field 1402 in FIG. 14) using first electrode pair 208a, a second electric field can be generated using second electrode pair 208b to associate nanowires 1702b with second electrode pair 208b. In embodiments, a same electrical signal (e.g., electrical signal 1304) can be provided to both of first and second electrode pairs 208a and 208b, or different electrical signals can be generated and provided.

In step 306, in parallel with aligning first electrode pair 208a with first region 1904a, second electrode pair 208b can be aligned with second region 1904b. In step 308, in parallel with depositing nanowires 1702a from first electrode pair 208a to first region 1904a, nanowires 1702b can be deposited from second electrode pair 208b to second region 1904b. In step 310, first and second electrode pairs 208a and 208b can be removed from alignment with their respective regions in parallel, by withdrawing print head 3402 from destination surface 210.

Note that any number of electrode pairs may be formed on a transfer surface to be used to transfer any number of corresponding sets of nanowires in parallel, in a similar fashion to the configuration of FIG. 34. By increasing the size of transfer surface 206, to enable additional electrode pairs, increasing numbers of simultaneous nanowire transfers may be performed in parallel, increasing a rate of fabrication. The spacing of electrodes 704 and 706 of electrode pairs on print heads may be varied to associate and deposit different types of nanowires, including different lengths, dopings, shell materials, etc.

Example Embodiments for Transferring Electrical Devices

Embodiments are described in this section for applying electrical devices, such as integrated circuits, electrical components, semiconductor die, optical devices, etc., to surfaces in a similar manner as described above for nanowires. In embodiments, one or more electrical devices are provided proximate to an electrode pair on a transfer surface. The electrode pair is energized such that an electrical device becomes associated with the electrode pair. Subsequently, the electrical device is deposited from the electrode pair to a destination surface.

Figure 35:
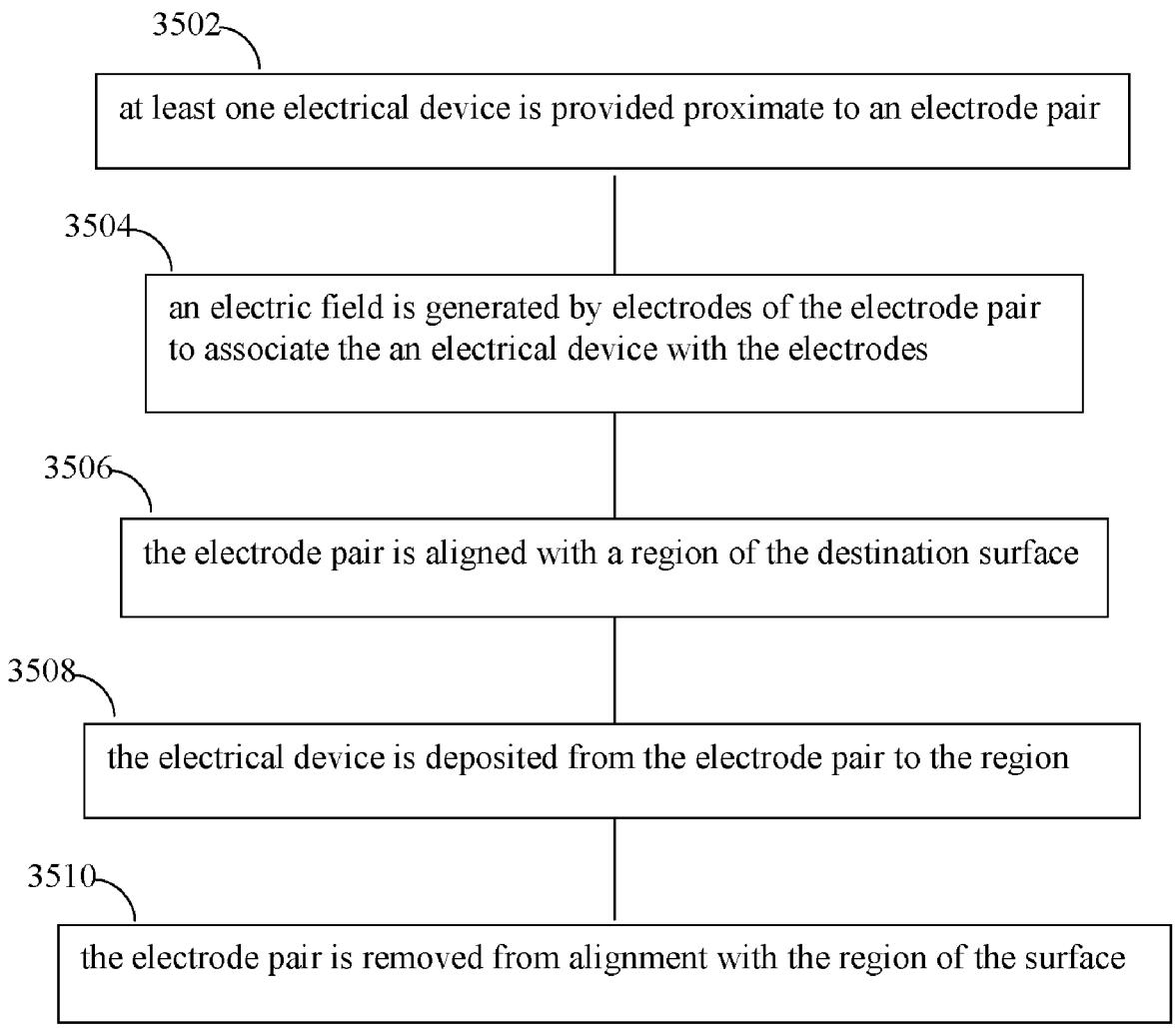
FIG. 35 shows a flowchart providing example steps for transferring electrical devices, according to example embodiments of the present invention.

FIG. 35 shows a flowchart 3500 providing example steps for transferring electrical devices, according to example embodiments of the present invention. For example, print head 702 of FIG. 7 can be used to transfer electrical devices according to flowchart 3500. For illustrative purposes, flowchart 3500 is described as follows with respect to FIGS. 36-39, which show block diagrams of an electrical device transfer system 3600, according to an embodiment of the present invention. Other structural and operational embodiments will be apparent to persons skilled in the relevant art(s) based on the following discussion. Not all steps of flowchart 3500 are necessarily performed in all embodiments.

Figure 36:
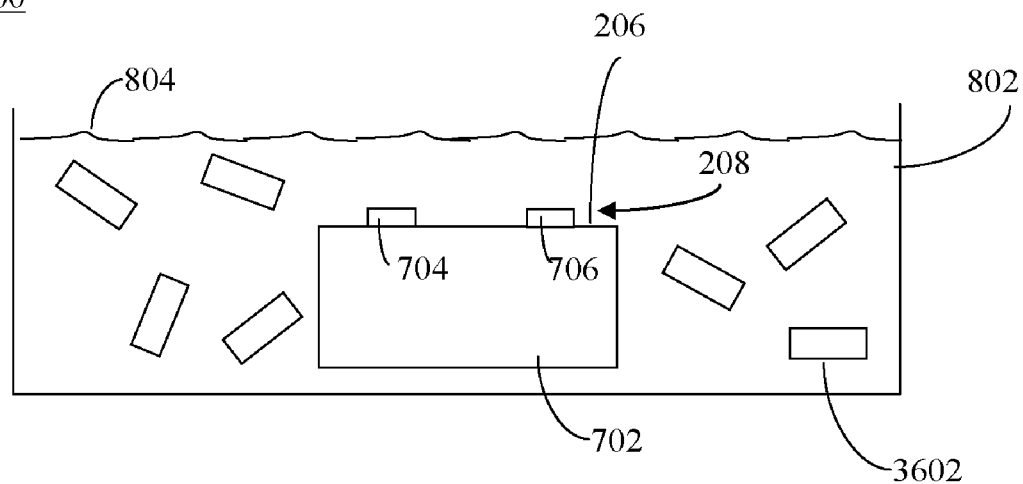
FIGS. 36-39 show block diagram views of an electrical device transfer system during different phases of operation, according to example embodiments of the present invention.

Flowchart 3500 begins with step 3502. In step 3502, at least one electrical device is provided proximate to an electrode pair. For example, as shown in FIG. 36, electrical devices 3602 are provided proximate to electrode pair 208. In FIG. 36, electrical devices 3602 are present in solution 804, which flows in contact with electrode pair 208, to enable electrical devices 3602 to be positioned proximate to electrode pair 208. Alternatively, electrical devices 3602 may be provided proximate to electrode pair 208 in other ways. In embodiments, electrical devices 3602 may all be the same type of electrical device, or may include different types.

Figure 37:
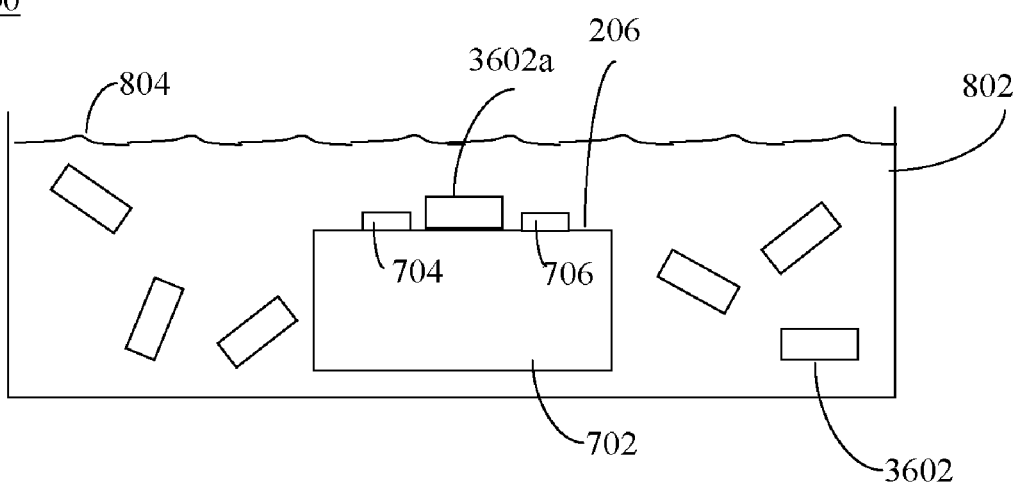

In step 3504, an electric field is generated by electrodes of the electrode pair to associate an electrical device with the electrodes. For instance, an electrical potential may be coupled to electrode pair 208 to generate the electric field. The electric field generated by electrode pair 208 may be used to associate one of electrical devices 3602 with electrode pair 208 that is proximately located to electrode pair 208. As shown in FIG. 37, electrical device 3602a is associated with electrode pair 208. In an embodiment, associated electrical device 3602a is held suspended at a distance from transfer surface 206 by the electric field.

The example embodiments described above for generating an electric field by an electrode pair to associate nanostructures are adaptable to associating electrical devices. For example, as described with respect to FIG. 14, an electric field 1402 is generated between electrodes 704 and 706 of electrode pair 208. Electric field 1402 can be used to align electrical device electrical device 3602a, and to position electrical device 3602a between electrodes 704 and 706. When electrical device 3602a encounters an AC electric field generated between electrodes 704 and 706, a field gradient results. A net dipole moment is produced in proximate electrical devices 3602, and the AC field exerts a torque on the dipole, such that proximate electrical device 3602a aligns parallel to the direction of the electric field.

Furthermore, in an embodiment, the field gradient exerts a dielectrophoretic force on proximate electrical device 3602a, attracting it toward electrode pair 208, as described above for nanowires with respect to FIG. 16. An electro-osmotic force may also be generated, as described above, that opposes the dielectrophoretic force attracting electrical device 3602a to the electrodes. As these forces reach an equilibrium (or relative equilibrium), electrical device 3602a is held in place such that it becomes associated, or "pinned," with electrode pair 208.

As mentioned above, electrical devices 3602 in FIG. 36 may all be the same type of electrical device or may include different electrical device types. When different electrical device types are present, electrodes 704 and 706 may be sized and/or positioned to generate the electric field in a manner to only attract a designated type of electrical device. In an embodiment, electrical device 3602a may have a metal (or other material) patterned thereon to enhance the attraction of electrical device 3602a to electrodes 208.

Figure 38:
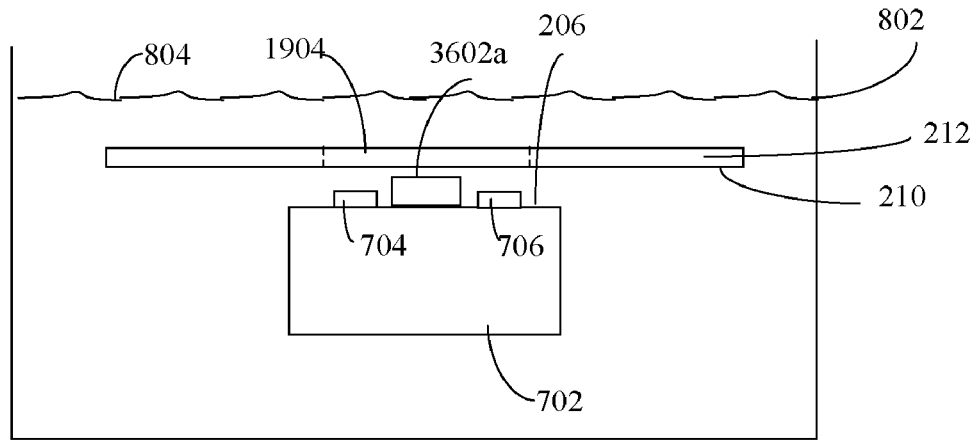

In step 3506, the electrode pair is aligned with a region of the destination surface. For example, as shown in FIG. 38, electrode pair 208 is aligned with destination surface 210, by print head 702, which is moved towards destination surface 210. In an embodiment, electrode pair 208 is aligned in contact with destination surface 210. In another embodiment, electrode pair 208 is aligned adjacent to destination surface 210, a short distance away from destination surface 210. Electrode pair 208 may be aligned with any region of surface 210, including a generally open region (i.e., no contacts on surface 210 are required), a region having electrical contacts corresponding to electrode pair 208, or other region. Electrode pair 208 is aligned with a region of surface 210 on which electrical device 3602a is to be positioned.

In step 3508, the electrical device is deposited from the electrode pair to the region. Electrical device 3602a may be deposited on destination surface 210 in a variety of ways. Various example embodiments for depositing nanostructures on a surface are described in detail above. For example, the embodiments described above with respect to FIGS. 28-33 for depositing nanostructures may be used to deposit electrical device 3602a. For example, in FIG. 28, a force 2802 is present (which may include one or more forces) that attracted nanowires 1702 from print head 702 to destination surface 210 and/or repelled nanowires 1702 from print head 702. Force 2802 may also be used to deposit electrical device 3602a to destination surface 210 from print head 702. Example forces that may be present in force 2802 include an electric field (AC and/or DC), a vacuum force, an electrostatic force, gravity, ultrasonic excitation, and/or other forces. These and other passive and active forces may be used to attract/repel electrical device 3602a, as would be known to persons skilled in the relevant art(s). Furthermore, ultrasonic vibration may be used, as described above with respect to FIGS. 31A-31C, to aid in freeing electrical device 3602a from print head 702, to transfer to destination surface 210 (e.g., via a force such as gravity, an electrostatic force, etc.).

Figure 39:
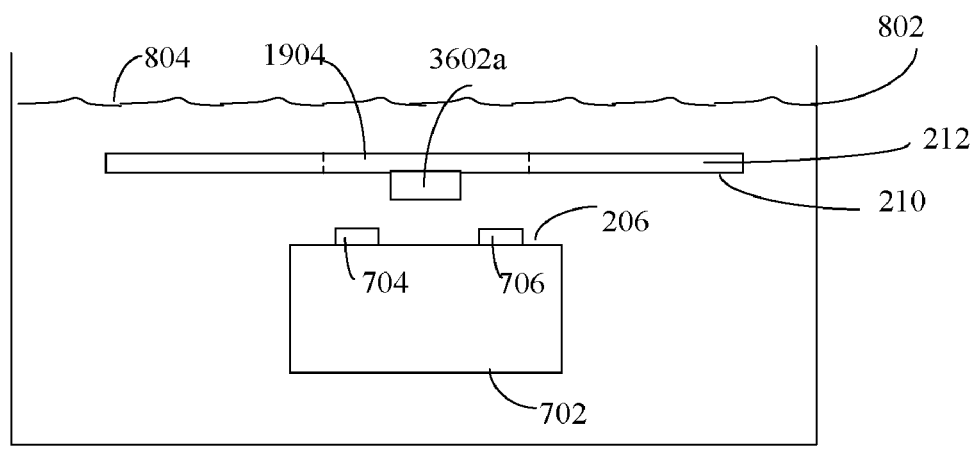

In step 3510, the electrode pair is removed from alignment with the region of the surface. For example, as shown in FIG. 39, print head 702 is moved away from destination surface 210. Electrical device 3602a remains deposited on surface 210. Print head 702 can subsequently be used to repeat performing flowchart 3500 for the same region of surface 210, a different region of surface 210, and/or a surface of a structure other than substrate 212, to deposit further electrical devices. Furthermore, in an embodiment, print head 702 may be used to simultaneously transfer nanostructures and electrical devices.

Using the techniques described herein, complex electrical circuits can be formed, by using print heads to transfer nanostructures and electrical devices to substrates.

Further Print Head Embodiments

Further embodiments are described in this section for applying nanostructures to surfaces using print heads. Print heads used to "print" nanowires onto a substrate in the presence of a fluid, as described above, may cause a shear force that is orthogonal to the motion of the print head as the print head approaches the substrate. As a result, the fluid is forced out of the region between the print head and the substrate due. This fluid shear can displace the nanowires laterally, causing the nanowires to be misplaced in the printing process.

Figure 40:
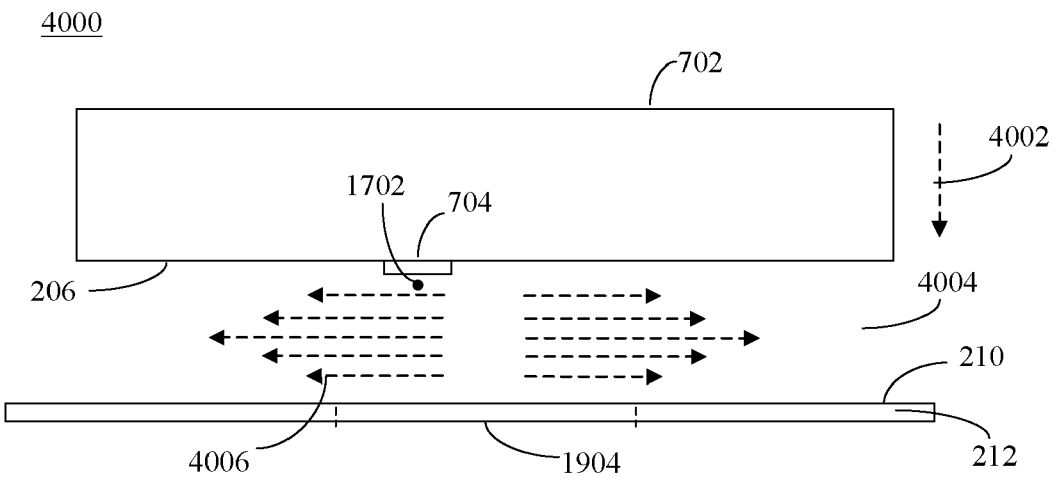
FIG. 40 shows a cross-sectional view of a nanostructure transfer system, according to an example embodiment of the present invention.
Figure 41:
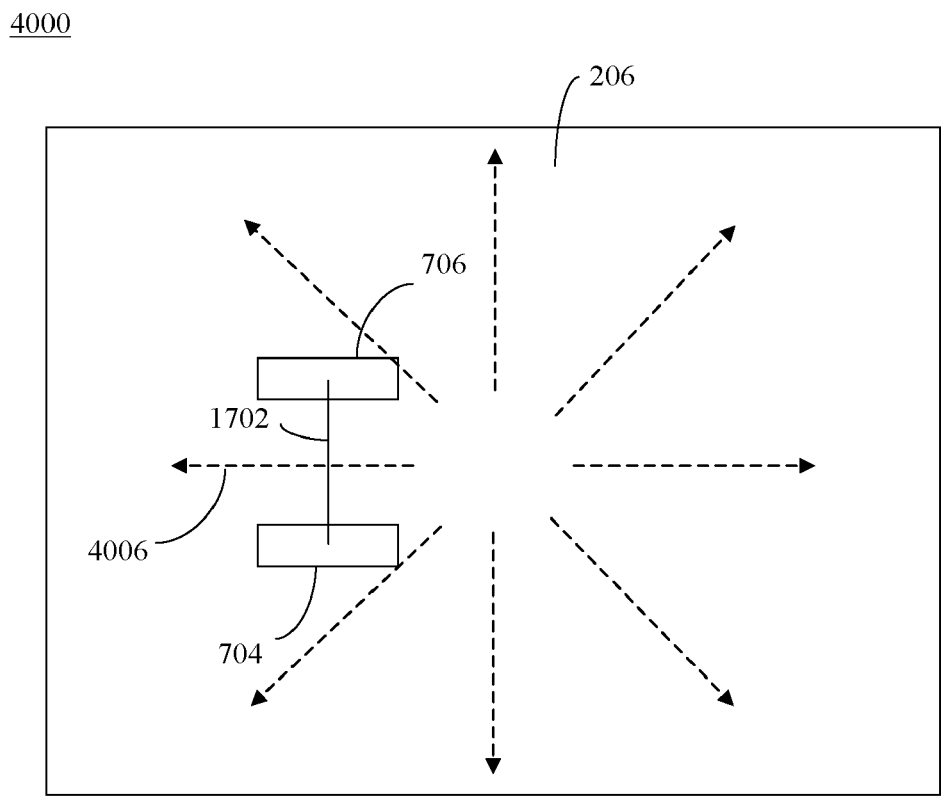
FIG. 41 shows a view of a transfer surface of the print head shown in FIG. 40, according to an example embodiment of the present invention.

For example, FIG. 40 shows a cross-sectional view of a nanostructure transfer system 4000, according to an embodiment of the present invention. As shown in FIG. 40, system 4000 includes print head 702 and substrate 212. FIG. 41 shows a view of transfer surface 206 of print head 702. Print head 702 is configured to transfer nanostructures, such as a nanowire 1702 (shown end-on in FIG. 40), from electrodes 704 and 706 to destination surface 210 in a liquid solution 4004.

During the transfer process, print head 702 is moved towards substrate 212 in the direction of arrow 4002, reducing a distance between transfer surface 206 and destination surface 210. Arrows 4006 indicate directions of flow of solution 4004 as print head 4002 is moved towards substrate 212, as solution 4004 is forced out of the region between transfer surface 206 and destination surface 210. Referring to FIG. 40, the relative lengths of arrows 4006 indicate a relative flow velocity at the locations of arrows 4006. For instance, a flow velocity is lower for solution 4004 close to one of transfer surface 206 and destination surface 210 relative to solution 4004 midway between transfer surface 206 and destination surface 210. Referring to FIG. 41, arrows 4006 indicate that solution 4004 is forced outwardly in all directions from a central region of transfer surface 2006.

As indicted in FIG. 41, solution 4004 is forced to flow across nanowire 1702 when print head 702 is moved towards substrate 212. This fluid exerts a shear force on nanowire 1702, which may undesirably displace nanowire 1702 laterally, causing nanowire 1702 to be misplaced in the printing process.

Figure 42:
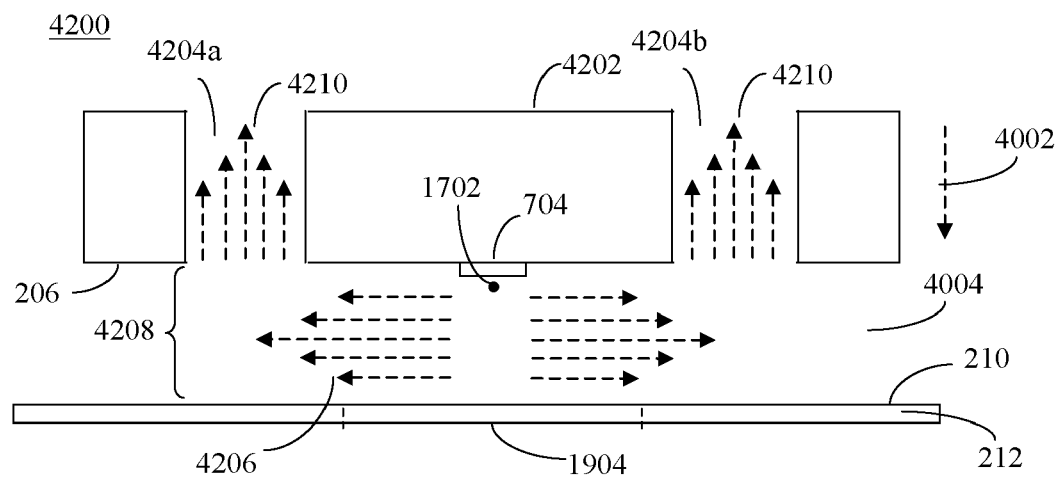
FIG. 42 shows a cross-sectional view of a nanostructure transfer system, according to an example embodiment of the present invention.
Figure 43:
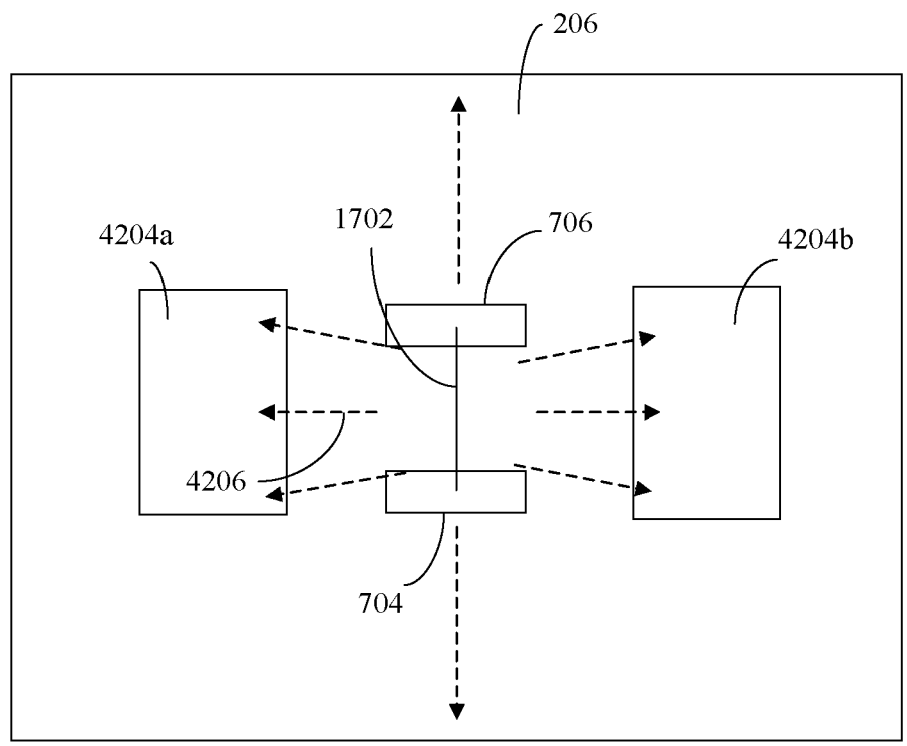
FIG. 43 show a view of a transfer surface of the print head shown in FIG. 42, according to an example embodiment of the present invention.

In embodiments, drain holes are formed in a print head to remove fluid from the region between the print head and the destination surface as the print head approaches the destination surface. The drain holes reduce a shear force on the nanowires, to enable the nanowires to be more reliably transferred from the print head to the destination surface. For example FIG. 42 shows a nanostructure transfer system 4200, according to an example embodiment of the present invention. As shown in FIG. 42, system 4200 includes a print head 4202 and substrate 212. FIG. 43 shows a view of transfer surface 206 of print head 4202. As shown in FIGS. 42 and 43, transfer surface 206 includes first and second openings 4204a and 4204b (also referred to as "drain holes"). First and second openings 4204a and 4204b receive solution 4004 from the region between transfer surface 206 and destination surface 210 when print head 4202 is moved toward substrate 210. Removal of solution 4004 due to first and second openings 4204a and 4204b reduces a shear force on nanowire 1702 while being deposited from transfer surface 206 to destination surface 210.

Figure 44:
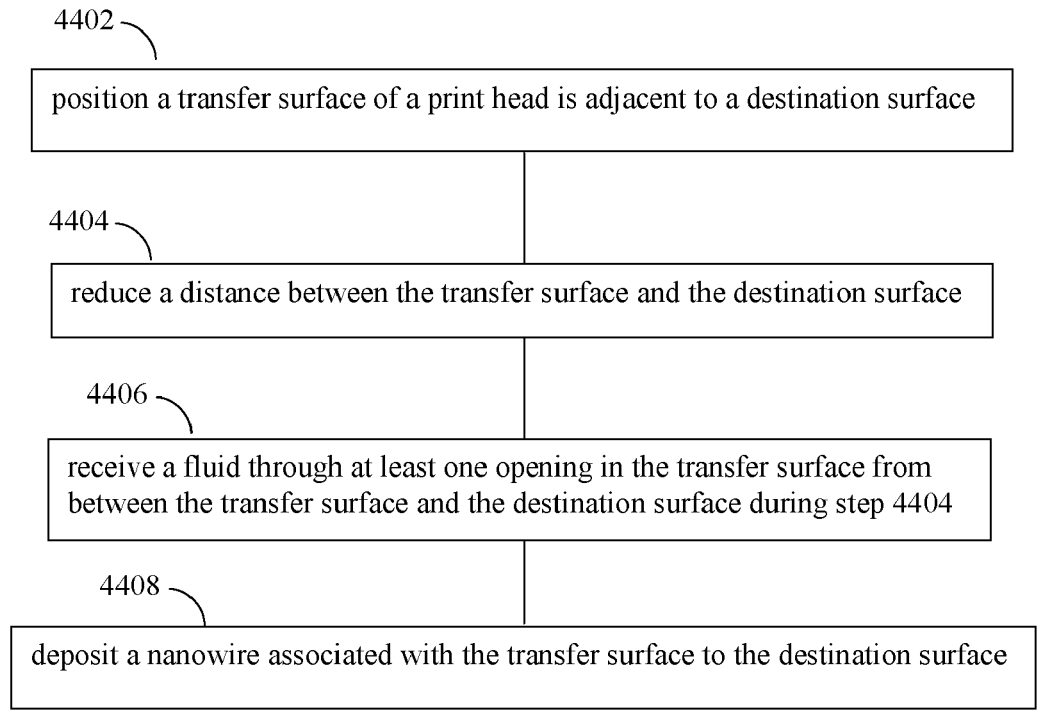
FIG. 44 shows a flowchart for transferring nanostructures to a destination surface, according to an example embodiment of the present invention.

FIG. 44 shows a flowchart 4400 for transferring nanostructures to a destination surface, according to an example embodiment of the present invention. System 4200 may perform flowchart 4400, for example. Flowchart 4400 is described as follows. Other structural and operational embodiments will be apparent to persons skilled in the relevant art(s) based on the following discussion.

In step 4402, a transfer surface of a print head is positioned adjacent to a destination surface. For instance, as shown in FIG. 42, transfer surface 206 of print head 4202 is positioned adjacent to destination surface 210 of substrate 212.

In step 4404, a distance between the transfer surface and the destination surface is reduced. Referring to FIG. 42, print head 4202 is moved in the direction of arrow 4002 to reduce a distance 4208 between transfer surface 206 and destination surface 210.

In step 4406, a fluid is received through at least one opening in the transfer surface from between the transfer surface and the destination surface during step 4404. As indicated by arrows 4206 in FIGS. 42 and 43, solution 4004 between transfer surface 206 and destination surface 210 flows outward from a central region of transfer surface 2006 due to transfer surface 206 moving toward destination surface 210. Furthermore, as indicated by arrows 4210 shown in FIG. 42, solution 4004 flows into openings 4204a and 4204b in transfer surface 206. Openings 4204a and 4204b relieve at least a portion of the shear force received by nanowire 1702 by receiving solution 4004.

Figure 45:
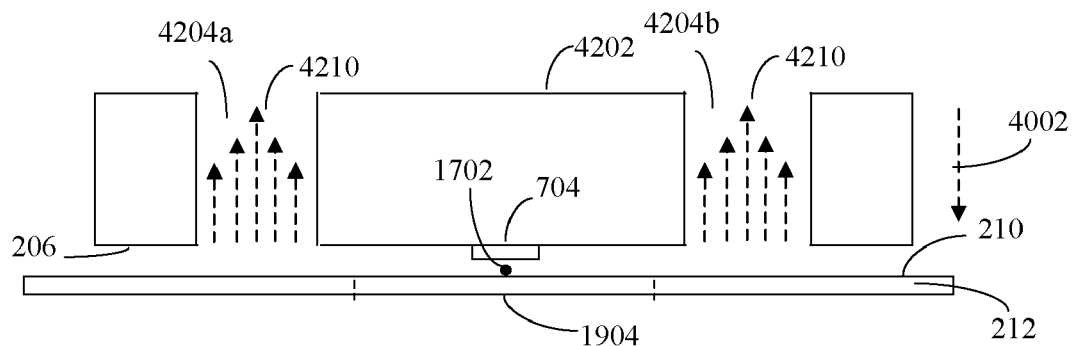
FIG. 45 shows a cross-sectional view of the nanostructure transfer system of FIG. 42, illustrating a nanowire being deposited to the destination surface, according to an example embodiment of the present invention.

In step 4408, a nanowire associated with the transfer surface is deposited to the destination surface. For instance, FIG. 45 shows a view of system 4200 of FIG. 42, where transfer surface 206 is proximate to destination surface 210, such that nanowire 1702 may be deposited to destination surface 210. Nanowire 1702 may be deposited from transfer surface 206 to destination surface 210 in any manner described elsewhere herein, including as described above with respect to flowchart 300 shown in FIG. 3. Subsequent to the deposition of nanowire 1702, print head 4202 and substrate 212 may be moved apart.

Although two openings 4204 (openings 4204a and 4204b) are shown in FIGS. 42 and 43, any number of openings 4204 may be present in transfer surface 206. For example, instead of a pair of openings 4204 (as shown in FIGS. 42 and 43), an array of openings 4204 of any number may be present at the locations of openings 4204a and 4204b. Such openings may have any shape, including being round, rectangular, or any other shape.

Furthermore, openings 4204 may have any distribution/geometry relative to electrodes 704 and 706 to further reduce the shear force. For example, as shown in FIG. 43, openings 4204a and 4204b may be located relative to electrodes 704 and 706 so that nanowire 1702 is located midway between openings 4204a and 4204b. In this manner, a "dead zone" for flow of solution 4004 at the location of nanowire 1702 is created (e.g., a flow stream is parted at nanowire 1702), so that the shear force experienced by nanowire 1702 may be brought close to none. In the embodiment of FIG. 43, openings 4204 can be holes and/or slots that are positioned symmetrically along either side of the long axis of nanowire 1702.

Furthermore, as shown in FIG. 43, openings 4202 may have lengths that are longer than a long axis length of nanowire 1702. Alternatively, openings 4202 may have a length that is the same or less than a long axis length of nanowire 1702. A width of openings 4204a and 4204b may be selected so that a substantial amount of solution 4004 between openings 4204a and 4204b on either side of nanowire 1702 may exit through openings 4204a and 4204b.

Although openings 4204 are shown in FIG. 42 as being located along the length of nanowire 1702, alternatively or additionally, openings 4204 may be located on transfer surface 206 adjacent to one or both ends of nanowire 1702. Furthermore, although openings 4204a and 4204b are shown in FIG. 42 as penetrating all the way through print head 4202, alternatively, openings 4204 may penetrate partially through print head 4204 (e.g., may be recessed areas in transfer surface 206, of any suitable depth).

Figure 46:
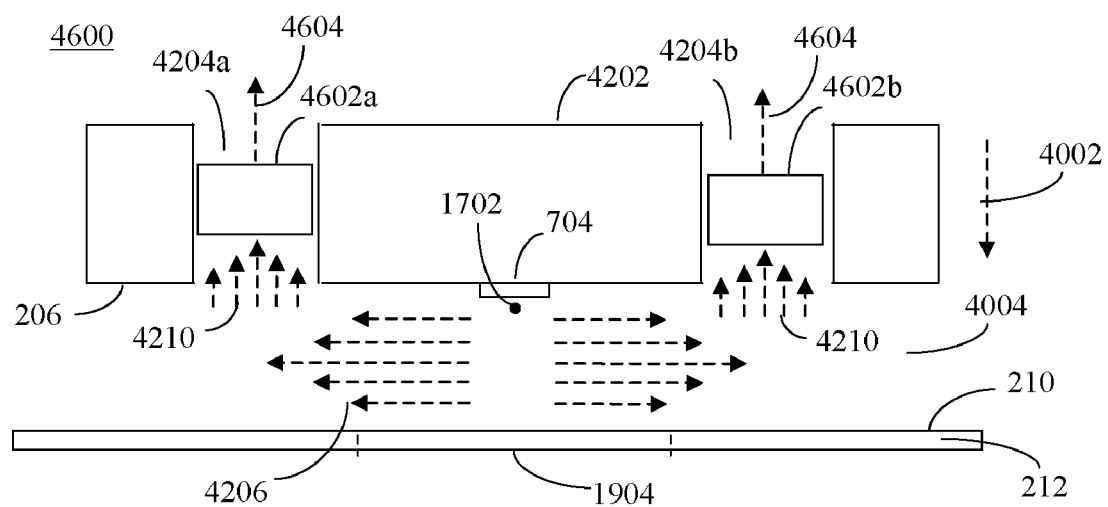
FIG. 46 shows a nanostructure transfer system, according to an embodiment of the present invention.

In the example of FIGS. 42 and 43, solution 4004 is enabled to passively flow into openings 4204. In another embodiment, solution 4004 may be actively drawn into openings 4204. For instance, a piston/cylinder arrangement, a corkscrew, vacuum suction, and/or further mechanisms may be used to actively draw solution 4004 into openings 4204. For example, FIG. 46 shows a nanostructure transfer system 4600, according to an embodiment of the present invention. System 4600 is generally similar to system 4200 shown in FIG. 42, with the addition of first and second pistons 4602a and 4602b. Pistons 4602a and 4602b are located in openings 4204a and 4204b, respectively. First piston 4602a and opening 4204a form a first piston/cylinder arrangement, and second piston 4602b and opening 4204b form a second piston/cylinder arrangement. First and second pistons 4602a and 4602b may be configured to move in the directions of arrows 4604 during step 4404 of flowchart 4400, to enable solution 4004 to be drawn into openings 4204a and 4204b according to step 4406 of flowchart 4400.

Example Electrode Embodiments

Nanostructures and/or contaminants may become attached to transfer surfaces of print heads, causing degradation in performance. In embodiments, the transfer surface of nanostructure print heads may be treated to prevent contaminants from sticking, and/to increase a durability of the transfer surface. Such embodiments may be particularly useful to extend a lifetime of a print head/transfer surface when print heads/transfer surfaces are expensive to replace. For example, a coating may be applied to the transfer surface, such as a coating of a non-stick material. In an embodiment, the coating may be removable. In this manner, the coating may be removed and reapplied as needed when a coating wears out, rather than having to dispose of the print head completely.

Figure 47:
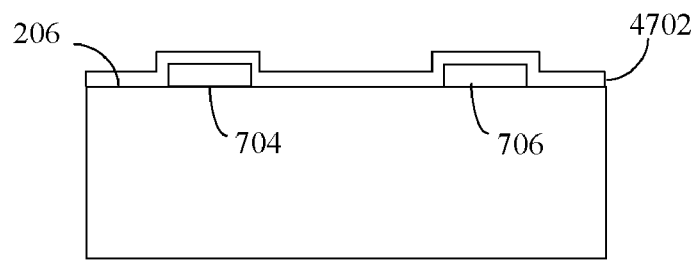
FIG. 47 shows a cross-sectional view of a print head, according to an example embodiment of the present invention.

For instance, FIG. 47 shows a cross-sectional view of a print head 4700, according to an example embodiment of the present invention. As shown in FIG. 47, a non-stick material layer 4702 is formed on transfer surface 206 of print head 4700. Non-stick material layer 4702 is a coating of a non-stick material that is configured to reduce nanowire and contaminate adhesion. In addition, non-stick material layer 4702 may be removed (e.g., stripped) from transfer surface 206, and reapplied to transfer surface 206, to provide a longer lifespan to print head 4700.

Example advantages of non-stick material layer 4702 on transfer surface 206 include preventing nanowire adhesion and sticking, enabling the use of a higher nanowire capture voltage (e.g., during step 304 of flowchart 300 in FIG. 3) so that nanowires are not lost due to shear forces during the nanowire transfer process (e.g., as described above with respect to FIGS. 41 and 42), enhancing nanowire transfer efficiency, and/or reducing contamination and corrosion of print head 4700 to increase a lifetime of print head 4700.

Non-stick material layer 4702 may be formed on transfer surface 206 in any manner, including by coating transfer surface 206 from a solution (i.e., spin coating or dip coating) or by a vapor phase deposition process. Non-stick material layer 4702 may be configured to have weak adhesion properties, such as adhesion properties characterized through van der Waals forces. Transfer surface 206 may be treated with adhesion promoters to prevent non-stick material layer 4702 from delaminating from transfer surface 206. Example materials for non-stick material layer 4702 include materials that have very low van der Waals force attraction with inorganic materials (contamination and nanowires), such as organic molecules or fluorinated organics (e.g., Teflon). A fluorinated organic material, such as Teflon, can have van der Waals forces 3 orders of magnitude lower than a typical oxide surface, thus making the strength of adhesion of contaminants to transfer surface 206 relatively weak. A thickness and/or chemistry of non-stick material layer 4702 may be selected as desired for the particular application.

In addition, as described above, non-stick material layer 4702 may be removable. For instance, if nanowires and/or other contamination does adhere to transfer surface 206 after one or more uses, non-stick material layer 4702 may be removed using solvents, plasma, thermal decomposition, or other removal material or technique. After removal of non-stick material layer 4702, a fresh replacement coating of non-stick material layer 4702 may be formed on transfer surface 206. This replacement process is simpler and less expensive than manufacturing a replacement print head 4700, which may be relatively expensive.

For instance, another type of non-stick material that may be applied to transfer surface 206, is a film of a material such as $SiO_2$ or $Si_3N_4$. Such a film may be deposited on transfer surface 206 according to a plasma enhanced chemical vapor deposition (PECVD) process or other process. Such a film may prevent nanowires from sticking to transfer surface 206 by static charge. Furthermore, such a film may be removed after use, and reapplied to transfer surface 206, as needed, which may enable a lifespan of transfer surface 206 to be increased.

Example Nanostructure Printing Processes and Systems

Example embodiments are described in this section for nanostructure printing processes and systems. Embodiments are described for fabricating devices that incorporate nanostructures. These embodiments are provided for illustrative purposes, and are not intended to be limiting.

Figure 48:
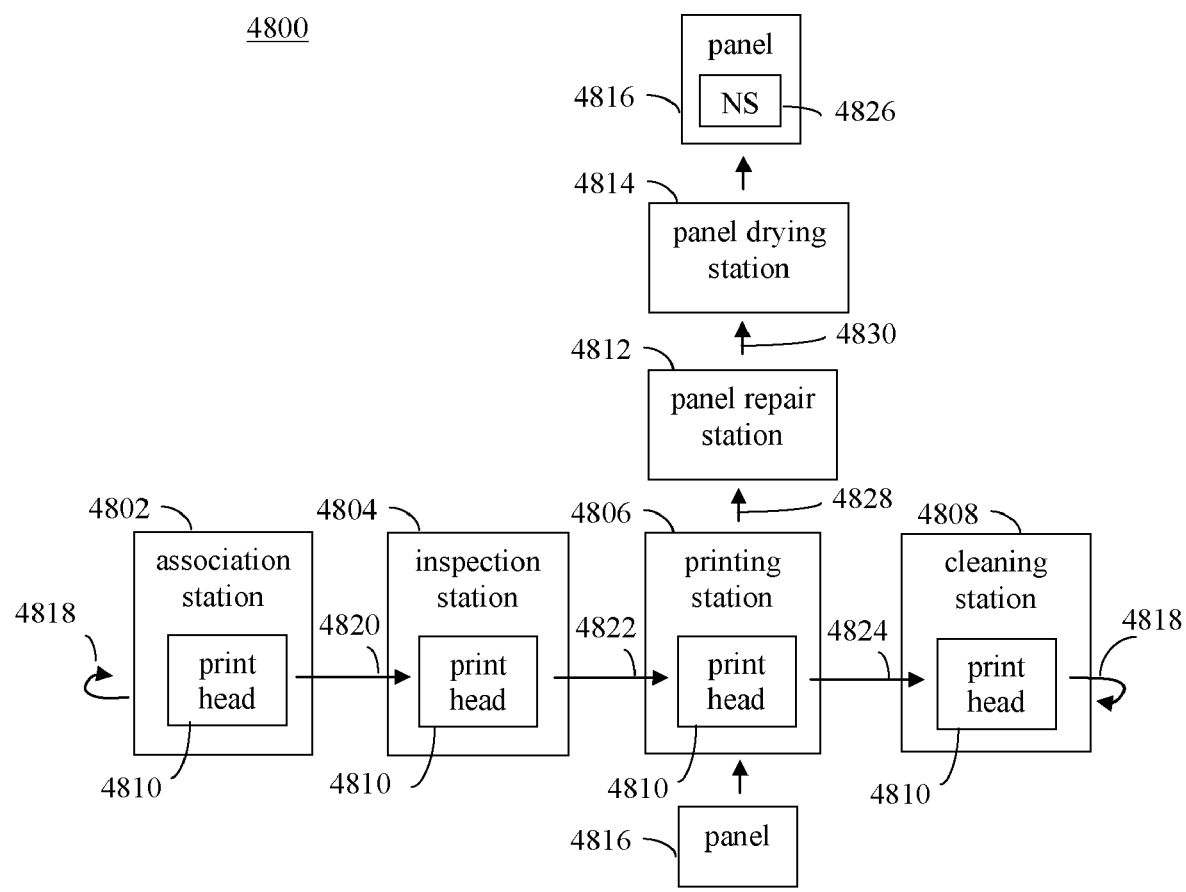
FIG. 48 shows a block diagram of a nanostructure printing system, according to an example embodiment of the present invention.

For example, FIG. 48 shows a block diagram of a nanostructure printing system 4800, according to an example embodiment of the present invention. As shown in FIG. 48, system 4800 includes an association station 4802, an inspection station 4804, a printing station 4806, a cleaning station 4808, a panel repair station 4812, and a panel drying station 4814. Association station 4802, inspection station 4804, printing station 4806, and cleaning station 4808 form a print head pipeline portion of system 4800, and printing station 4806, panel repair station 4812, and panel drying station 4814 form a panel pipeline portion of system 4800.

Figure 49:
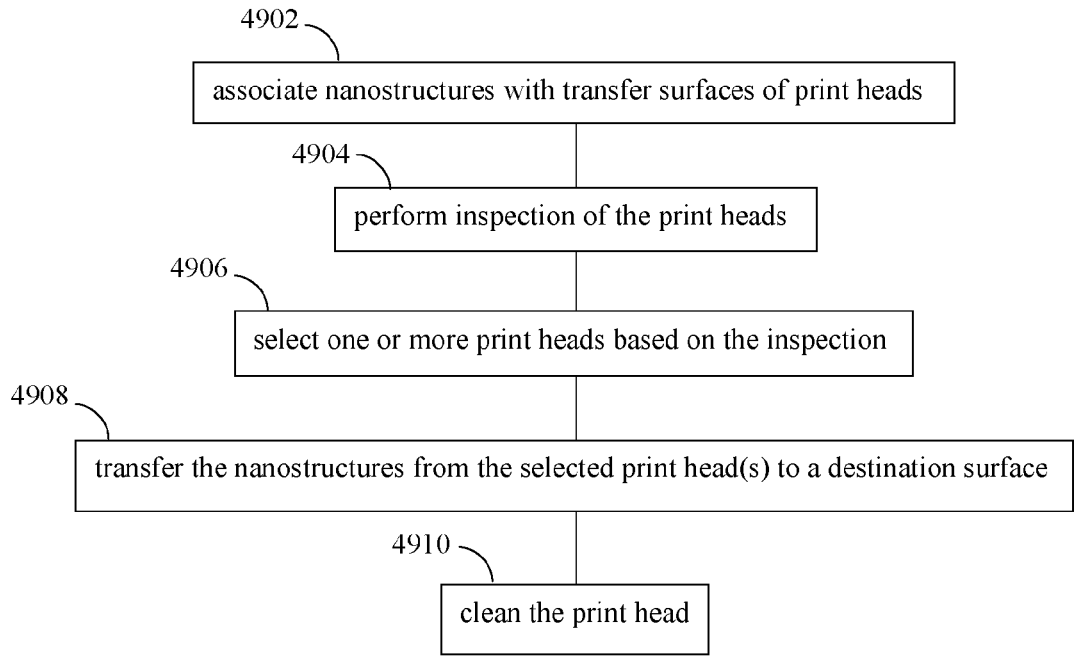
FIG. 49 shows a flowchart for a print head pipeline portion of the system of FIG. 48, according to an example embodiment of the present invention.
Figure 50:
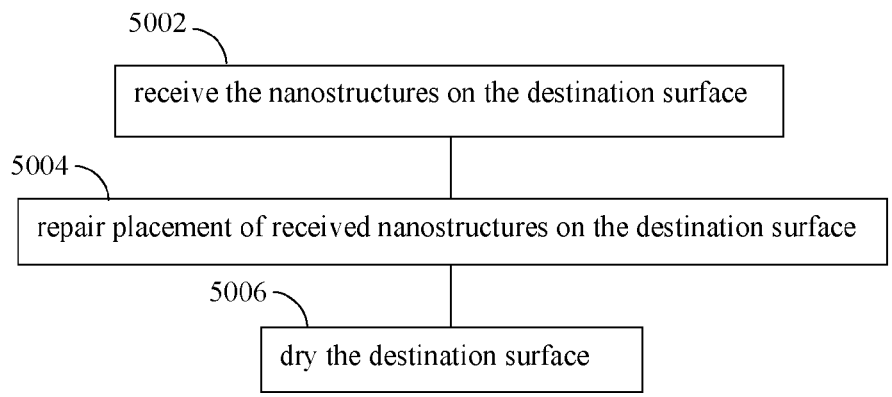
FIG. 50 shows a flowchart for a panel pipeline portion of the system of FIG. 48, according to an example embodiment of the present invention.

System 4800 is described with respect to flowcharts 4900 and 5000 shown in FIGS. 49 and 50, respectively. Flowchart 4900 shows a process for the print head pipeline portion of system 4800, and flowchart 5000 shows a process for the panel pipeline of system 4800, according to example embodiments of the present invention. For illustrative purposes, flowcharts 4900 and 5000 are described as follows with respect to system 4800. Other structural and operational embodiments will be apparent to persons skilled in the relevant art(s) based on the following discussion. Not all elements of system 4800 shown in FIG. 48 need be present in all embodiments, and not all steps of flowcharts 4900 and 5000 are necessarily performed in all embodiments.

Flowchart 4900 is first described. In step 4902 of flowchart 4900, nanostructures are associated with transfer surfaces of print heads. For example, as shown in FIG. 48, association station 4802 receives a plurality of print heads 4818, including a print head 4810. Association station 4802 is configured to associate nanostructures with a transfer surface of each print head of the received plurality of print heads 4818. The association of nanostructures with print heads 4818 may be performed in any manner described elsewhere herein, such as described above with respect to flowchart 300 in FIG. 3, or in other ways known to persons skilled in the relevant art(s). As shown in FIG. 48, association station 4802 outputs a plurality of print heads and associated nanostructures 4820.

Figure 51:
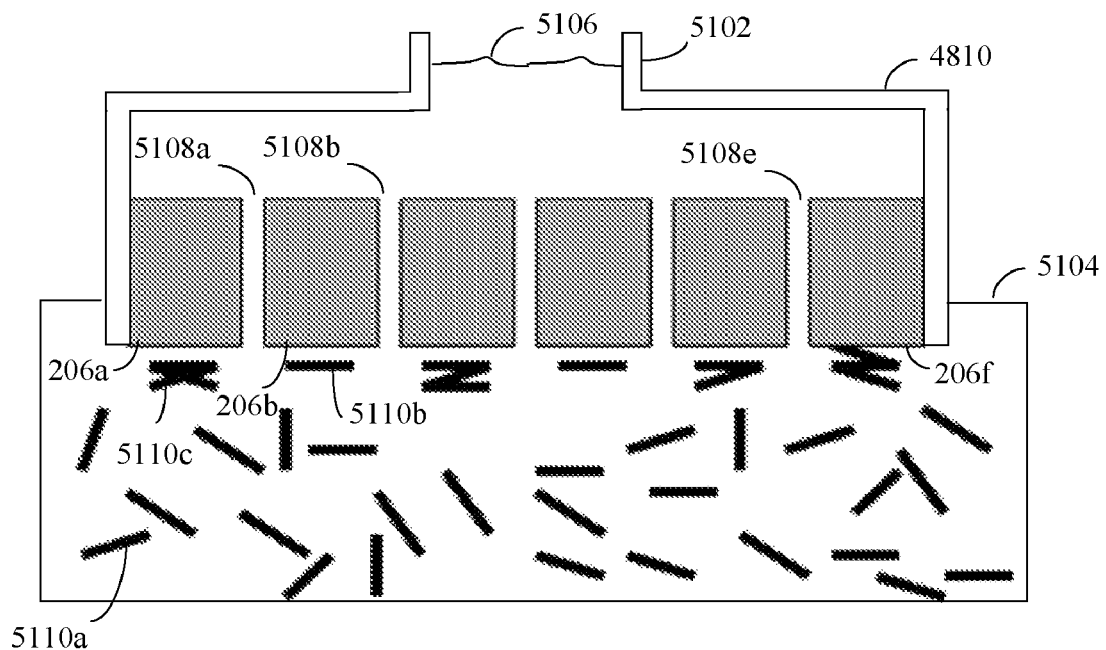
FIGS. 51 and 52 show views of an example association station, according to embodiments of the present invention.

For example, FIG. 51 illustrates nanostructures being associated with transfer surfaces of print head 4810 in solution (e.g., in a liquid environment) at association station 4802. In an embodiment, print head 4810 is one of a plurality of print heads received at association station 4802. In another embodiment, a single print head 4810 is received. In the example of FIG. 51, print head 4810 has six transfer surfaces 206a-206f. In other embodiments, print head 4810 may have other numbers of transfer surfaces 206, including a two-dimensional array of transfer surfaces 206. Transfer surfaces 206a-206f are submerged in a nanowire solution 5106 (e.g., a nanowire ink) contained by a reservoir 5104. As shown in FIG. 51, print head 4810 has five through-holes or openings 5108a-5108e, with each opening 5108 being positioned between a corresponding adjacent pair of transfer surfaces 206. Openings 5108 may be configured similarly to openings 4204 described above with respect to FIG. 42. In embodiments, print head 4810 may include any number and configuration of openings 5108.

Although not shown in FIG. 51, in the current example, each transfer surface 206a-206f includes a respective pair of electrodes (e.g., electrode pair 208 of FIG. 2, which may include electrodes 704 and 706 shown in FIG. 7). The electrodes generate an electric field (e.g., electric field 1402 shown in FIG. 14) to associate one or more nanowires 5110 in nanowire solution 5106 with the respective transfer surface 206. For example, FIG. 51 shows a first nanowire 5110a in solution 5106 that is not associated with any of transfer surfaces 206a-206b. A second nanowire 5110b is shown associated with second transfer surface 206b. A third nanowire 5110c is nearby but not associated with first transfer surface 206a.

Figure 52:
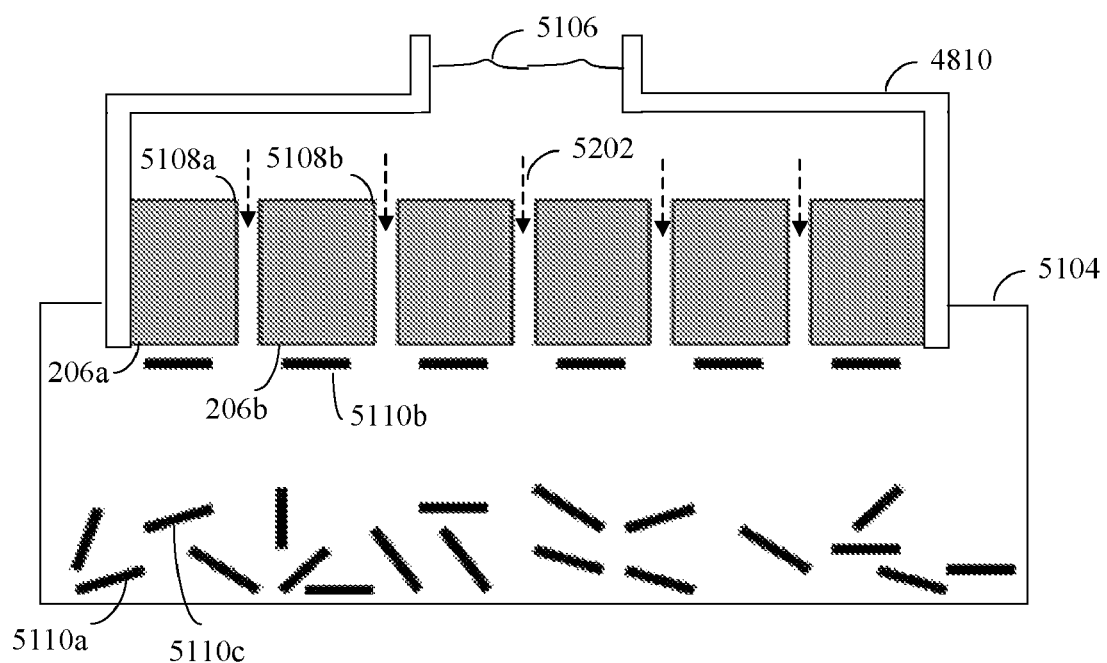

During or after step 4902, print head 4810 of FIG. 48 may optionally be configured to flush excess nanostructures from transfer surfaces 206 of plurality of print heads 4818 at association station 4802. For example, FIG. 52 shows excess nanowires being flushed from transfer surfaces 206a-206f of print head 4810. In the example of FIG. 51, a fluid (e.g., solution 5106) is shown being flowed through openings 5108a-5108e (as indicated by arrows 5202) to flush excess nanowires 5110 from transfer surface 206a-206f. A fluid source (not shown in FIG. 52) configured to produce a suitable fluid pressure may be coupled to an inlet 5102 of print head 4810, or may be otherwise coupled to print head 4810, to provide the fluid to flow through openings 5108a-5108e. A fluid velocity and flush time provided by the fluid source may be determined for a particular application. For example, fluid velocities in the range of 1-100 μm/s may be used, during a flush time of 60 minutes or less (e.g., 1 minute or less), in embodiments.

Excess nanowires 5110, such as nanowire 5110c, which may be desired to be flushed from transfer surfaces 206, are nanowires that may be weakly associated with a transfer surface 206, that may have become entangled with other nanowires 5110 that are associated, and/or that may have become otherwise attached to (but not associated with) a surface of print head 4810. For example, nanowire 5110c is shown in FIG. 52 as having been flushed from transfer surface 206a.

Referring back to flowchart 4900, in step 4904, an inspection of the print heads is performed. For example, as shown in FIG. 48, inspection station 4804 receives plurality of print heads and associated nanostructures 4820. Inspection station 4804 is configured to perform an inspection of transfer surfaces 206 of the received plurality of print heads, and to select at least one print head of received plurality of print heads based on the inspection. As shown in FIG. 48, inspection station 4804 outputs at least one selected print head and associated nanostructures 4822.

Figure 53:
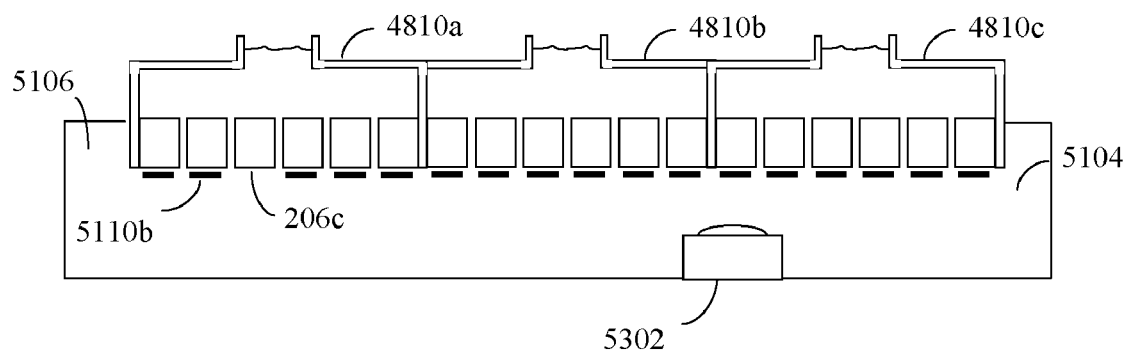
FIG. 53 shows an example inspection station, according to an embodiment of the present invention.

For instance, FIG. 53 shows an example of inspection station 4804, according to an embodiment of the present invention. As shown in FIG. 53, inspection station 4804 has received a plurality of print heads 4810a-4810c. Each of print heads 4810a-4810c has a respective plurality of transfer surfaces 206a-206f. An inspection device 5302 is present that is configured to inspect arrangements of nanowires 5110 associated with transfer surfaces 206 of print heads 4810a-4810c. Inspection device 5302 may be an optical inspection device (e.g., a microscope, a camera, and/or other optical inspection device), an electrical inspection device, a mechanical inspection device, and/or further type of inspection device. Inspection device 5302 may be configured to determine whether a sufficient number of nanostructures is present at each transfer surface 206, to determine whether an unsuitable arrangement of nanostructures is present at a transfer surface 206 (e.g., determine whether sufficient contact between electrodes is made by the present nanostructures), and/or to otherwise determine the suitability and/or unsuitability of an arrangement of nanostructures at transfer surfaces 206 of print heads 4810a-4810c.

For example, in FIG. 53, inspection device 5302 may determine that an insufficient number of nanowires 5110 (e.g., no nanowires) is present at transfer surface 206c of print head 4810a, while all transfer surfaces of print heads 4810b and 4810c have sufficient numbers and arrangements of nanowires 5110. Because inspection device 5302 determined that transfer surface 206c of print head 4810 does not have a sufficient number of associated nanowires 5110, print head 4810a may be indicated as having failed inspection, while print heads 4810b and 4810c may be indicated as having passed inspection.

In step 4906, one or more print heads are selected based on the inspection. One or more print heads that passed inspection in step 4904 may be selected. In the current example, because inspection device 5302 determined that print heads 4810b and 4810c passed inspection, while print head 4810a failed inspection, print heads 4810b and 4810c may be selected for further processing in system 4800. Note that in an embodiment, an arrangement of nanowires 5110 at a print head 4810 that failed inspection may be repaired. For example, in the current example, after transfer surface 206c was determined (in step 4904) to be lacking a sufficient number of nanowires, one or more additional nanowires 5110 may be associated with transfer surface 206c. Subsequently, print head 4810a may be re-inspected (repeat step 4904). If print head 4810a passes the re-inspection, print head 4810a may be selected in step 4906. Example embodiments for repairing arrangements of nanostructures on surfaces (e.g., transfer surfaces, destination surfaces) are described in detail further below.

In step 4908, the nanostructures are transferred from the selected print head(s) to a destination surface. For example, as shown in FIG. 48, printing station 4806 receives at least one selected print head and associated nanostructures 4822. In the current example, at least one selected print head and associated nanostructures 4822 includes print heads 4810b and 4810c. Printing station 4806 also receives a panel 4816, which is an example of destination substrate 212 shown in FIG. 2. Printing station 4806 is configured to transfer the nanostructures from the received at least one of the plurality of print heads to a plurality of regions of a surface of panel 4816. As shown in FIG. 48, printing station 4806 outputs a plurality of print heads 4824 and a panel with deposited nanostructures 4828.

Figure 54:
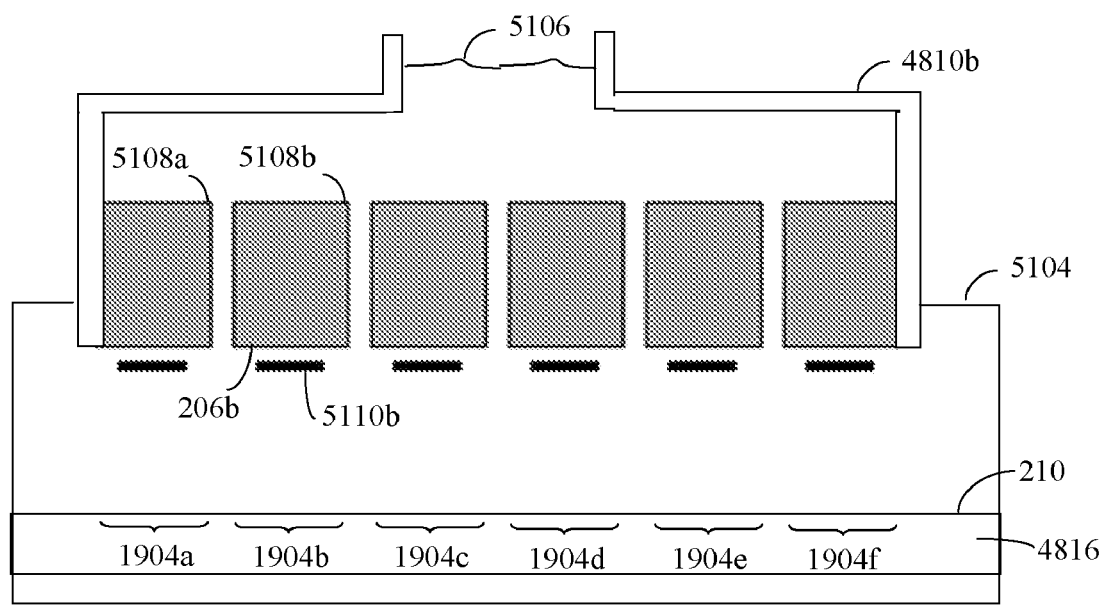
FIGS. 54-56 show views of a printing station during a nanostructure transfer process, according to an example embodiment of the present invention.
Figure 55:
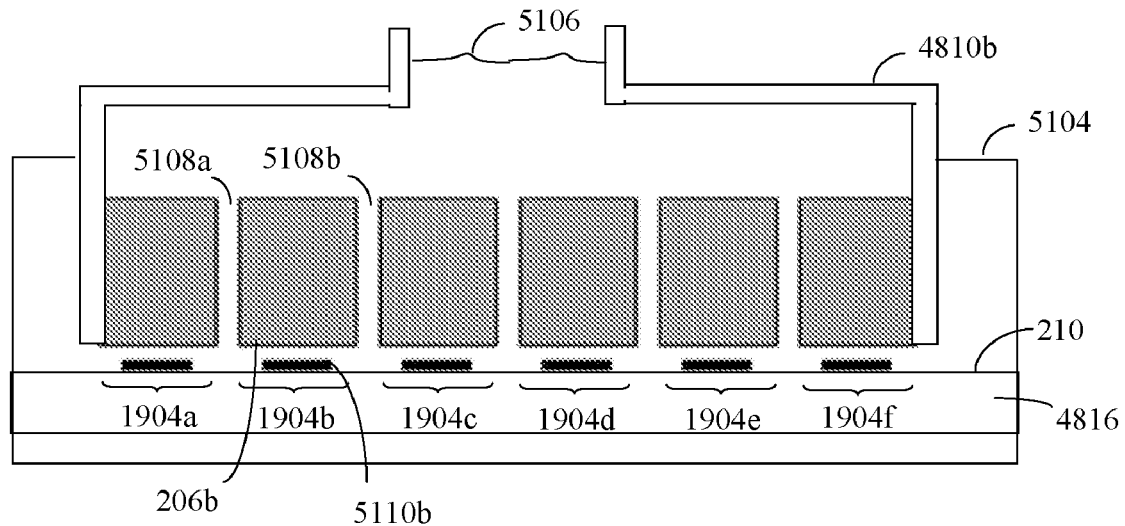
Figure 56:
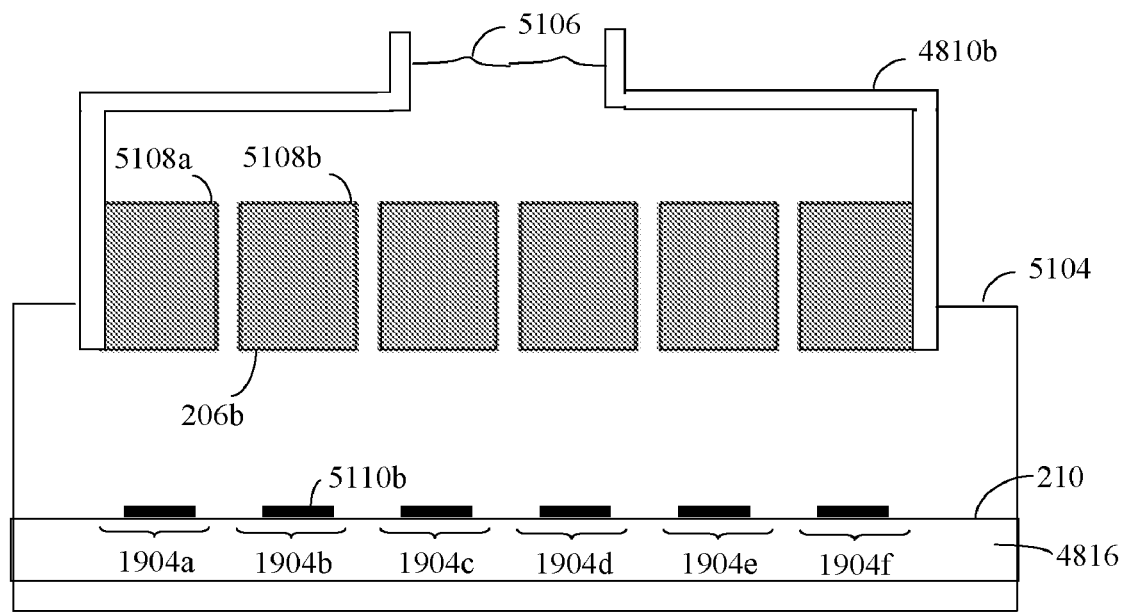

In embodiments, printing station 4806 may be configured to transfer nanostructures from print heads 4810 to panel 4816 in any manner described elsewhere herein, such as described above with respect to flowchart 300 in FIG. 3, or in other ways known to persons skilled in the relevant art(s). For instance, FIGS. 54-56 show views of printing station 4806 during a nanostructure transfer process, according to an example embodiment of the present invention. In an example embodiment, transfer surfaces 206 of print heads 4802 and destination surface 210 may be coated with molecules that interact via a lock and key mechanism. One of transfers surfaces 206 or print heads 4802 may be coated with a first molecule, and the other of transfer surfaces 206 or print heads 4802 may be coated with a second molecule. The first and second molecules interact according to a molecular binding process that occurs in biological systems. This type of molecular recognition could be used to perform more sophisticated multi step depositions of nanowires 5110. Such a molecular coating may be used on transfer surfaces and destination surfaces in conjunction with other nanostructure transfer embodiments described elsewhere herein.

FIG. 54 shows print head 4810b and panel 4816 in solution 5106. In FIG. 54, one or more nanowires 5110 are associated with each of transfer surfaces 206a-206f of print head 4810b. In FIG. 55, print head 4810b is moved adjacent to panel 4816, so that each of transfer surfaces 206a-206f is aligned with a corresponding one of regions 1902a-1902f of panel 4816. In FIG. 56, print head 4810b has deposited nanowires 5110 on panel 4816, and has withdrawn from panel 4816. For instance, as shown in FIG. 56, nanowire 5110b is deposited from transfer surface 206b to region 1904b of destination surface 210 of panel 4816.

In step 4910, the print heads are cleaned. For example, as shown in FIG. 48, cleaning station 4808 receives plurality of print heads 4824. In the current example, plurality of print heads 4824 includes print heads 4810a-4810c. Cleaning station 4808 is configured to clean the received plurality of print heads 4824. Cleaning station 4808 may be configured to clean print heads 4824 in any manner, to remove any remaining nanostructures (e.g., nanostructures that were not deposited from a print head at printing station 4806) and/or to remove any further contaminants.

Figure 57:
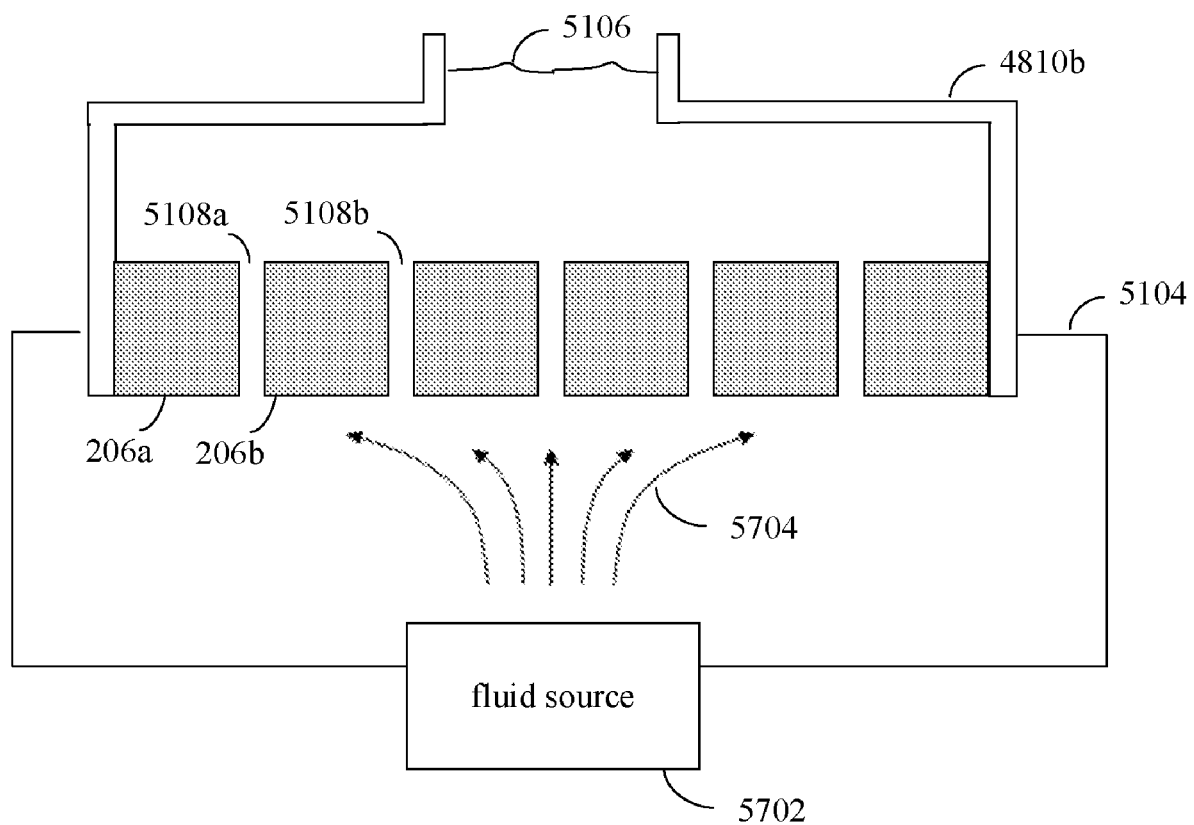
FIG. 57 shows an example cleaning station, according to an embodiment of the present invention

For instance, FIG. 57 shows an example of cleaning station 4808, according to an embodiment of the present invention. In FIG. 57, a fluid source 5702 may be present that outputs and/or directs a fluid to transfer surfaces 206a-206f, as indicated by arrows 5704, to remove/dislodge contaminants from transfer surfaces 206a-206f. Fluid source 5702 may be any mechanism for providing a fluid flow of a suitable pressure. The fluid output/directed by fluid source 5702 may be solution 5106 and/or other fluid, such a fluid configured to clean transfer surfaces 206a-206f.

As shown in FIG. 48, cleaning station 4808 outputs plurality of print heads 4818. Plurality of print heads 4818 may be received by association station 4802 for a next cycle of nanostructure printing to be performed by system 4800. In an embodiment, a single set of print heads may proceed from station to station in system 4800, such that at any particular time, all print heads are at the same station. In another embodiment, at any particular time, each station may be operating on a corresponding set of print heads, which shift to a next station at predetermined time intervals.

Flowchart 5000, which relates to a pipeline of destination panels, is now described. In step 5002 of flowchart 5000, the nanostructures are received on the destination surface. For example, as shown in FIGS. 54-56 and described above (with respect to step 4908 of flowchart 4900), nanowires 5110 are transferred to destination surface 210 of panel 4816.

Figure 58:
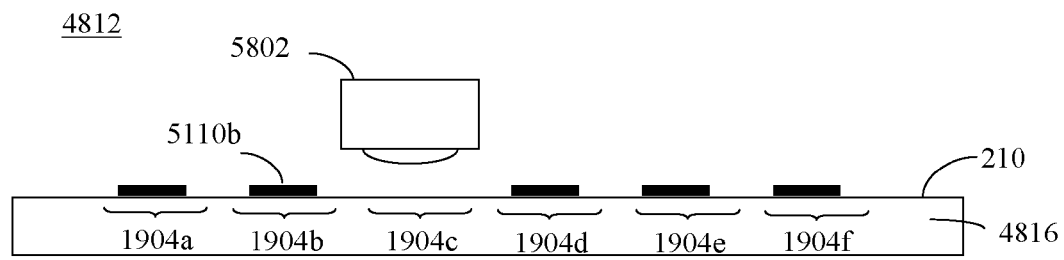
FIGS. 58 and 59 show views of a panel repair station, according to example embodiments of the present invention.
Figure 59:
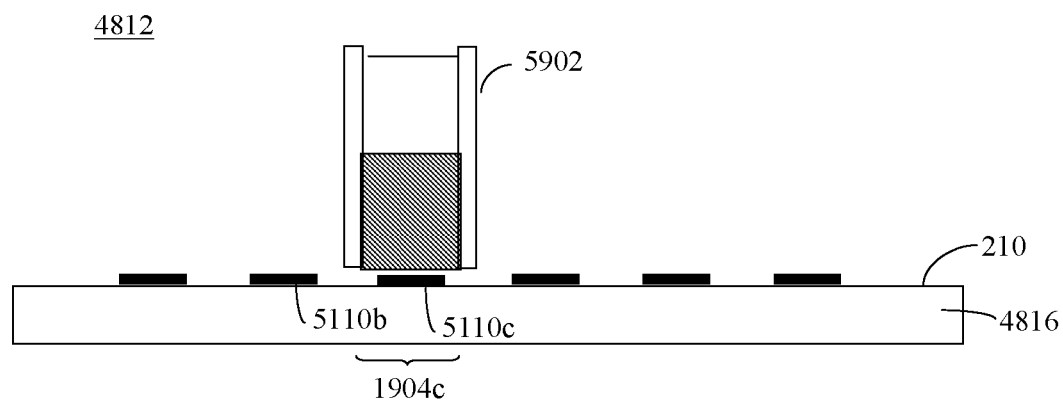

In step 5004, the placement of received nanostructures on the destination surface is repaired. Step 5004 is optional. For example, as shown in FIG. 48, panel repair station 4812 receives panel with deposited nanostructures 4828. Panel repair station 4812 is configured to perform an inspection of the nanostructures transferred to the plurality of regions of the surface of the received panel. For instance, FIGS. 58 and 59 show views of an example panel repair station 4812, according to embodiments of the present invention. In FIG. 58, an inspection device 5802 is present that is configured to inspect arrangements of nanowires 5110 at regions 1904 of panel 4816. Inspection device 5802 may be an optical inspection device (e.g., a microscope, a camera, and/or other optical inspection device), an electrical inspection device, a mechanical inspection device, and/or further type of inspection device. Inspection device 5802 may be configured to determine whether a sufficient number of nanostructures is present at each region 1904, to determine whether an unsuitable arrangement of nanostructures is present at a region 1904 (e.g., sufficient contact with electrical conductors on surface 210 is not made by the present nanostructures), and/or to otherwise determine the suitability and/or unsuitability of an arrangement of nanostructures at regions 1904 of destination surface 210.

For example, in FIG. 58, inspection device 5802 may determine that an insufficient number of nanowires 5110 (e.g., no nanowires) is present at region 1904c of panel 4816. Because inspection device 5802 determined that region 1904c does not have a sufficient number of nanowires 5110, region 1904c may be indicated for repair.

FIG. 59 shows a repair of the arrangement of nanostructures at region 1904c being performed. In the example of FIG. 59, a print head 5902 is shown repairing region 1904c, by depositing one or more nanostructures, including a nanowire 5110c, on region 1904c. Thus, in an embodiment, print head 5902 may be configured to add one or more nanostructures to a region 1904 in need of repair. Alternatively or additionally, if nanostructures are present in a region 1904 in need of repair, print head 5902 may be configured to rearrange the present nanostructures (e.g., move nanostructures into contact with desired electrical conductors of the region 1904), and/or to remove one or more present nanostructures, to create a sufficient nanostructure arrangement.

As shown in FIG. 48, panel repair station 4812 outputs a panel with deposited nanostructures 4830.

Figure 60:
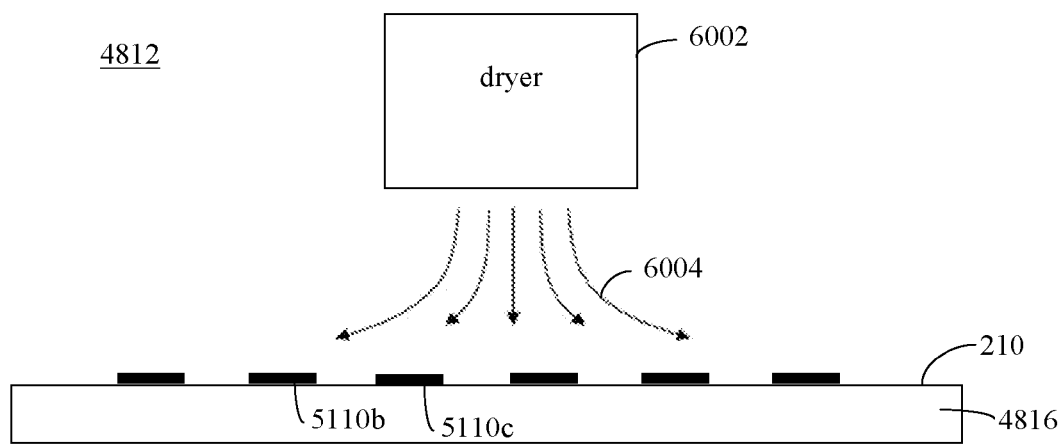
FIG. 60 shows an example panel drying station, according to an embodiment of the present invention.

In step 5006, the destination surface is dried. For example, as shown in FIG. 48, panel drying station 4814 receives panel with deposited nanostructures 4830. Panel drying station 4814 is configured to dry the deposited nanostructures on panel 4814. For instance, FIG. 60 shows an example of panel drying station 4814, according to an embodiment of the present invention. As shown in FIG. 60, a dryer 6002 is present. Dryer 6002 is configured to dry nanowires 5110 on panel 4814. Dryer 6002 may be configured to dry nanowires 5110 on panel 4814 in any suitable manner, including by radiating electromagnetic energy (e.g., infrared heat), by blowing air 6004 (as shown in FIG. 60), and/or in any other manner.

As shown in FIG. 48, panel drying station 4814 outputs panel 4816 with deposited nanostructures 4826. Panel 4816 may receive further processing, such as receiving a coating for environmental protection of the deposited nanostructures. Panel 4816 with nanostructures 4826 may be an electronic device, such as a display, and/or may be incorporated into an electronic device. Examples of such electronic devices are described further below.

Figure 61:
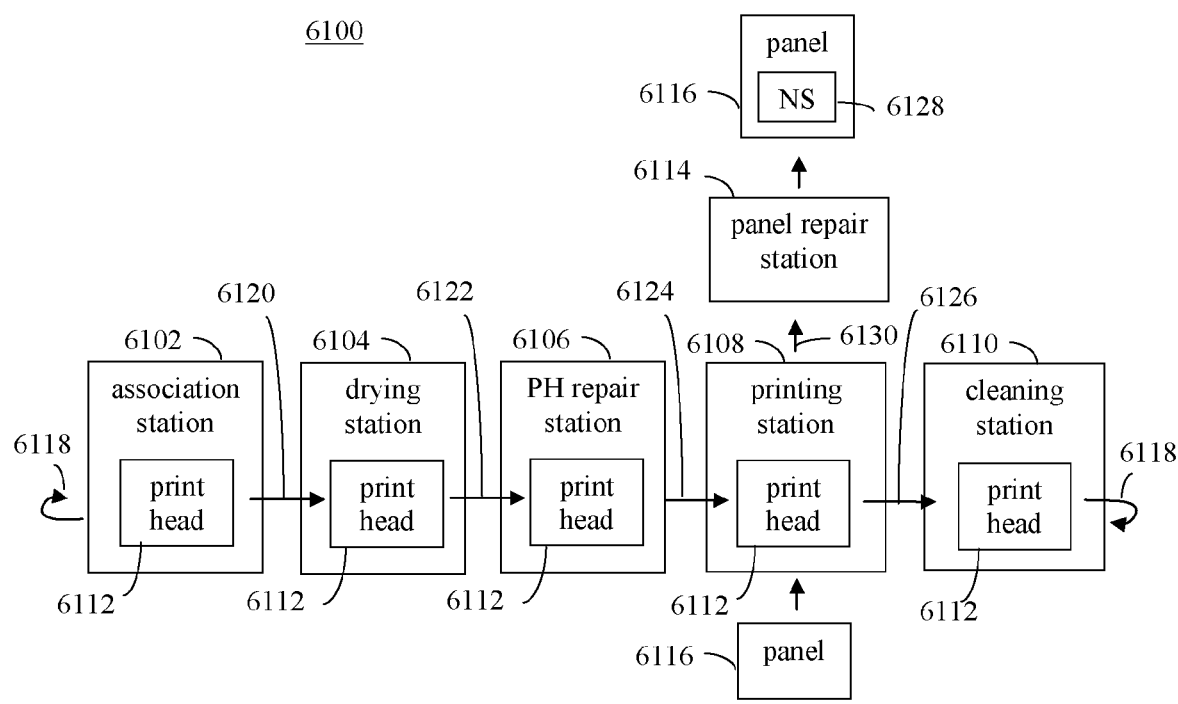
FIG. 61 shows a block diagram of a nanostructure printing system, according to an example embodiment of the present invention.

Nanostructure printing system 4800 includes printing station 4806, which in the example of FIGS. 54-56, performs a "wet" nanostructure transfer process (e.g., nanowires 5110 are transferred in FIGS. 54-56 in reservoir 5104 containing solution 5106) (also referred to as "wet stamping"). In an alternative embodiment, a nanostructure printing system may perform a "dry" nanostructure transfer process. For example, FIG. 61 shows a nanostructure printing system 6100, according to an example embodiment of the present invention. Nanostructure printing system 6100 includes an association station 6102, a drying station 6104, a print head repair station 6106, a printing station 6108, a cleaning station 6110, and a panel repair station 6114. Printing station 6108 of system 6100 is configured to perform a dry nanostructure transfer process. Association station 6102, drying station 6104, print head repair station 6106, printing station 6108, and cleaning station 6110 form a print head pipeline portion of system 6100, and printing station 6108 and panel repair station 6114 form a panel pipeline portion of system 6100.

Figure 62:
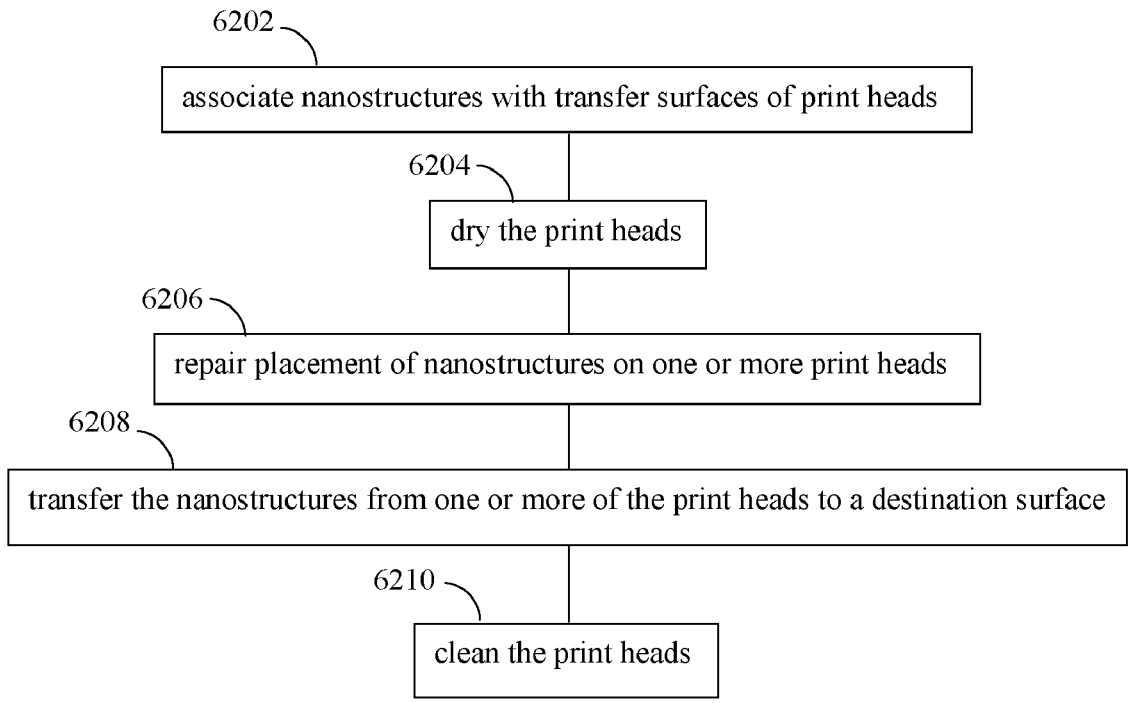
FIG. 62 shows a flowchart for a print head pipeline portion of the system of FIG. 61, according to an example embodiment of the present invention.
Figure 63:
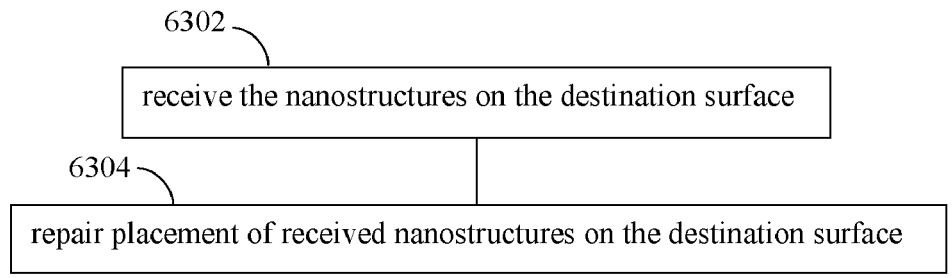
FIG. 63 shows a flowchart for a panel pipeline portion of the system of FIG. 61, according to an example embodiment of the present invention.

System 6100 is described with respect to flowcharts 6200 and 6300 shown in FIGS. 62 and 63, respectively. Flowchart 6200 shows a process for the print head pipeline portion of system 6100, and flowchart 6300 shows a process for the panel pipeline of system 6100, according to example embodiments of the present invention. For illustrative purposes, flowcharts 6200 and 6300 are described as follows with respect to system 6100. Other structural and operational embodiments will be apparent to persons skilled in the relevant art(s) based on the following discussion. Not all elements of system 6100 shown in FIG. 61 need be present in all embodiments, and not all steps of flowcharts 6200 and 6300 are necessarily performed in all embodiments.

Flowchart 6200 is first described. In step 6202 of flowchart 6200, nanostructures are associated with transfer surfaces of print heads. For example, as shown in FIG. 61, association station 6102 receives a plurality of print heads 6118, including a print head 6112. Association station 6102 is configured to associate nanostructures with a transfer surface of each print head the received plurality of print heads 6118. The association of nanostructures with print heads 6118 may be performed in any manner described elsewhere herein, such as described above with respect to flowchart 300 in FIG. 3, or in other ways known to persons skilled in the relevant art(s). For instance, association station 6102 may associate nanostructures with print heads in a similar manner as described above for association station 4802 of FIG. 48. As shown in FIG. 61, association station 6102 outputs a plurality of print heads and associated nanostructures 6120.

In step 6204, the print heads are dried. For example, as shown in FIG. 61, drying station 6104 receives plurality of print heads and associated nanostructures 6120. Drying station 6104 is configured to dry the transfer surfaces and associated nanostructures of the received plurality of print heads. For instance, drying station 6104 may include a dryer similar to dryer 6002 shown in FIG. 60, and described above, to perform drying. As shown in FIG. 61, drying station 6104 outputs a dried plurality of print heads and associated nanostructures 6122.

In step 6206, placement of nanostructures on one or more print heads is repaired. Step 6206 is optional. For example, as shown in FIG. 61, print head repair station 6106 receives dried plurality of print heads and associated nanostructures 6122. Print head repair station 6106 may be configured to inspect and repair the nanostructures associated with the print heads in a similar manner as panel repair station 4812 of FIG. 48, and described above. For instance, print head repair station 6106 may include an inspection device similar to inspection device 5802 shown in FIG. 58, to determine nanostructure arrangements on print heads in need of repair. Furthermore, print head repair station 6106 may include a print head or other repair device, such as print head 5902 shown in FIG. 59, which may be used repair the determined nanostructure arrangements in need of repair, in a wet or dry manner. As shown in FIG. 61, panel repair station 6106 outputs a plurality of print heads and associated nanostructures 6124.

In step 6208, the nanostructures are transferred from one or more of the print heads to a destination surface. For example, as shown in FIG. 61, printing station 6108 receives plurality of print heads and associated nanostructures 6124. Printing station 6108 also receives a panel 6116, which is an example of destination substrate 212 shown in FIG. 2. Printing station 6108 is configured to transfer the nanostructures from the received plurality of print heads to a plurality of regions of a surface of panel 6116. Nanostructures may be transferred from all of the received print heads, or from a selected portion of the print heads (e.g., selected in a similar manner as described above with respect to step 4906 of flowchart 4900). In embodiments, printing station 6108 may be configured to transfer nanostructures to panel 6116 according to any dry transfer process described elsewhere herein, such as described above with respect to flowchart 300 in FIG. 3, or in other ways known to persons skilled in the relevant art(s). For example, a difference in adhesion properties of the transfer surface of the print head and of the destination surface may be used to enable a transfer of nanostructures. The destination surface may be configured to have greater adhesion (to the nanostructures) than the transfer surface. In this manner, the nanostructures associated with the transfer surface may be brought into contact with the destination surface. As the transfer surface is moved away from the destination surface, the greater adhesion of the destination surface may cause the nanostructure to remain on the destination surface.

In an embodiment, printing station 6108 may be configured similarly to printing station 4806 shown in FIGS. 54-56, but without the presence of reservoir 5104 and solution 5106. As shown in FIG. 61, printing station 6108 outputs a plurality of print heads 6126 and a panel with deposited nanostructures 6130.

In step 6210, the print heads are cleaned. For example, as shown in FIG. 61, cleaning station 6110 receives plurality of print heads 6126. Cleaning station 6110 is configured to clean the received plurality of print heads 6126. Cleaning station 6110 may be configured to clean print heads 6126 in any manner, to remove any remaining nanostructures (e.g., nanostructures that were not deposited from a print head at printing station 6108) and/or to remove any further contaminants. For instance, cleaning station 6110 may be configured to clean print heads in a similar fashion as cleaning station 4808 shown in FIG. 48. In an example embodiment, cleaning station 6110 may include a fluid source, such as fluid source 5702 shown in FIG. 57, to clean the transfer surfaces of print heads 6126. As shown in FIG. 61, cleaning station 6110 outputs plurality of print heads 6118. Plurality of print heads 6118 may be received by association station 6102 for a next cycle of nanostructure printing to be performed by system 6100. In an embodiment, a single set of print heads may proceed from station to station in system 6100, such that at any particular time, all print heads are at the same station. In another embodiment, at any particular time, each station may be operating on a corresponding set of print heads, which shift forward to the next station at predetermined time intervals.

Flowchart 6300, which relates to a pipeline of destination panels for system 6100, is now described. In step 6302 of flowchart 6300, the nanostructures are received on the destination surface. For example, as described above (with respect to step 6208 of flowchart 6200), nanostructures are transferred to panel 6116 by printing station 6108.

In step 6302, placement of the received nanostructures is repaired on destination surface. Step 6302 is optional. For example, as shown in FIG. 61, panel repair station 6114 receives panel with deposited nanostructures 6130. Panel repair station 6114 is configured to perform an inspection of the nanostructures transferred to the plurality of regions of the surface of the received panel. For instance, panel repair station 6114 may be configured similarly to panel repair station 4812 described above with respect to FIG. 48, including being configured as shown in FIGS. 58 and 59.

As shown in FIG. 61, panel repair station 6114 outputs panel 6116 with deposited nanostructures 6128. Panel 6116 may receive further processing, such as receiving a coating for environmental protection of nanostructures 6128. Panel 6116 with nanostructures 6128 may be an electronic device, such as a display, and/or may be incorporated into an electronic device. Examples of such electronic devices are described further below.

Example Captured Images of a Nanostructure Transfer Process

Figure 64:
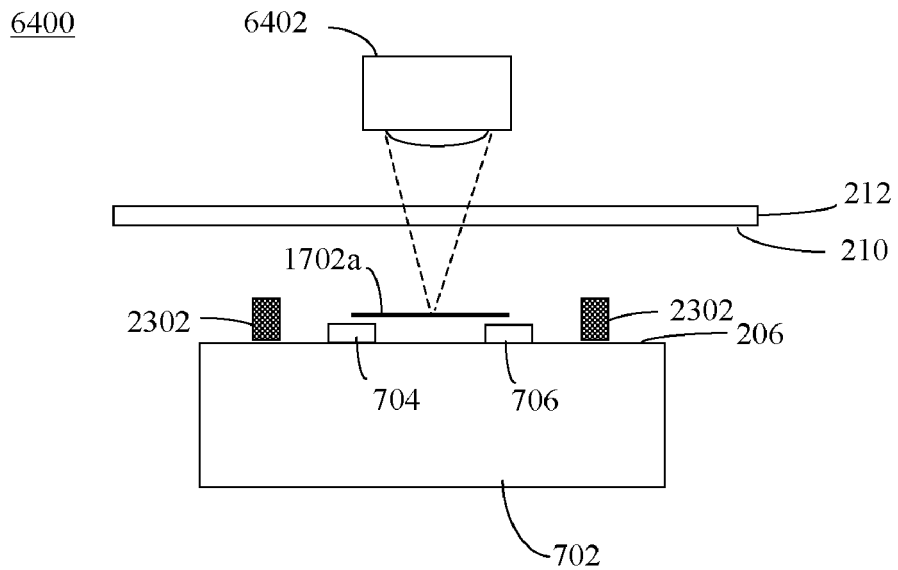
FIGS. 64, 66, 68, and 70 show views of a nanostructure transfer system during a nanostructure transfer process, according to example embodiments of the present invention.
Figure 65:
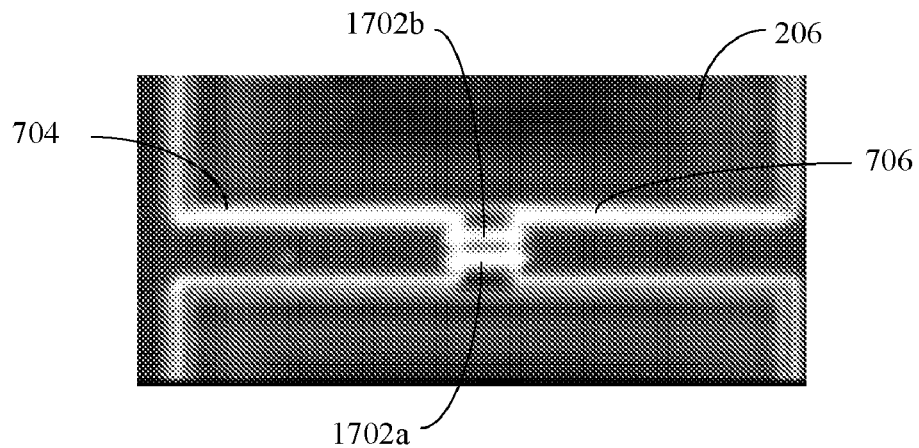
FIGS. 65, 67, 69, and 71 show respective images captured using a microscope of the nanostructure transfer system shown in FIGS. 64, 66, 68, and 70, according to example embodiments of the present invention.

This section describes images captured during a nanostructure transfer process performed according to an embodiment of the present invention. FIG. 64 shows a nanostructure transfer system 6400 used to perform the nanostructure transfer and to capture the images of the transfer. As shown in FIG. 64, system 6400 includes print head 702, destination substrate 212, and an image capturing microscope 6402. Transfer surface 206 of print head 702 includes first and second electrodes 704 and 706 and a plurality of spacing members 2302. In FIG. 64, electrodes 704 and 706 hold an associated first nanowire 1702a (and a second nanowire 1702b, not visible in FIG. 64). First and second nanowires 1702a and 1702b may have been associated with first and second electrodes 704 and 706 in any manner described elsewhere herein, such as described above with respect to steps 302 and 304 of flowchart 300 (FIG. 3). FIG. 65 shows a first image 6500 captured by microscope 6402 of system 6400. First image 6500 shows first and second nanowires 1702a and 1702b associated with first and second electrodes 704 and 706 on transfer surface 206 of print head 702. Note that in the current example, destination substrate 212 is transparent to microscope 6402, and thus microscope 6402 may capture images of nanowires 1702a and 1702b through substrate 212.

Figure 66:
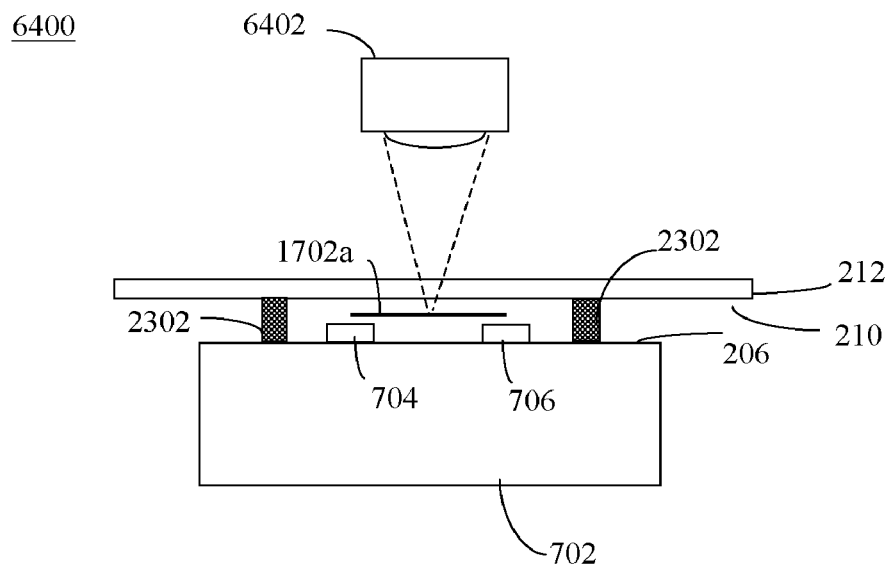
Figure 67:
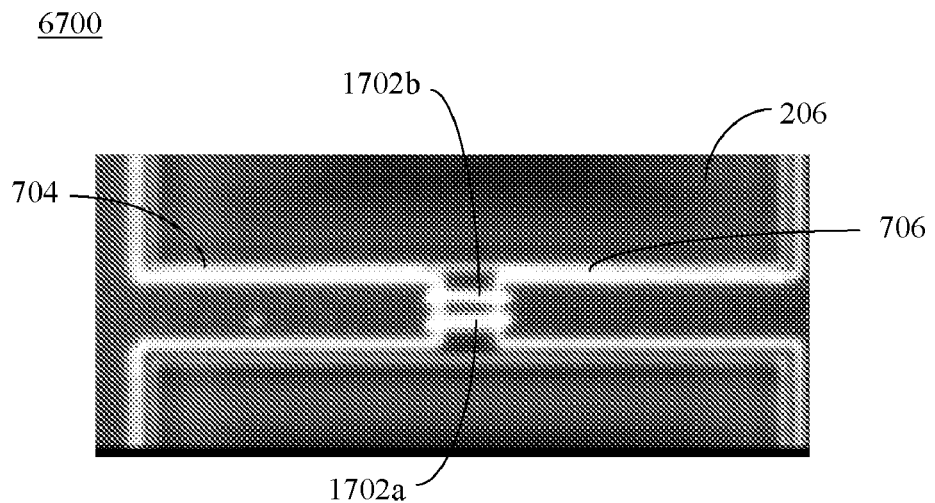

FIG. 66 shows another view of nanostructure transfer system 6400, where print head 702 is moved into contact with destination substrate 212 (e.g., according to step 306 of flowchart 300 of FIG. 3). Spacing members 2302 on transfer surface 206 of print head 702 are in contact with destination surface 210 of substrate 212, to maintain print head 702 at a predetermined distance (a height of spacing members 2302) from substrate 212. FIG. 67 shows a second image 6700 captured by microscope 6402 of first and second nanowires 1702a and 1702b associated with first and second electrodes 704 and 706, with print head 702 in contact with destination surface 210 (as in FIG. 66).

Figure 68:
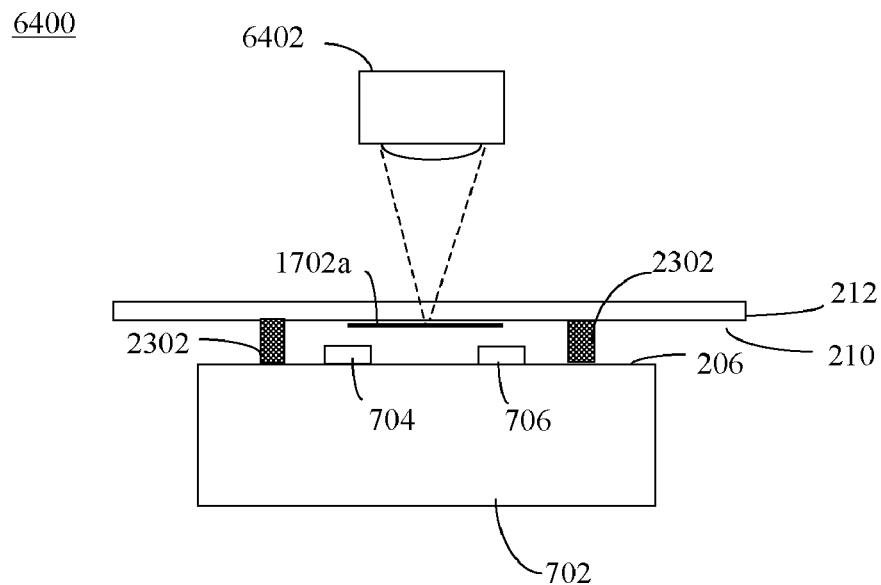
Figure 69:
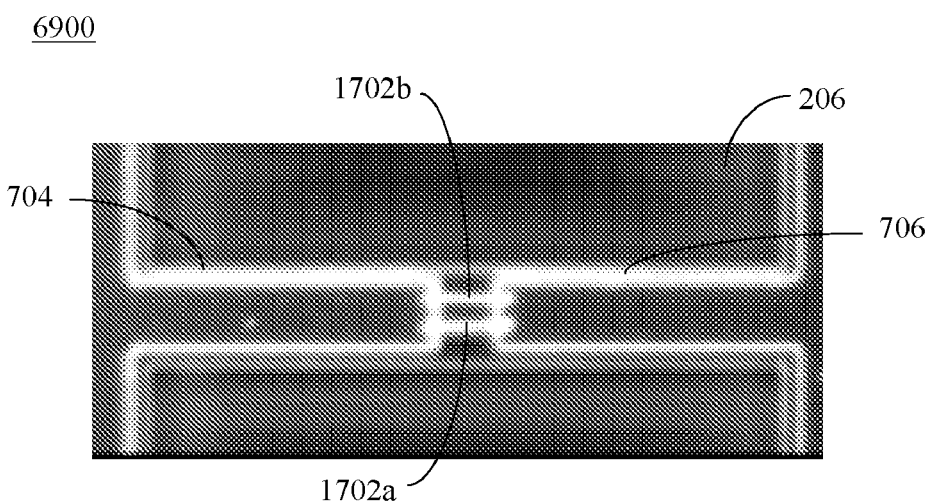

FIG. 68 shows another view of nanostructure transfer system 6400. In FIG. 68, print head 702 remains in contact with destination substrate 212 (as in FIG. 66). Furthermore, in FIG. 68, nanowire 1702a (and nanowire 1702b, not visible in FIG. 68) is transferred to destination surface 210 of substrate 212. Nanowires 1702a and 1702b may be transferred to destination surface 210 in any manner described elsewhere herein, such as according to step 308 of flowchart 300 (FIG. 3) described above. For example, an electric field generated by first and second electrodes 704 and 706 (e.g., step 304 of flowchart 300) may be removed to release first and second nanowires 1702a and 1702b. Furthermore, destination surface 210 may have been configured to have a charge that is opposite to a charge of first and second nanowires 1702a and 1702b, to attract nanowires 1702a and 1702b. FIG. 69 shows a third image 6900 captured by microscope 6402 of first and second nanowires 1702a and 1702b, where first and second nanowires 1702a and 1702b are transferred to destination surface 210 (as in FIG. 68).

Figure 70:
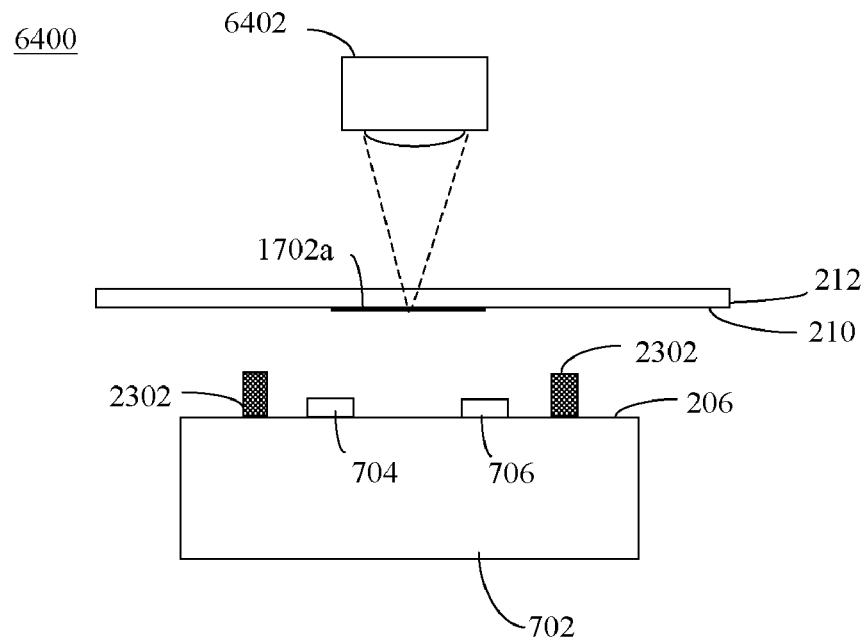
Figure 71:
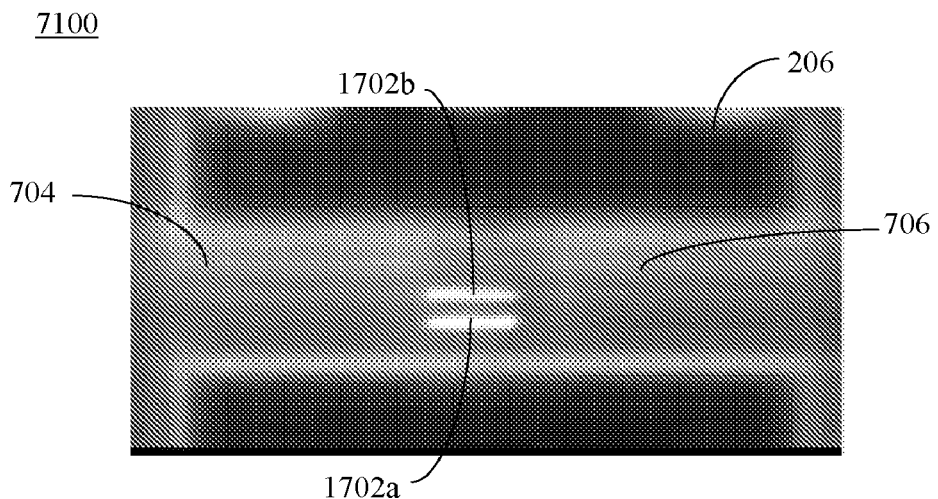

FIG. 70 shows another view of nanostructure transfer system 6400. In FIG. 70, print head 702 is moved away from destination substrate 212 (e.g., according to step 310 of flowchart 300 in FIG. 3). Nanowire 1702a (and nanowire 1702b, not visible in FIG. 68) remains deposited on destination surface 210 of substrate 212. FIG. 71 shows a fourth image 7100 captured by microscope 6402 of first and second nanowires 1702a and 1702b, where first and second nanowires 1702a and 1702b are on destination surface 210, and print head 702 has been moved away from destination surface 210 (as in FIG. 70). Note that in each of FIGS. 65, 67, 69, 71, microscope 6402 is focused on nanowires 1702a and 1702b. Thus, in FIG. 71, first and second nanowires 1702a and 1702b remain in focus, while focus is diminished with respect to transfer surface 206 of print head 702 due to the increased separation between nanowires 1702a and 1702b and transfer surface 206.

Example electronic devices and systems that can be formed according to embodiments of the present invention are described below.

Use of Nanowires and Electrical Devices Deposited According to the Present Invention in Exemplary Devices and Applications Numerous electronic devices and systems can incorporate semiconductor or other type devices with thin films of nanowires and/or electrical devices deposited according the methods of the present invention. Some example applications for the present invention are described below or elsewhere herein for illustrative purposes, and are not limiting. The applications described herein can include aligned or non-aligned thin films of nanowires, and can include composite or non-composite thin films of nanowires.

Semiconductor devices (or other type devices) can be coupled to signals of other electronic circuits, and/or can be integrated with other electronic circuits. Semiconductor devices can be formed on large substrates, which can be subsequently separated or diced into smaller substrates. Furthermore, on large substrates (i.e., substrates substantially larger than conventional semiconductor wafers), semiconductor devices formed thereon can be interconnected.

The nanowires deposited by the processes and methods of the present invention can also be incorporated in applications requiring a single semiconductor device, and in multiple semiconductor devices. For example, the nanowires deposited by the processes and methods of the present invention are particularly applicable to large area, macro electronic substrates on which a plurality of semiconductor devices are formed. Such electronic devices can include display driving circuits for active matrix liquid crystal displays (LCDs), organic LED displays, field emission displays. Other active displays can be formed from a nanowire-polymer, quantum dots-polymer composite (the composite can function both as the emitter and active driving matrix). The nanowires deposited by the processes and methods of the present invention are also applicable to smart libraries, credit cards, large area array sensors, and radio-frequency identification (RFID) tags, including smart cards, smart inventory tags, and the like.

The nanowires deposited by the processes and methods of the present invention are also applicable to digital and analog circuit applications. In particular, the nanowires deposited by the processes and methods of the present invention are useful in applications that require ultra large-scale integration on a large area substrate. For example, a thin film of nanowires deposited by the processes and methods of the present invention can be implemented in logic circuits, memory circuits, processors, amplifiers, and other digital and analog circuits.

The nanowires deposited by the processes and methods of the present invention can be applied to photovoltaic applications. In such applications, a clear conducting substrate is used to enhance the photovoltaic properties of the particular photovoltaic device. For example, such a clear conducting substrate can be used as a flexible, large-area replacement for indium tin oxide (ITO) or the like. A substrate can be coated with a thin film of nanowires that is formed to have a large bandgap, i.e., greater than visible light so that it would be non-absorbing, but would be formed to have either the HOMO or LUMO bands aligned with the active material of a photovoltaic device that would be formed on top of it. Clear conductors can be located on two sides of the absorbing photovoltaic material to carry away current from the photovoltaic device. Two different nanowire materials can be chosen, one having the HOMO aligned with that of the photovoltaic material HOMO band, and the other having the LUMO aligned with the LUMO band of the photovoltaic material. The bandgaps of the two nanowires materials can be chosen to be much larger than that of the photovoltaic material. The nanowires, according to this embodiment, can be lightly doped to decrease the resistance of the thin films of nanowires, while permitting the substrate to remain mostly non-absorbing.

Hence, a wide range of military and consumer goods can incorporate the nanowires and electrical devices deposited by the processes and methods of the present invention. For example, such goods can include personal computers, workstations, servers, networking devices, handheld electronic devices such as PDAs and palm pilots, telephones (e.g., cellular and standard), radios, televisions, electronic games and game systems, home security systems, automobiles, aircraft, boats, other household and commercial appliances, and the like.

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

All publications, patents and patent applications mentioned in this specification are herein incorporated by reference to the same extent as if each individual publication, patent or patent application was specifically and individually indicated to be incorporated by reference.

What is claimed is:

1. A method for applying nanowires to a destination surface, comprising:
    aligning an electrode pair having an associated at least one nanowire with a region of the destination surface; and
    depositing the at least one nanowire from the electrode pair to the region.

2. A method for transferring nanowires to a destination surface, comprising:
    providing at least one nanowire proximate to an electrode pair;
    generating an electric field with electrodes of the electrode pair to associate the at least one nanowire with the electrodes;
    aligning the electrode pair with a region of the destination surface; and
    depositing the at least one nanowire from the electrode pair to the region.

3. The method of claim 2, wherein the electrode pair is mounted to a transfer surface, further comprising:
    configuring the transfer surface to have a first electric charge.

4. The method of claim 3, wherein the first electric charge applies a repulsive electrostatic force to the at least one nanowire, wherein said generating comprises:
    configuring the electric field to attract the at least one nanowire to the transfer surface against the repulsive electrostatic force.

5. The method of claim 4, wherein said configuring comprises:
    biasing the electric field with an alternating current (AC) field to attract the at least one nanowire to the transfer surface.

6. The method of claim 5, wherein said depositing comprises:
    biasing the electric field with a second AC field to enable the at least one nanowire to move toward the destination surface.

7. The method of claim 3, further comprising:
    configuring the destination surface to have a second electric charge that is opposite the first electric charge.

8. The method of claim 7, wherein said aligning comprises:
    enabling the at least one nanowire to be attracted to the destination surface by an attractive electrostatic force of the second electric charge by reducing a distance between the at least one nanowire and the destination surface.

9. The method of claim 8, wherein said depositing comprises:
    attracting the at least one nanowire toward the destination surface with the second electric charge.

10. The method of claim 7, wherein said depositing comprises:
    ultrasonically vibrating the transfer surface to enable an attractive electrostatic force of the second electric charge to attract the at least one nanowire toward the destination surface.

11. The method of claim 2, wherein said depositing comprises:
    applying a vacuum from the destination surface to the transfer surface to move the at least one nanowire toward the destination surface.

12. The method of claim 2, wherein said depositing comprises:
    generating a second electric field associated with the destination surface to attract the at least one nanowire toward the destination surface.

13. The method of claim 2, wherein said depositing comprises:
ceasing generation of the electric field.

14. The method of claim 2, further comprising:
configuring the destination surface to have a hydrophilic property to attract a solution containing the at least one nanowire toward the destination surface.

15. The method of claim 2, further comprising:
configuring the transfer surface to have a hydrophobic property to repel a solution containing the at least one nanowire.

16. The method of claim 2, wherein said providing comprises:
flowing a solution containing the at least one nanowire on the electrode pair.

17. The method of claim 16, further comprising:
varying a rate of flow of the solution on the electrode pair.

18. The method of claim 2, wherein the electrode pair includes a first electrode and a second electrode, and the at least one nanowire includes a first nanowire, wherein said generating comprises:
causing a first end of the first nanowire to be positioned adjacent to a surface of the first electrode, and a second end of the first nanowire to be positioned adjacent to a surface of the second electrode.

19. The method of claim 18, wherein said generating comprises:
causing the at least one nanowire to align substantially in parallel with an axis through the first and second electrodes.

20. The method of claim 18, wherein said generating comprises:
positioning the at least one nanowire such that the first and second ends are not in contact with the first and second electrodes.

21. The method of claim 2, wherein the region includes an electrical contact pair, wherein said aligning comprises:
contacting the electrode pair with the electrical contact pair.

22. The method of claim 2, wherein said aligning comprises:
contacting the electrode pair with the destination surface.

23. The method of claim 22, wherein said contacting comprises:
causing a cantilever that mounts a first electrode of the electrode pair to flex due to said contacting.

24. The method of claim 22, wherein said contacting comprises:
causing a pair of cantilevers that mount the electrode pair to flex due to said contacting.

25. The method of claim 2, wherein said aligning comprises:
positioning the electrode pair adjacent to the surface.

26. The method of claim 2, further comprising:
removing the electrode pair from alignment with the region of the destination surface.

27. The method of claim 26, further comprising:
providing a second at least one nanowire proximate to the electrode pair;
generating a second electric field with the electrodes of the electrode pair to associate the second at least one nanowire with the electrodes;
aligning the electrode pair with a second region of the surface;
depositing the at least one nanowire from the electrode pair to the second region.

28. The method of claim 2, wherein the first electrode pair and a second electrode pair are on a common transfer surface, further comprising:
in parallel with said providing the first at least one nanowire proximate to the first electrode pair, providing a second at least one nanowire proximate to the second electrode pair;
in parallel with said generating the first electric field, generating a second electric field with second electrodes of the second electrode pair to associate the second at least one nanowire with the second electrodes;
in parallel with said aligning the first electrode pair with the first region of the surface, aligning the second electrode pair with a second region of the surface; and
in parallel with said depositing the first at least one nanowire from the first electrode pair to the first region, depositing the second at least one nanowire from the second electrode pair to the second region.

29. The method of claim 2, further comprising:
removing uncoupled nanowires from the electrode pair.

* * * * *

UNITED STATES PATENT AND TRADEMARK OFFICE
CERTIFICATE OF CORRECTION

PATENT NO. : 7,892,610 B2
APPLICATION NO. : 12/114446
DATED : February 22, 2011
INVENTOR(S) : J. Wallace Parce et al.

It is certified that error appears in the above-identified patent and that said Letters Patent is hereby corrected as shown below:

Title page, Item (75), in "Inventors", in column 1, line 4, Delete "Camptell, CA" and insert -- Campbell, CA --, therefor.

Title page, Item (73), in "Assignee", in column 1, line 1, delete "Nanosys, Inc., Palo Alto, CA (US)" and insert -- SHARP CORPORATION, Osaka (JP);
       Nanosys, Inc., Palo Alto, CA (US) --, therefor.

Title page, Item (56), under "OTHER PUBLICATIONS", in column 2, line 2, Delete "Angewanted Cheme" and insert -- Angewandte Chemie --, therefor.

Signed and Sealed this
Twenty-eighth Day of February, 2012

David J. Kappos
*Director of the United States Patent and Trademark Office*